United States Patent
Kubo et al.

(10) Patent No.: US 8,401,728 B2
(45) Date of Patent: *Mar. 19, 2013

(54) BATTERY SYSTEM FOR VEHICLE, ON-VEHICLE BATTERY MODULE, AND CELL CONTROLLER

(75) Inventors: Kenji Kubo, Hitachi (JP); Akihiko Kudo, Hitachinaka (JP); Mutsumi Kikuchi, Mito (JP); Akihiko Emori, Hitachi (JP)

(73) Assignees: Hitachi, Ltd., Tokyo (JP); Hitachi Vehicle Energy, Ltd., Hitachinaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/353,906

(22) Filed: Jan. 19, 2012

(65) Prior Publication Data

US 2012/0133370 A1    May 31, 2012

Related U.S. Application Data

(63) Continuation of application No. 12/361,329, filed on Jan. 28, 2009, now Pat. No. 8,103,401.

(30) Foreign Application Priority Data

Jan. 29, 2008  (JP) ................................. 2008-017983

(51) Int. Cl.
*G01N 27/416* (2006.01)
*H02J 7/00* (2006.01)
(52) U.S. Cl. ....................... 701/29.1; 701/34.4; 324/522
(58) Field of Classification Search .................. None
See application file for complete search history.

(56) References Cited

U.S. PATENT DOCUMENTS

| 5,818,201 | A | 10/1998 | Stockstad et al. | |
|---|---|---|---|---|
| 8,159,184 | B2 * | 4/2012 | Emori et al. | 320/116 |
| 8,212,571 | B2 * | 7/2012 | Emori et al. | 324/522 |
| 2005/0242667 | A1 | 11/2005 | Emori et al. | |
| 2005/0242776 | A1 | 11/2005 | Emori et al. | |
| 2008/0143298 | A1 | 6/2008 | Yoshida | |
| 2009/0087722 | A1 | 4/2009 | Sakabe et al. | |
| 2009/0091332 | A1 | 4/2009 | Emori et al. | |
| 2009/0179650 | A1 | 7/2009 | Omagari | |

FOREIGN PATENT DOCUMENTS

| JP | H11-237427 | A | 8/1999 |
|---|---|---|---|
| JP | 2005-318750 | A | 11/2005 |
| JP | 2005-318751 | A | 11/2005 |
| JP | 2006-294339 | A | 10/2006 |
| JP | 2006-295516 | A | 10/2006 |

OTHER PUBLICATIONS

Japanese Office Action dated Jan. 22, 2013 (3) pages (w/English translation—4 pages).

* cited by examiner

*Primary Examiner* — Michael J. Zanelli
(74) *Attorney, Agent, or Firm* — Crowell & Moring LLP

(57) ABSTRACT

A battery system for vehicle comprises a battery unit that is constituted with a plurality of serially connected cell groups each include a plurality of serially connected battery cells, integrated circuits that are each disposed in correspondence to one of the cell groups of the battery unit and each measure terminal voltages at the battery cells in the corresponding cell group, and a signal transmission path through which one of the integrated circuits is connected to another one of the integrated circuits or to a circuit other than that of the integrated circuits.

14 Claims, 40 Drawing Sheets

| 260 | STGCV1 | | | STGCV2 | | | STGCV3 | | | STGCV4 | | |
|---|---|---|---|---|---|---|---|---|---|---|---|---|
| DIAGNOSIS/MEASUREMENT MODE | CELL1 RES | | CELL1 MEASUREMENT | CELL2 RES | | CELL2 MEASUREMENT | CELL3 RES | | CELL3 MEASUREMENT | CELL4 RES | | CELL4 MEASUREMENT |
| OPERATION DETAILS | HIGHER LIMIT COMPARISON | LOWER LIMIT COMPARISON | (CELL1 TERMINAL VOLTAGE MEASUREMENT) | HIGHER LIMIT COMPARISON | LOWER LIMIT COMPARISON | (CELL2 TERMINAL VOLTAGE MEASUREMENT) | HIGHER LIMIT COMPARISON | LOWER LIMIT COMPARISON | (CELL3 TERMINAL VOLTAGE MEASUREMENT) | HIGHER LIMIT COMPARISON | LOWER LIMIT COMPARISON | (CELL4 TERMINAL VOLTAGE MEASUREMENT) |
| MULTIPLEXER 118 IS CONNECTED TO — SA1 | MA1 | MA1 | MA2 | MA2 | MA2 | MA2 | OPEN | OPEN | OPEN | OPEN | OPEN | OPEN |
| MULTIPLEXER 118 IS CONNECTED TO — SA2 | OPEN | OPEN | OPEN | MA3 | MA3 | MA4 | MA5 | MA5 | MA4 | OPEN | OPEN | OPEN |
| MULTIPLEXER 118 IS CONNECTED TO — SA3 | OPEN | OPEN | OPEN | OPEN | OPEN | OPEN | MA6 | MA6 | MA6 | MA7 | MA7 | MA6 |
| MULTIPLEXER 118 IS CONNECTED TO — SA4 | OPEN | OPEN | OPEN | OPEN | OPEN | OPEN | OPEN | OPEN | OPEN | OPEN | OPEN | OPEN |
| MULTIPLEXER 120 IS CONNECTED TO — SB1 | MB1 | MB1 | MB1 | MB2 | MB2 | MB2 | MB4 | MB4 | MB4 | MB5 | MB5 | MB5 |
| MULTIPLEXER 120 IS CONNECTED TO — SB2 | MB2 | MB2 | MB2 | MB3 | MB3 | MB3 | MB5 | MB5 | MB5 | MB6 | MB6 | MB6 |
| SWITCH SC1 | CONNECT | CONNECT | OPEN | CONNECT | CONNECT | OPEN | CONNECT | CONNECT | OPEN | CONNECT | CONNECT | OPEN |
| SWITCH SD1 | VH | VL | OPEN | VH | VL | OPEN | VH | VL | OPEN | VH | VL | OPEN |
| JUDGMENT CIRCUIT 164 | HIGHER LIMIT COMPARISON | LOWER LIMIT COMPARISON | NON-OPERATING | HIGHER LIMIT COMPARISON | LOWER LIMIT COMPARISON | NON-OPERATING | HIGHER LIMIT COMPARISON | LOWER LIMIT COMPARISON | NON-OPERATING | HIGHER LIMIT COMPARISON | LOWER LIMIT COMPARISON | NON-OPERATING |
| ABNORMALITY/NORMALITY FLAG SET 166, 168 | SET | SET | NON-OPERATING | SET | SET | NON-OPERATING | SET | SET | NON-OPERATING | SET | SET | NON-OPERATING |

PASSAGE OF TIME →

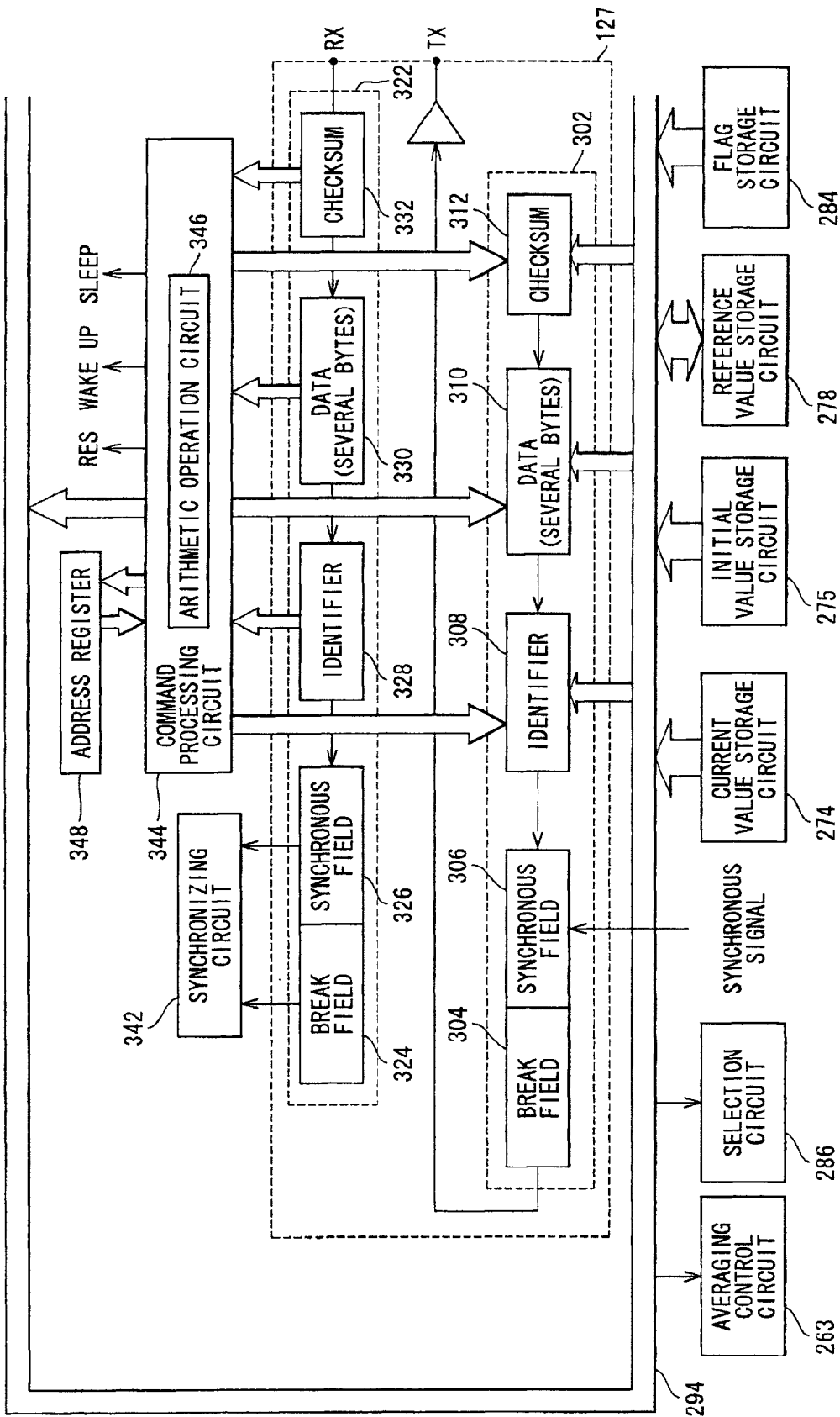

FIG. 30

BATTERY SYSTEM FOR VEHICLE, ON-VEHICLE BATTERY MODULE, AND CELL CONTROLLER

CROSS-REFERENCE TO RELATED APPLICATIONS

This application is a continuation of application Ser. No. 12/361,329, filed Jan. 28, 2009, which claims priority under 35 U.S.C. §119 to Japanese Patent Application No. JP 2008-017983, filed Jan. 29, 2008.

INCORPORATION BY REFERENCE

The disclosure of the following priority application is herein incorporated by reference:

Japanese Patent Application No. 2008-17938 filed Jan. 29, 2008

BACKGROUND OF THE INVENTION

1. Field of the Invention

The present invention relates to the art used for a battery system, particularly a battery system for vehicle, an on-vehicle battery module, a cell controller, etc.

2. Description of Related Art

There is a battery system, particularly a battery system for vehicle drive, using a lithium ion battery known in the related art that diagnoses over-charge and over-discharge of the battery cells (Patent Literature 1: Japanese Laid Open Patent Publication No. 2005-318751). The battery system includes a function for diagnosing the operating condition of the cell voltage balancing circuit provided for narrowing differences in state of charge among the battery cells. Furthermore, the art for sensing a disconnection of the wire harness between the battery cell and the circuit which is to detect terminal voltages is also known (Patent Literature 2: Japanese Laid Open Patent Publication No. 2006-294339).

The battery system for vehicle drive is required to monitor the state of the battery cell via adjustment of state of charge by the cell voltage balancing circuit or via over-charge and over-discharge diagnosis. Furthermore, overall reliability of the battery system should be improved not only through monitoring the state of the battery cell but also through improving reliability of the measurement system. An object of the present invention is to provide a battery system for vehicle assuring a high level of safety.

SUMMARY OF THE INVENTION

A battery system for vehicle achieved in a first embodiment of the present invention comprises a battery unit that is constituted with a plurality of serially connected cell groups each include a plurality of serially connected battery cells, integrated circuits that are each disposed in correspondence to one of the cell groups of the battery unit and each measure terminal voltages at the battery cells in the corresponding cell group, and a signal transmission path through which one of the integrated circuits is connected to another one of the integrated circuits or to a circuit other than that of the integrated circuits. In this battery system for vehicle, the integrated circuits each comprise a selection circuit that selects a terminal voltage at a battery cell that is a measurement target from among the terminal voltages at the individual battery cells in the corresponding cell group, an analog/digital converter that converts the terminal voltage selected by the selection circuit to a digital value, an abnormality diagnosis circuit that diagnoses an abnormality in a selection operation by the selection circuit, a timing control circuit that outputs a measurement phase instruction signal for instructing a measurement phase during which the terminal voltage is measured, and, in synchronization with the output of the measurement phase instruction signal, outputs a diagnosis phase instruction signal for instructing a diagnosis phase during which the diagnosis is executed by the abnormality diagnosis circuit, a communication circuit that transmits via the signal transmission path the terminal voltage converted to the digital value by the analog/digital converter and a diagnosis result by the abnormality diagnosis circuit, and a constant voltage generation circuit that generates a diagnosis voltage to be input to the selection circuit. Based upon the measurement phase instruction signal, the analog/digital converter executes analog-to-digital conversion upon the terminal voltage selected by the selection circuit. Based upon the diagnosis phase instruction signal, the abnormality diagnosis circuit compares, in synchronization with the measurement of the terminal voltage, an output from the selection circuit to which the diagnosis voltage has been input with a predetermined judgment value so as to diagnose the abnormality in the selection circuit.

According to a second embodiment of the present invention, in the battery system for vehicle achieved in the first embodiment, it is preferred that a constant voltage generation circuit generates varying diagnosis voltages to the individual battery cells in the corresponding cell group and that the abnormality diagnosis circuit executes the comparison using the predetermined judgment value according to the diagnosis voltage that has been input to the selection circuit.

According to a third embodiment of the present invention, in the battery system for vehicle achieved in the first embodiment, each of the integrated circuits may include a second selection circuit that is disposed at a stage frontward of the selection circuit and selectively provides the selection circuit with a terminal voltage at a battery cell to be measured or the diagnosis voltage generated by the constant voltage generation circuit.

According to a fourth embodiment of the present invention, in the battery system for vehicle achieved in the first embodiment, it is preferred that the timing control circuit synchronously outputs the measurement phase instruction signal and the diagnosis phase instruction signal for each of the battery cells in the corresponding cell group.

According to a fifth embodiment of the present invention, in the battery system for vehicle achieved in the first embodiment, the integrated circuits each may include a stage circuit that manages each measurement phase of the terminal voltages of the plurality of battery cells to be measured by the integrated circuits, a first selection signal generation circuit that generates a first selection signal to be used to control a selection operation by the selection circuit based upon an output from the stage circuit, a second selection signal generation circuit that generates a second selection signal based upon an output from the stage circuit, and a selection signal abnormality diagnosis circuit that determines whether or not the outputs from the first and the second selection signal generation circuits sustain a predetermined relationship so as to diagnose an abnormality in the selection signal generation circuits.

According to a sixth embodiment of the present invention, the battery system for vehicle achieved in the first embodiment may comprise a diagnosis result holding circuit that holds a diagnosis result by the abnormality diagnosis circuit. In this battery system for vehicle, it is preferred that the signal transmission path includes a first signal transmission path and a second signal transmission path independently. It is also preferred that the communication circuit transmits via the first signal transmission path the terminal voltage converted to the digital value by the analog/digital converter and constantly transmits via the second signal transmission path a signal according to the diagnosis result held in the diagnosis result holding circuit.

A battery system for vehicle achieved in a seventh embodiment of the present invention comprises a battery unit that is constituted with a plurality of serially connected cell groups each include a plurality of serially connected battery cells, integrated circuits that are each disposed in correspondence to one of the cell groups of the battery unit and each measure terminal voltages at the battery cells in the corresponding cell group, and a signal transmission path through which one of the integrated circuits is connected to another one of the integrated circuits or to a circuit other than that of the integrated circuits. In this battery system for vehicle, the integrated circuits each comprise a selection circuit that selects a terminal voltage at a battery cell that is a measurement target from among the terminal voltages at the individual battery cells in the corresponding cell group, an analog/digital converter that converts the terminal voltage selected by the selection circuit to a digital value, a pull-up circuit that pulls up a potential at an output terminal of the selection circuit to a maximum potential at the integrated circuit, a pull-down circuit that pulls down a potential at an output terminal of the selection circuit to a minimum potential at the integrated circuit, an abnormality diagnosis circuit that diagnoses an abnormality in a selection operation by the selection circuit based upon a pull-up state by the pull-up circuit or a pull-down state by the pull-down circuit, a timing control circuit that outputs a measurement phase instruction signal for instructing a measurement phase during which the terminal voltage is measured, and, in synchronization with the output of the measurement phase instruction signal, outputs a diagnosis phase instruction signal for instructing a diagnosis phase during which the diagnosis is executed by the abnormality diagnosis circuit, and a communication circuit that transmits via the signal transmission path the terminal voltage converted to the digital value by the analog/digital converter and a diagnosis result by the abnormality diagnosis circuit. Based upon the measurement phase instruction signal, the selection circuit selects the terminal voltage. Based upon the measurement phase instruction signal, the analog/digital converter executes analog-to-digital conversion upon the terminal voltage selected by the selection circuit. Based upon the diagnosis phase instruction signal, the abnormality diagnosis circuit diagnoses the abnormality in the selection circuit in synchronization with the measurement of the terminal voltage.

According to an eighth embodiment of the present invention, in the battery system for vehicle achieved in the seventh embodiment, it is preferred that the timing control circuit synchronously outputs the measurement phase instruction signal and the diagnosis phase instruction signal for each of the battery cells in the corresponding cell group.

According to a ninth embodiment of the present invention, in the battery system for vehicle achieved in the seventh embodiment, the integrated circuits each may include a stage circuit that manages each measurement phase of the terminal voltages of the plurality of battery cells to be measured by the integrated circuits, a first selection signal generation circuit that generates a first selection signal to be used to control a selection operation by the selection circuit based upon an output from the stage circuit, a second selection signal generation circuit that generates a second selection signal based upon an output from the stage circuit, and a selection signal abnormality diagnosis circuit that determines whether or not the outputs from the first and the second selection signal generation circuits sustain a predetermined relationship so as to diagnose an abnormality in the selection signal generation circuits.

According to a tenth embodiment of the present invention, the battery system for vehicle achieved in the seventh embodiment may comprise a diagnosis result holding circuit that holds a diagnosis result by the abnormality diagnosis circuit. In this battery system for vehicle, it is preferred that the signal transmission path includes a first signal transmission path and a second signal transmission path independently. It is also preferred that the communication circuit transmits via the first signal transmission path the terminal voltage converted to the digital value by the analog/digital converter and constantly transmits via the second signal transmission path a signal according to the diagnosis result held in the diagnosis result holding circuit.

An on-vehicle battery module achieved in an eleventh embodiment comprises an external case for the battery module, a lithium ion battery cell unit that is constituted with a plurality of serially connected lithium ion battery cell groups each include a plurality of serially connected lithium ion battery cells that are disposed in the external case, a positive pole-side power cable and a negative pole-side power cable through which power is output from the lithium ion battery cell unit, a cell controller that includes a plurality of integrated circuits each disposed in correspondence to one of the groups of the lithium ion battery cell and measures each of the terminal voltages at the plurality of lithium ion battery cells, a plurality of detection harnesses via which the terminal voltages at the lithium ion battery cells are supplied to the corresponding integrated circuits in the cell controller, a battery controller, and a transmission path through which information is transmitted between one of the integrated circuits and another one of the integrated circuits or between one of the integrated circuits and the battery controller. In this on-vehicle battery module, the integrated circuits each include a selection circuit that selects in a predetermined order a plurality of the terminal voltages supplied via the detection harnesses, a voltage detection circuit that measures the selected terminal voltages, and a diagnosis circuit that diagnoses an abnormality in the selection circuit. The integrated circuits each execute independently a cyclic measurement of terminal voltages at individual lithium ion battery cells in a corresponding group and a cyclic abnormality diagnosis of the selection circuit. Based upon an instruction from the battery controller, each of the integrated circuits transmits a measurement result of the terminal voltages to the battery controller and constantly outputs a result of the abnormality diagnosis to the battery controller.

According to a twelfth embodiment, a cell controller for an on-vehicle battery module that receives terminal voltages at each lithium ion battery cell from a lithium ion battery cell unit constituted with a plurality of serially connected lithium ion battery cell groups, each of which includes a plurality of lithium ion battery cells, and measures the terminal voltages at each of the lithium ion battery cells, comprises a plurality of integrated circuits each disposed in correspondence to one of the lithium ion battery cell groups and a transmission path through which information is transmitted between one of the integrated circuits and another one of the integrated circuits or between one of the integrated circuits and a circuit other than that of the integrated circuits. In this cell controller, the integrated circuits each include a selection circuit that selects in a predetermined order terminal voltages at a plurality of lithium ion battery cells transmitted from a corresponding lithium battery cell group, a voltage measurement circuit that measures the selected terminal voltages, a diagnosis circuit that diagnoses an abnormality in the selection circuit, and a transmission/reception circuit. The integrated circuits each execute independently a cyclic measurement of the transmitted terminal voltages and a cyclic abnormality diagnosis of the selection circuit. Based upon an instruction, the transmission/reception circuit transmits measurement results of the terminal voltages and constantly outputs results of the abnormality diagnosis.

BRIEF DESCRIPTION OF THE DRAWINGS

FIG. 4 illustrates a timing with which a diagnosis operation and a measurement operation are executed and diagnosis sessions.

FIG. 6 presents a diagnosis operation achieved in the first embodiment.

FIG. 7 shows an example of a communication circuit which is installed within each integrated circuit and is engaged in communication command exchange.

FIG. 30 shows a signal OFF period set via the discharge control circuit to control the balancing switch in priority to the control for adjustment of the state of charge.

DESCRIPTION OF PREFERRED EMBODIMENTS

The embodiment of the present invention described below relates to a battery system, a drive system provided with the battery system, an on-vehicle battery system, a battery module, a cell controller used for the battery module, and circuit components in the cell controller including a circuit board and an integrated circuit. All of them are highly reliable. Issues other than improvement in reliability have been addressed in the system and the circuit components such as the circuit board and the integrated circuit described below. Representative examples of the solutions are described below.

(Improvement in Reliability)

Figure 13:
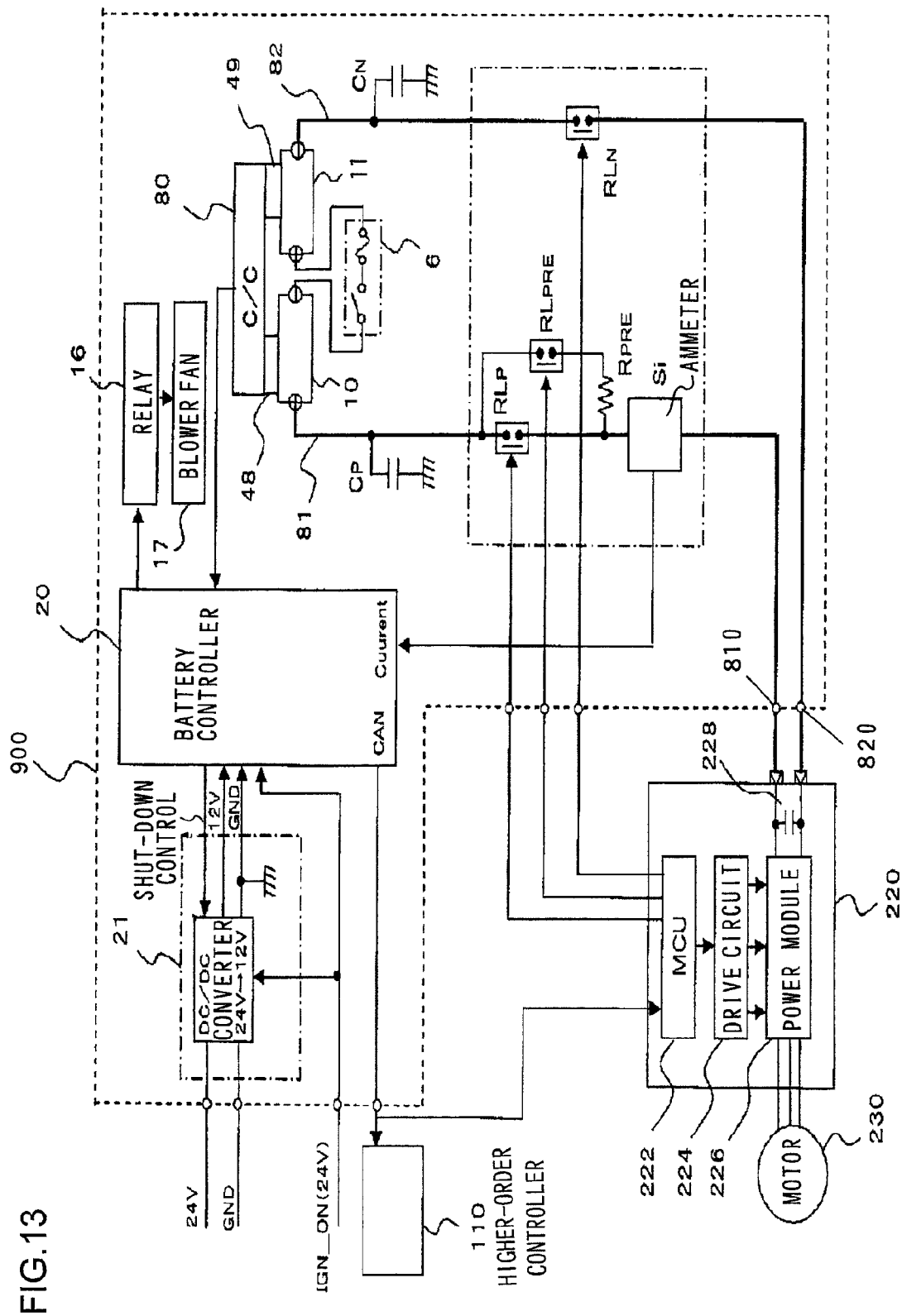
FIG. 13 is a circuit diagram presenting an application example in which the battery system for vehicle in the present embodiment is adopted in a drive system for an automotive rotating electrical machine.

The vehicle drive system described below with reference to FIG. 13 is mainly constituted by the battery module 900, an inverter device 220, and a rotating electrical machine (hereafter referred to as a motor) 230. The inverter device 220 and the battery module 900 exchange information with each other via a communication line. Diagnosis results of the battery module 900 are transmitted to a control circuit (hereafter referred to as MCU) 222 of the inverter device 220. This allows the inverter device 220 and the battery module 900 to share with each other critical information on an abnormality or the like. The battery module 900 is provided with relays RLP and RLN that connect or disconnect the electrical circuit between the lithium ion battery and the inverter device 220. The relays RLP and RLN are controlled by the MCU 222 of the inverter device 220. The MCU 222 of the inverter device 220 controls the relays RLP and RLN based upon the state of the motor 230, the inverter device 220, or the battery module 900, ensuring an improvement in the overall system reliability. The MCU 222 of the inverter device 220 controls power consumption and power generation of the motor 230 by controlling the inverter corresponding to the controls of the relays RLP and RLN, ensuring a higher level of safety and a higher level of reliability.

The battery module 900 is mainly constituted by the battery unit 9 including lithium ion battery cells, the cell controller 80, and the battery controller 20. The cell controller 80 is engaged in a measurement and a diagnosis of the terminal voltage at the lithium ion battery cells in the battery unit 9 and a discharge operation to be executed in order to adjust the state of charge (SOC). The battery controller 20 controls the battery module 900 in response to the measurement result and the diagnosis result obtained by the cell controller 80. Assigning functions as above improves the reliability and safety of the battery module 900.

The cell controller 80 is provided with a plurality of integrated circuits that have a function to detect individual terminal voltages of the plurality of lithium ion battery cells in the battery unit 9. It is crucial to measure the terminal voltages at lithium ion battery cells with a high level of reliability for, unlike a unit cell, a battery module using lithium ion battery cells in terms of safety. On-vehicle devices are usually used for long time in severe conditions including high or low temperature; therefore, they have to be heavier-duty than general industrial devices. In the embodiment described below, the integrated circuits are each provided with a diagnosis circuit for diagnosing whether or not the terminal voltages at the battery cells are properly measured and each execute a diagnosis repeatedly over predetermined cycles. The integrated circuits or the cell controller 80 with the integrated circuits adopt structures as above, ensuring a high level of reliability.

As described above, diagnoses of degradation of lithium ion battery cells and of discharge circuits of lithium ion battery cells have been executed, on the other hand, necessity of diagnosis for measurement operations of terminal voltage at the lithium ion battery cells has not been realized. It is preferred that the measurement operation of each integrated circuit is diagnosed for improvement in reliability and safety. In the embodiment described below, each of the integrated circuits repeatedly diagnoses through the diagnosis circuit whether or not the measurement operation of the terminal voltage is properly executed. This diagnosis is executed by, for instance, diagnosing whether or not the selection of terminal voltage at lithium ion battery cells is properly executed by the multiplexer, ensuring integrated circuits with an extremely high level of reliability.

(Simplification of Integrated Circuits)

Figure 4:
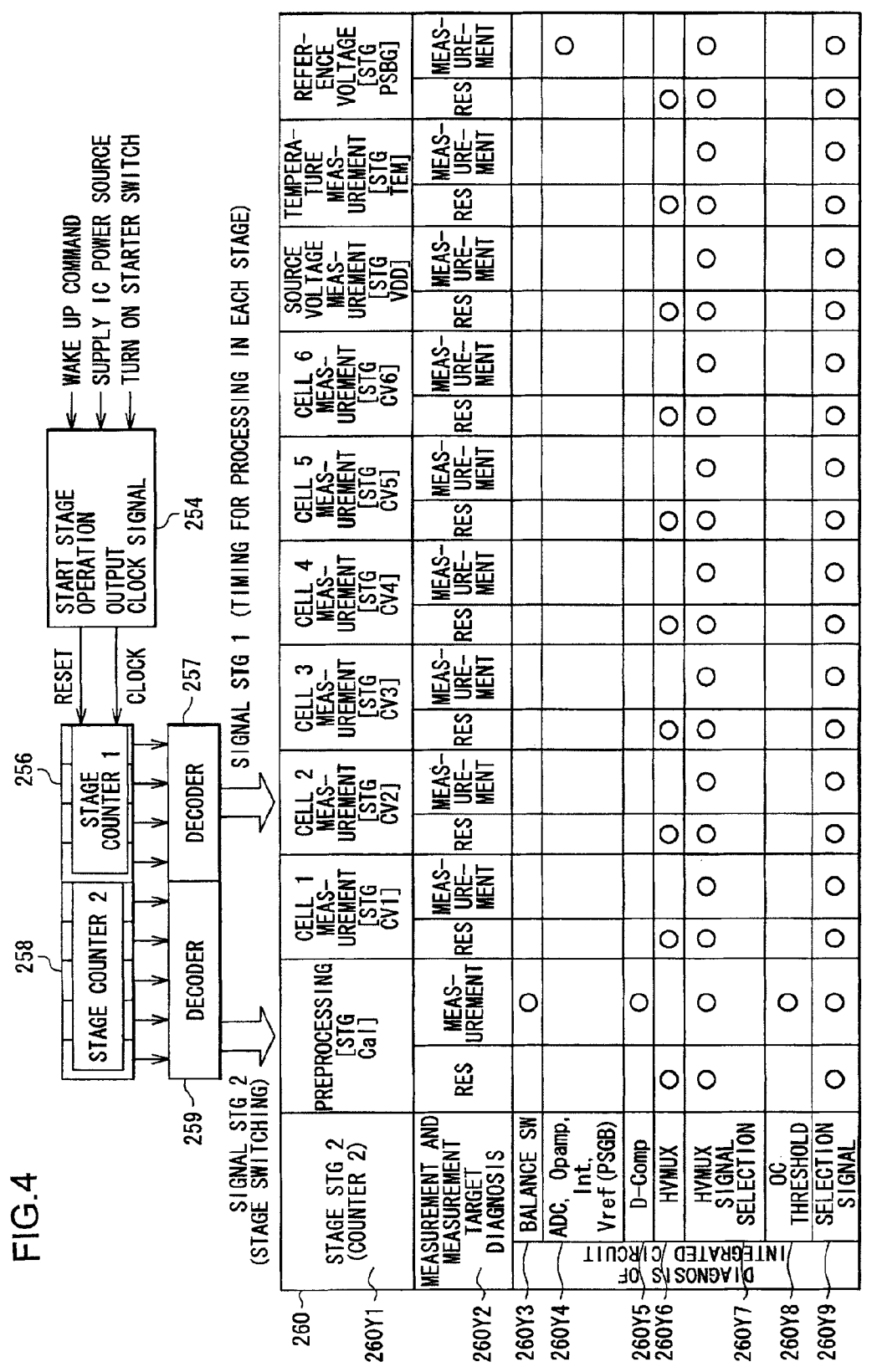

In the embodiment described below, as FIG. 4 shows, the diagnosis for the measurement operation is repeatedly executed over a cycle synchronized with the measurement of terminal voltages at the lithium ion battery cells. This enables the integrated circuits to execute controls of the measurement and the diagnosis in an integrated manner. Accordingly, simplification of the integrated circuit structures is assured in addition to improvement in reliability and safety.

In the embodiment described below, as FIG. 4 shows, a plurality of diagnoses of the integrated circuits are executed in synchronization with the measurement operations so as to execute overall diagnoses of the integrated circuits in an integrated manner. A high level of reliability is thus assured in integrated circuits. It is to be noted that the plurality of diagnoses include diagnosis for the balancing switch in the integrated circuit, diagnosis for the analog/digital converter, diagnosis for the multiplexer, and diagnosis for the digital comparator circuit. In other words, a diagnosis function is added to the primary functions of the integrated circuits. Because the overall operation and overall structure of the integrated circuits integratively address such an increase in the function, simplified configuration of the integrated circuits is assured.

(Reduction in Abnormality Diagnosis Time)

It is preferable to rapidly detect an abnormality in the on-vehicle battery module that uses the lithium ion battery and to address the abnormality as quick as possible. However, an increase in power consumption results in an increase in both the number of lithium ion battery cells provided in the battery unit and the number of the integrated circuits to be used. It becomes an important issue to complete a large number of diagnosis sessions in a short period of time for the diagnoses for the individual integrated circuits themselves in addition to the abnormality diagnosis of the lithium ion battery cells.

In the embodiment described below, once each of the integrated circuits starts the measurement operation or the diagnosis operation, it independently repeats these operations in a predetermined cycle. The measurement operation and the diagnosis operation are thus executed. Therefore, although the lithium ion battery cells and the integrated circuits are large in number, each of the integrated circuits thus completes the measurement operation or the diagnosis operation for the battery system and the battery module in a short period of time. The measurement or the diagnosis can be executed in a short period of time even in case of, for example, quick start of the vehicle. This enables a traveling based upon the diagnosis result, assuring a high level of reliability.

When an abnormality occurred in the integrated circuits or in the lithium ion battery cells, the battery module, the battery system, and the drive system in FIG. 13 take measures such as a rapid reduction in electrical energy transmitted and received by the battery module, a rapid release of the relays, or the like. Each of the integrated circuits independently executes an abnormality diagnosis and is provided with a transmission/reception circuit that promptly transmits a signal indicating an abnormality upon detecting an abnormality. This transmission/reception circuit includes an OR function as shown in an example of an OR circuit 288. Namely, the integrated circuit is provided with a function of transmitting an abnormality signal upon receiving an abnormality signal from a transmission/reception circuit in another integrated circuit regardless of a diagnosis result of the integrated circuit itself, and also transmitting the abnormality signal upon detecting an abnormality in the integrated circuit of its own, even when it has not received any abnormality signal from a transmission/reception circuit in another integrated circuit. Thus, a higher-order control circuit, such as the battery controller 20, can immediately detect the abnormality diagnosis result of all of the plurality of relevant integrated circuits by checking the abnormality signal result transmitted from the integrated circuit. Furthermore, a comprehensive diagnosis result can be obtained without instructing the integrated circuit to transmit an abnormality signal, thereby limiting the increase in processing load in the higher-order control circuit.

(Improvement in Productivity)

Figure 26:
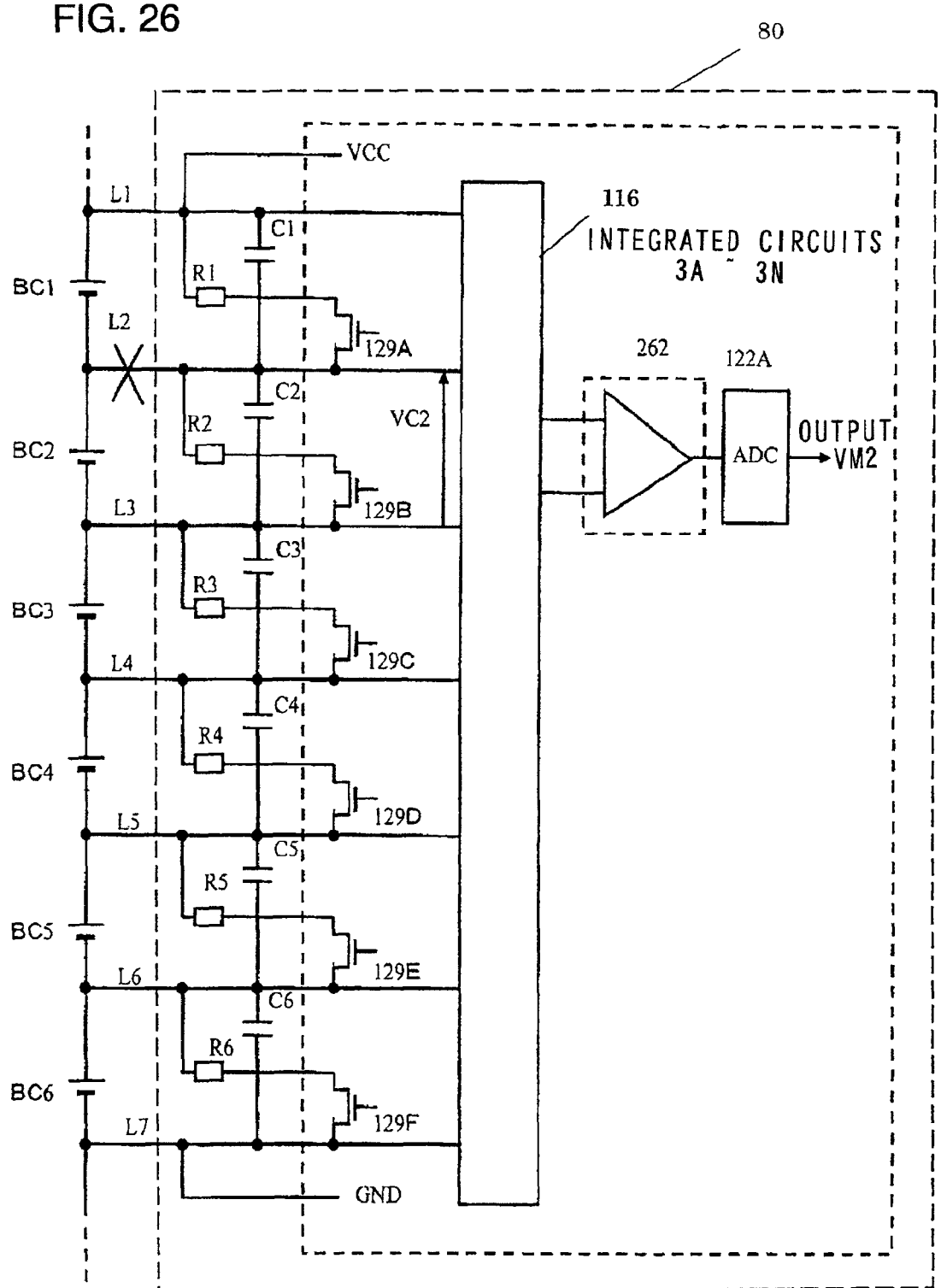
FIG. 26 presents an example of a diagnosis executed to detect an abnormality occurring at the detection harness, connecting the positive poles and the negative poles of the battery cells BC to the cell controller, for detecting terminal voltage.
Figure 27:
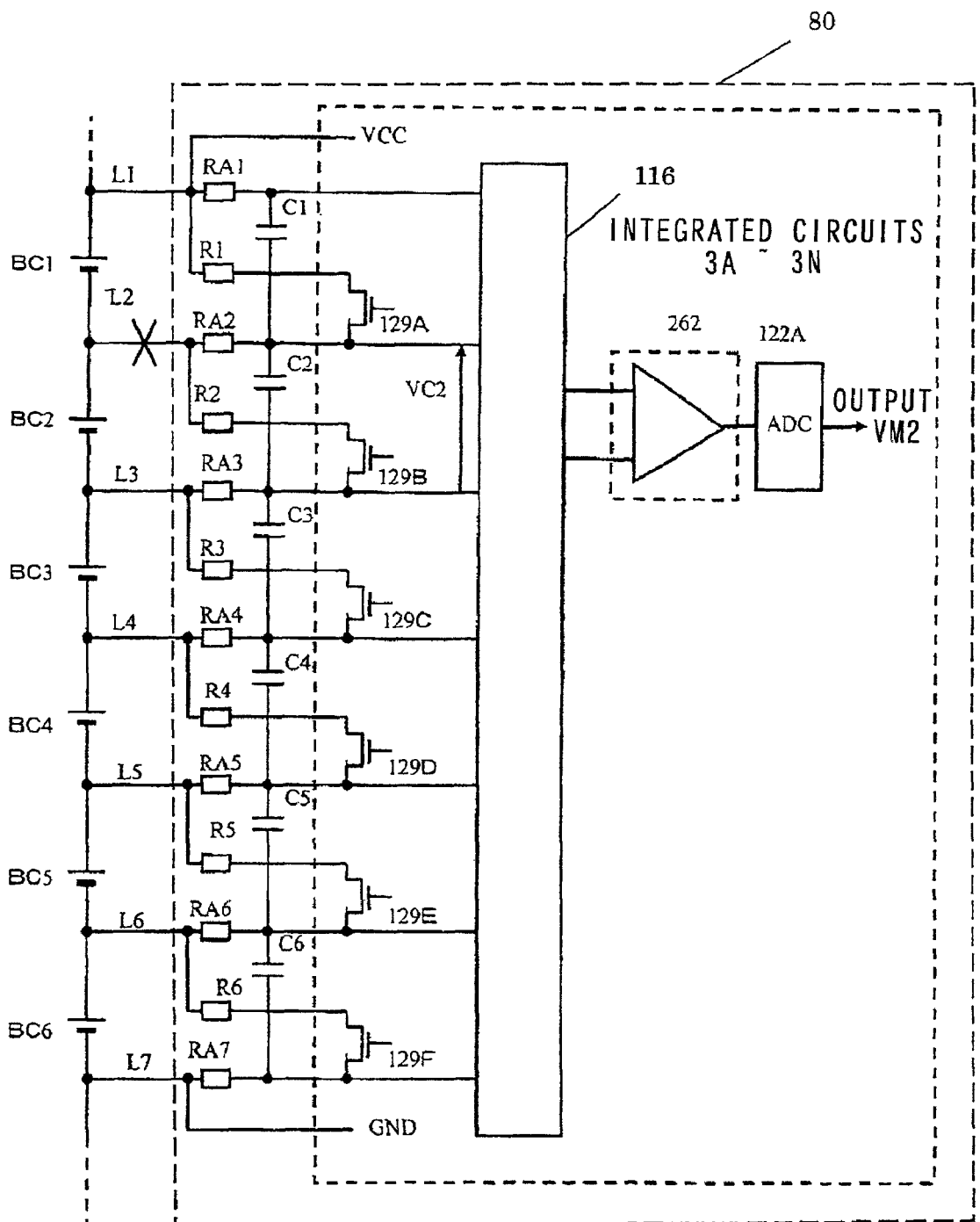
FIG. 27 presents another example of a diagnosis executed to detect an abnormality occurring at the detection harness, connecting the positive poles and the negative poles of the battery cells BC to the cell controller, for detecting terminal voltage.

In the embodiment described below, the integrated circuits are held on the substrate of the cell controller 80. Resistors R1~R4 for adjusting the SOC of the individual lithium ion battery cells, and capacitors C1~C6 for removing noises shown in FIGS. 26 and 27 are held on the substrate of the cell controller 80. This configuration with the integrated circuits, the resistors R1~R4, and the capacitors C1~C6 all held on the substrate of the cell controller 80 assures improvement in productivity. Placement of these circuit components close to each other ensures improvement in reliability and safety.

The above electric devices and the lithium ion battery cells are connected with each other via a connector and a communication harness 50, assuring a higher level of workability.

Since the diagnosis circuit is incorporated in each of the integrated circuits, improvement in reliability and safety, as well as productivity, are assured.

Preferred embodiments of the present invention will be described below with reference to figures.

(Explanation of Cell Controller)

Figure 1:
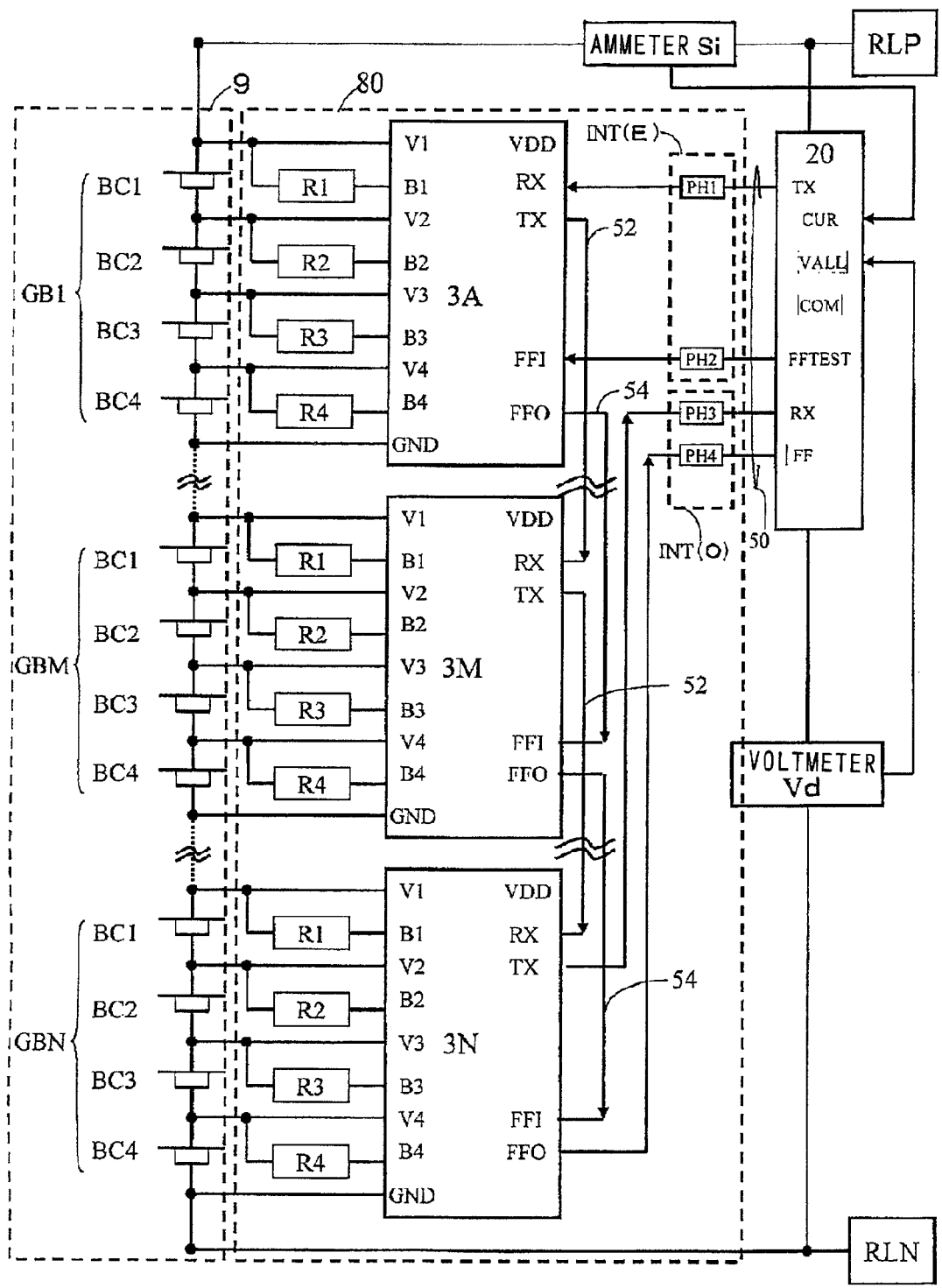
FIG. 1 is a block diagram showing the battery system for vehicle achieved in an embodiment of the present invention, specifically showing a battery unit 9, a cell controller 80, and a battery controller 20.

FIG. 1 shows a battery unit 9 and a cell controller (hereafter may be simply referred to as a C/C) 80 in an automotive battery system used to drive an automotive rotating electrical machine.

The battery unit 9 includes a plurality of battery cell groups GB1, ..., GBM, ... and GBN. The battery cell groups each include a plurality of serially connected battery cells BC1~BC4. In other words, the battery unit 9 includes a plurality of serially connected battery cells. The battery unit in the embodiment includes numerous battery cells, e.g., several tens of battery cells or even several hundred battery cells. The battery cells in the embodiment are each constituted with a lithium ion battery.

The terminal voltage at each lithium ion battery cell changes dependant on the state of charge at the battery cell. For instance, the terminal voltage at a given battery cell may be approximately 3.3 V in a discharged state corresponding to an SOC of approximately 30% and it may be approximately 3.8 V in a charged state corresponding to an SOC of approximately 70%. However, in an over-discharged state, in which the battery cell has been discharged beyond its normal operating range, the terminal voltage may fall to 2.5 V or less, whereas in an over-charged state, in which the battery cell has been charged beyond its normal operating range, the terminal voltage may be 4.2 V or higher. The SOC of each of the plurality of serially connected battery cells BC1~BC4 can be ascertained by individually measuring the terminal voltages.

In the embodiment, each battery cell group is constituted with four to six battery cells BC1~BC4, so as to facilitate the measurement of the terminal voltages at the individual battery cells BC1~BC12. In the example presented in FIG. 1, each battery cell group is made up with four battery cells. Namely, the group GB1, GBM and GBN are each constituted with battery cells BC1~BC4. While there are battery cell groups each made up with battery cells are present between the group GB1 and the group GBM and between the group GBM and the group GBN, these battery cell groups assume structures similar to those of the groups GB1, ..., GBM, ... and GBN and for purposes of simplification, FIG. 1 does not include an illustration of the other battery cell groups.

The cell controller 80 includes integrated circuits 3A, ..., 3M, ... and 3N, each provided in correspondence to one of the groups GB1, ..., GBM, ... and GBN constituting the battery unit 9. The integrated circuits each include voltage detection terminals via which the terminal voltages at the individual battery cells are detected. The voltage detection terminals V1 through GND at each integrated circuit are connected to the positive poles and the negative poles of the individual battery cells constituting the corresponding battery cell group. The integrated circuit further includes transmission/reception terminals used for signal transmission. The transmission/reception terminals at the individual integrated circuits are serially connected as explained later and are connected to a battery controller 20 through a signal transmission path. This structural feature is to be described in detail below.

The cell controller 80 includes a plurality of integrated circuits, e.g., several integrated circuits or several tens of integrated circuits, each provided in correspondence to a specific battery cell group. FIG. 1 shows the integrated circuits (hereafter may be simply referred to as ICs) 3A, ..., 3M, ... and 3N. While integrated circuits assuming structures similar to those of the integrated circuits 3A, 3M and 3N are present between integrated circuits 3A and 3M and between the integrated circuits 3M and 3N. For purposes of simplification, FIG. 1 does not include an illustration of the other integrated circuits.

The integrated circuits 3A, ..., 3M, ... and 3N respectively detect the voltages at the battery cells BC1~BC4 constituting the corresponding battery cell groups GB1, ..., GBM, ... and GBN. In addition, in order to achieve uniformity with regard to the states of charge (SOCs) of the battery cells constituting all the battery cell groups, the integrated circuits 3A, ..., 3M, ... and 3N each assume a structure whereby SOC adjustment resistors R1~R4 to be used to individually adjust the SOCs at the battery cells BC1~BC4 are connected in parallel with the corresponding battery cells via switch elements. The switch elements are to be described in detail in reference to FIG. 2.

The integrated circuits 3A, ..., 3M, ... and 3N have a function of detecting an abnormal state occurring at any of the battery cells BC1~BC4 constituting the corresponding battery cell groups GB1, ..., GBM, ... and GBN. The integrated circuits adopt structures identical to one another and each includes (1) a terminal voltage measurement circuit, (2) an SOC adjustment circuit and (3) an abnormal state detection circuit, for the corresponding battery cells. The term "abnormal state" is used in the description of the embodiment to refer to an over-charge or an over-discharge of a battery cell, an abnormal rise in the battery cell temperature or the like.

Signals are exchanged between the integrated circuits 3A, ..., 3M, ... and 3N and the higher-order battery controller 20 through a communication harness 50. The battery controller 20, grounded (GND) at the potential assumed at the vehicle chassis, operates at a low potential of 12 V or less. The integrated circuits 3A, . . . , 3M, . . . and 3N are held at varying potentials, since the potentials at the battery cells constituting the corresponding groups are different and thus operate at different potentials. As described earlier, the terminal voltage at a given battery cell changes based upon its SOC and thus, the potential at each group relative to the minimum potential of the battery unit 9 changes in correspondence to the states of charge SOCs. Since the integrated circuits 3A, . . . , 3M, . . . and 3N each detect the terminal voltages of the battery cells constituting the corresponding battery cell group in the battery unit 9 or each executes discharge control or the like to adjust the states of charge SOCs at the battery cells constituting the corresponding group, the voltage difference applied to the integrated circuit can be reduced by adjusting the reference potential of the integrated circuit based upon the potential of the corresponding group. A lesser extent of variance among voltages applied to the integrated circuits is advantageous in that a very high level of voltage withstanding performance does not need to be rigorously pursued with regard to the integrated circuits and in that better safety and better reliability are assured. Accordingly, the reference voltage for each integrated circuit is adjusted based upon the potential at the corresponding group in the embodiment. By connecting the GND terminal assuming the reference potential for the integrated circuit to a battery cell in the corresponding group, the reference potential of the integrated circuit can be altered based upon the potential of the corresponding group. In the embodiment, a terminal of the battery cell assuming the lowest potential in the group is connected to the GND terminal of the integrated circuit.

In addition, in order to allow each integrated circuit to initially generate a reference voltage and a drive voltage to be used to engage the internal circuits disposed therein a V1 terminal of the integrated circuit is connected to a positive-pole terminal of the battery cell assuming the highest potential in the corresponding group and the GND terminal of the integrated circuit is connected to a negative-pole terminal of the battery cell assuming the lowest potential in the group. The integrated circuits structured as described above is engaged in operation as a voltage representing the difference between the highest potential and the lowest potential in the corresponding group is supplied thereto. The power consumption of the individual integrated circuits is equally distributed to the battery cells of each of the battery cell groups in the battery unit 9, thereby reducing the imbalance in the SOC.

The relationship among the potentials manifesting in the power supply system for the battery controller 20 and the relationship among the potentials manifesting in the power supply system for the cell controller 80 are different from each other and the values of the voltages generated therein also differ greatly. Accordingly, the communication harness 50 connected to the battery controller 20 needs to be electrically insulated from transmission paths 52 and 54 through which the transmission/reception terminals of the individual integrated circuits 3A, . . . , 3M, . . . and 3N are serially connected. Such electrical insulation is assured via insulating circuits disposed on the entry sides and the exit sides of the transmission paths 52 and 54 constituted with the integrated circuits.

The insulating circuit disposed on the entry side of the transmission paths 52 and 54 is indicated as an entry-side interface INT(E), whereas the insulating circuit disposed on the exit side is indicated as an exit-side interface INT(O). The interfaces INT(E) and INT(O) each include a circuit via which an electrical signal is first converted to an light signal and then the light signal is converted back to an electrical signal. Information is transmitted via this circuit. As a result, the electrical circuit of the battery controller 20 and the electrical circuit of the cell controller 80 remain electrically insulated from each other. The entry-side interface INT(E) includes photocouplers PH 1 and PH2. The photocoupler PH 1 is disposed between a transmission terminal RX of the battery controller 20 and a reception terminal RX of the integrated circuit 3A on the high potential side. The photocoupler PH 2 is disposed between a transmission terminal FF-TEST of the battery controller 20 and a reception terminal FFI of the integrated circuit 3A. Via the photocouplers PH 1 and PH 2 in the entry-side interface INT(E), the transmission terminals TX and FF-TEST of the battery controller 20 remain electrically insulated from the reception terminals RX and FFI at the integrated circuit 3A and vice versa.

Likewise, photocouplers PH 3 and PH 4 constituting the exit-side interface INT(O) are disposed between reception terminals at the battery controller 20 and the low-potential-side integrated circuit 3N, so as to sustain the reception terminals at the battery controller 20 and the transmission terminals at the integrated circuit 3N in a state of electrical insulation from each other. More specifically, the photocoupler PH 3 is disposed between the transmission terminal TX of the integrated circuit 3N and the reception terminal RX of the battery controller 20, whereas the photocoupler PH 4 is disposed between the transmission terminal FFO of the integrated circuit 3N and the reception terminal FF of the battery controller 20.

A signal transmitted from the transmission terminal TX of the battery controller 20 travels through the integrated circuits 3A, . . . , 3M, . . . and 3N along a looped communication path and is received at the reception terminal RX. Namely, the signal transmitted from the transmission terminal TX of the battery controller 20 is received at the reception terminal RX of the integrated circuit 3A via the photocoupler PH 1 in the entry-side interface INT(E), is transmitted from the transmission terminal TX of the integrated circuit 3A, is received at the reception terminal RX of the integrated circuit 3M, is transmitted from the transmission terminal TX of the integrated circuit 3M, is received at the reception terminal RX of the integrated circuit 3N, is transmitted from the transmission terminal TX of the integrated circuit 3N and is finally received at the reception terminal RX of the battery controller 20 via the photocoupler PH 3 in the exit-side interface INT(O). Serial communication is executed via this looped communication path provided in the cell controller 80. It is to be noted that measurement values indicating the terminal voltage at each battery cell, the temperature at the battery cell and the like are received at the battery controller 20 through the serial communication. In addition, the integrated circuits 3A through 3N are each configured so as to automatically enter a wake-up state upon receiving a command via the transmission path. Namely, as a communication command 292, to be detailed later, is transmitted from the battery controller 20, the integrated circuits 3A through 3N each shift from a sleep state into an operating state.

The integrated circuits 3A through 3N each executes an abnormality diagnosis and transmits a one-bit signal via the following transmission path in the event of an abnormality. The integrated circuits 3A through 3N each transmits an abnormality signal from the transmission terminal FFO if it is determined that an abnormality has occurred in the integrated circuit itself or if a signal indicating an abnormality, transmitted from the preceding integrated circuit is received at the reception terminal FFI. If, on the other hand, a signal indicating an abnormality, which has already been received at the reception terminal FFI, disappears or if an abnormal decision having been made with regard to the subject integrated circuit is switched to a normal decision, the abnormality signal to be transmitted from the transmission terminal FFO disappears. The abnormality signal used in the embodiment is a one-bit signal. While the battery controller 20 does not transmit an abnormality signal to the integrated circuits, it transmits a test signal, i.e., a dummy abnormality signal to be used in diagnosis of the abnormality signal transmission path for the correct operating state, from a terminal FF-TEST of the battery controller 20. Next, the transmission path is described.

The test signal, i.e., the dummy abnormality signal, is transmitted from the transmission terminal FFTEST of the battery controller 20 to the reception terminal FFI of the integrated circuit 3A via the photocoupler PH 2 in the entry-side interface INT(E). In response to the signal, a signal indicating an abnormality (hereafter referred to as an abnormality signal) is transmitted from the transmission terminal FFO of the integrated circuit 3A to the reception terminal FFI of the next integrated circuit, . . . and is transmitted to the reception terminal FFI of the integrated circuit 3M. The abnormality signal, transmitted in sequence as described above, is ultimately transmitted to the reception terminal FF of the battery controller 20 via the photocoupler PH 4 in the exit-side interface INT(O) from the transmission terminal FFO of integrated circuit 3N. As long as the transmission path is working normally, the dummy abnormality signal transmitted from the battery controller 20 returns to the reception terminal FF of the battery controller 20 via the communication path. The communication path diagnosis can be thus executed as the dummy abnormality signal is transmitted and received at the battery controller 20, as described above, ensuring an improvement in the system reliability. In addition, as explained earlier, an integrated circuit transmits an abnormality signal to the succeeding integrated circuit upon detecting an abnormal state so as to report the abnormal state quickly to the battery controller 20 without requiring the battery controller 20 to issue a transmission request. As a result, the optimal action for correcting the abnormality can be taken promptly.

While the signals are invariably passed on from the integrated circuit 3A corresponding to the high potential group in the battery unit 9 toward the integrated circuit 3N corresponding to the low potential group in the battery unit 9 in the description provided above, this transmission sequence simply represents an example. For instance, a signal may instead be transmitted from the battery controller 20 to the integrated circuit 3N corresponding to the low potential group in the battery unit 9, then transmitted to the individual integrated circuits (including the integrated circuit 3M) corresponding to higher potential groups in sequence and transmitted to the battery controller 20 via the interface INT from the integrated circuit 3A corresponding to the highest potential group. The transmission path in accordance with a potential change from the high-potential side to the low-potential side or vice versa is configured so as to eliminate the need for insulation means such as photocouplers among the integrated circuits. Thus, the transmission path is assured simply and inexpensively.

In the DC power supply system shown in FIG. 1, DC power is supplied to a load such as the inverter via a positive pole-side relay RLP and a negative pole-side relay RLN. The battery controller 20 or the inverter executes open/close control of the relays RLP and RLN as an abnormality is detected by an integrated circuit.

The battery controller 20 receives the output from an ammeter Si, detects the electrical current supplied from the overall battery unit 9 to the inverter and also detects the DC voltage applied to the inverter from the battery unit 9 based upon the output from a voltmeter Vd.

(Integrated Circuits)

Figure 2:
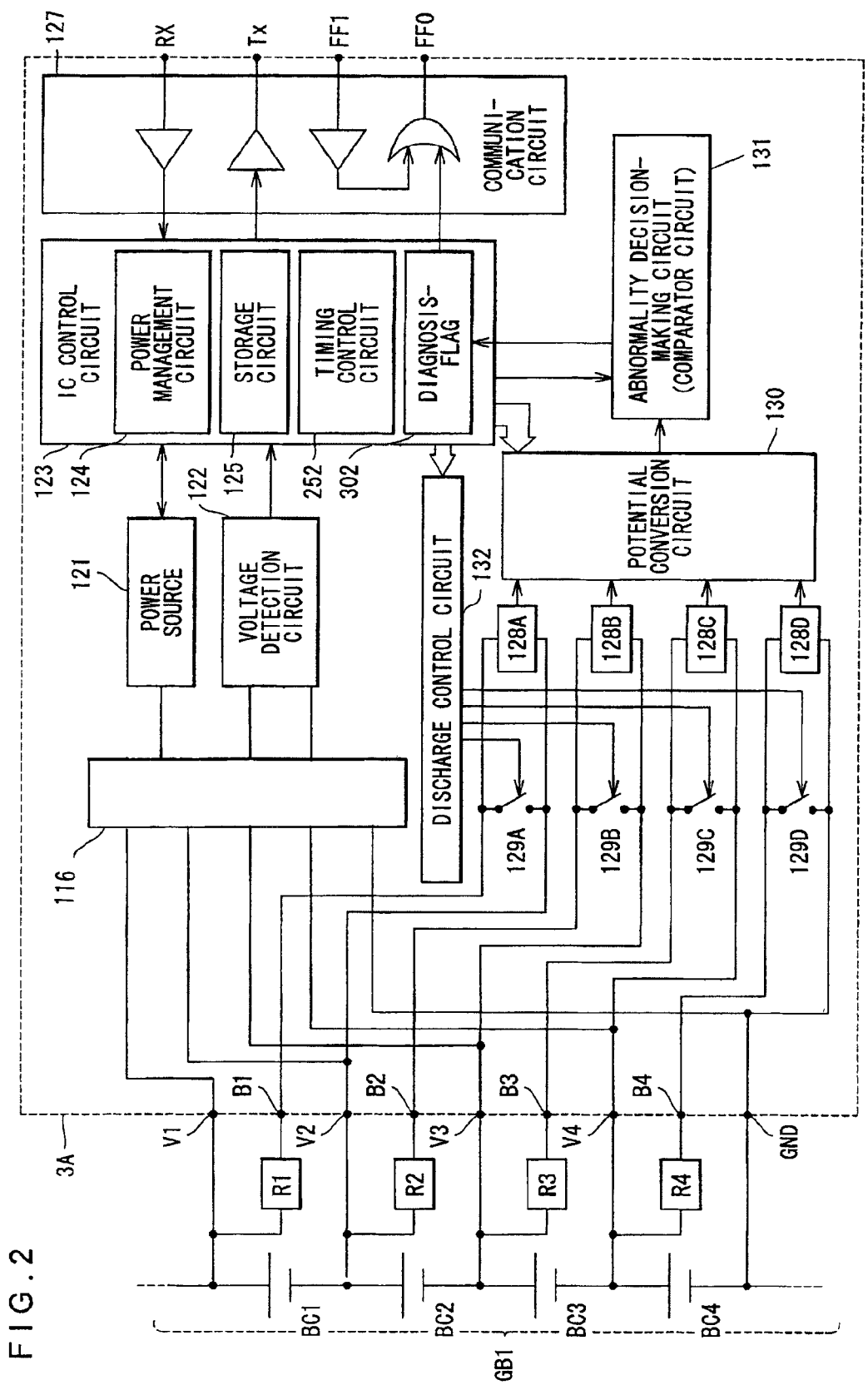
FIG. 2 is a block diagram showing an integrated circuit 3A in detail.

FIG. 2 is a block diagram of an electronic circuit representing an example of the integrated circuit 3A. As explained earlier, the integrated circuits 3A, . . . , 3M, . . . and 3N adopt structures identical to one another. In other words, the integrated circuits other than the integrated circuit 3A, too, may assume the structure shown in FIG. 2. The integrated circuit 3A in FIG. 2 is connected to the battery cells BC1~BC4 in the group GB1 in the battery unit 9 corresponding to the particular integrated circuit. The integrated circuits other than the integrated circuit 3A, too, are connected to the corresponding groups in the battery unit 9 and are engaged in similar operation. It is to be noted that while the integrated circuit 3A and the resistors R1~R4 are all disposed in the cell controller 80 as shown in FIG. 1, FIG. 2 does not include an illustration of the cell controller 80.

Input-side terminals of the integrated circuit 3A are connected to the battery cells BC1~BC4 constituting the group GB1. The positive-pole terminal of the battery cell BC1 is connected to an input circuit 116 via an input terminal V1. The input circuit 116 includes multiplexers as described below. The negative-pole terminal of the battery cell BC1, which is also the positive-pole terminal of the battery cell BC2, is connected to the input circuit 116 via an input terminal V2; The negative-pole terminal of the battery cell BC2, which is also the positive-pole terminal of the battery cell BC3, is connected to the input circuit 116 via an input terminal V3; and the negative-pole terminal of the battery cell BC3, which is also the positive-pole terminal of the battery cell BC4, is connected to the input circuit 116 via an input terminal V4. The negative-pole terminal of the battery cell BC4 is connected to the GND terminal of the integrated circuit 3A.

The power source circuit 121, which may be constituted with, for instance, a DC/DC converter, converts power from the individual battery cells BC1~BC4 to predetermined constant voltages. These voltages are supplied to the various circuits within the integrated circuit 3A to be used as drive power or supplied to a comparator circuit where it is used as a comparison reference voltage when judging the current state.

The voltage detection circuit 122 includes a circuit that converts the terminal voltage at each of the battery cells BC1~BC4 to a digital value. The terminal voltages having been converted to digital values are provided to an IC control circuit 123 where they are held in an internal storage circuit 125. These voltage values are used in the diagnosis and the like and are also transmitted to the battery controller 20 shown in FIG. 1 from a communication circuit 127.

The IC control circuit 123, equipped with an arithmetic operation function, includes the storage circuit 125, a power management circuit 124 and a timing control circuit 252 that cyclically detects various voltages and executes a state diagnosis. In the storage circuit 125, which may be constituted with, for instance, a register circuit, the terminal voltages at the battery cells BC1~BC4 detected by the voltage detection circuit 122 are stored in correspondence to the individual battery cells BC1~BC4. In addition, other detection values are held in the storage circuit 125 at predetermined addresses so that they can be read out as necessary. The power management circuit 124 assumes a structure that enables it to manage the state of the power source circuit 121.

The communication circuit 127 is connected to the IC control circuit 123 and thus, the IC control circuit 123 is able to receive a signal originating from an external sender outside the integrated circuit 3A via the communication circuit 127. For instance, the communication command originating from the battery controller 20 can be received at the RX terminal via the photocoupler PH 1 in the entry-side interface INT(E). The communication command is then transferred from the communication circuit 127 to the IC control circuit 123, and is decoded at the IC control circuit 125, which then executes processing corresponding to the contents of the communication command. Such a communication command may be a communication command requesting the measurement values indicating the terminal voltages at the battery cells BC1~BC4, a communication command requesting a discharge operation to be executed in order to adjust the SOCs at the individual battery cells BC1~BC4, a communication command (wake-up) for starting operation of the integrated circuit 3A, a communication command (sleep) for stopping operation of the integrated circuit 3A or a communication command requesting address setting.

As shown in FIG. 2, the positive-pole terminal of the battery cell BC1 is connected to a terminal B1 of the integrated circuit 3A via the resistor R1. A balancing switch 129A is disposed between the terminal B1 and the terminal V2. An operating state detection circuit 128A that detects the operating state of the balancing switch 129A is connected in parallel to the balancing switch 129A. A discharge control circuit 132 executes open/close control for the balancing switch 129A. Likewise, the positive-pole terminal of the battery cell BC2 is connected to a terminal B2 via the resistor R2 and a balancing switch 129B is disposed between the terminal B2 and the terminal V3. An operating state detection circuit 128B that detects the operating state of the balancing switch 129B is connected in parallel to the balancing switch 129B. A discharge control circuit 132 executes open/close control for the balancing switch 129A.

The positive-pole terminal of the battery cell BC3 is connected to a terminal B3 via the resistor R3 and a balancing switch 129C is disposed between the terminal B3 and the terminal V4. An operating state detection circuit 128C that detects the operating state of the balancing switch 129C is connected in parallel to the balancing switch 129C. The discharge control circuit 132 executes open/close control for the balancing switch 129C. The positive-pole terminal of the battery cell BC4 is connected to a terminal B4 via the resistor R4 and a balancing switch 129D is disposed between the terminal B4 and the terminal GND. An operating state detection circuit 128D that detects the operating state of the balancing switch 129D is connected in parallel to the balancing switch 129D. The discharge control circuit 132 executes open/close control for the balancing switch 129D.

The operating state detection circuits 128A~128D repeatedly detect the voltages at the two terminals at the respective balancing switches 129A~129D over predetermined cycles so as to determine whether or not the balancing switches 129A~129D are in a normal state. The SOCs of the battery cells BC1~BC4 are adjusted via the balancing switches 129A~129D respectively. This means that if an abnormality occurs at any of these switches, the SOC of the corresponding battery cell cannot be controlled, giving rise to an over-charge or an over-discharged state in the particular battery cell. Any one of the balancing switches 129A~129D may be detected to be in an abnormal state if, for instance, the voltage between the terminals at the balancing switch, which should be in a continuous state, matches the terminal voltage at the corresponding battery cell. Under such circumstances, the balancing switch has failed to enter the continuous state in response to a control signal. Also, if the voltage between the terminals at a given balancing switch, which should be in an open state, indicates a value lower than that of the terminal voltage at the corresponding battery cell, the particular balancing switch can be assumed to be continuous regardless of the control signal. The switch operating state detection circuits 128A~128D may be voltage detection circuits each constituted with a differential amplifier or the like. The terminal voltages are compared with a predetermined voltage used for purposes of making the decision described above at an abnormality decision-making circuit 131 to be detailed later.

Via the balancing switches 129A~129D, which may each be constituted with, for instance, a MOSFET, the power having accumulated in the corresponding battery cells BC1~BC4 is discharged. An electrical load such as an inverter is connected to the battery unit 9 constituted with numerous serially connected battery cells and an electrical current is supplied to the electrical load from the entire assembly of serially connected battery cells. In addition, the battery unit 9 is charged with an electrical current supplied from the electrical load to all the battery cells connected in series. If the serially connected battery cells assume varying states of charge (SOCs), the current supplied to the electrical load is regulated in correspondence to the state of the battery cell at the most advanced stage of discharge among the battery cells. The current supplied from the electrical load, on the other hand, is regulated in correspondence to the state of the battery cell at the most advanced stage of charge among the battery cells.

The balancing switch 129 connected to any battery cell assuming an SOC exceeding the average state among the numerous serially connected battery cells is set in a continuous state so as to supply a discharge current via the serially connected registers. As a result, the states of charge of the serially connected battery cells are controlled toward equalization. An alternative method whereby the battery cell in the most advanced stage of discharge is assigned as a reference cell and the discharge time for a given battery cell is determined based upon the difference relative to the SOC of the reference cell may be adopted. There are various other methods that may be adopted for SOC adjustment. The SOC of each battery cell can be determined through arithmetic operation executed based upon the terminal voltage at the battery cell. There is a correlation between the SOC of the battery cell and the terminal voltage at the battery cell and, accordingly, by controlling the balancing switches 129 so as to equalize the terminal voltages at the battery cells, the SOCs of the battery cells can be substantially equalized.

The voltage between the source and the drain at the FET constituting each balancing switch, detected via the corresponding operating state detection circuit among the operating state detection circuits 128A~128D, is output to a potential conversion circuit 130. Different potentials are set between the sources and the drains at the individual FETs relative to the reference potential at the integrated circuit 3A, and for this reason, accurate judgment cannot be made by comparing the initial voltage values. Accordingly, the potentials are adjusted at the potential conversion circuit 130 before undergoing abnormality decision-making at the abnormality decision-making circuit 131. The potential conversion circuit 130 also has a function of selecting the diagnosis target balancing switch 129 based upon a control signal provided from the IC control circuit 123. The voltage at the selected balancing switch 129 is provided to the abnormality decision-making circuit 131. Based upon a control signal provided from the IC control circuit 123, the abnormality decision-making circuit 131 compares the voltage measured between the terminals at the diagnosis target balancing switch 129, indicated in the signal from the potential conversion circuit 130, with a decision-making voltage and makes a decision as to whether or not an abnormality has occurred at the target balancing switch among the balancing switches 129A~129D.

A command signal for setting the balancing switch 129, corresponding to the battery cell to be discharged, in a continuous state is transmitted from the IC control circuit 123 to the discharge control circuit 132. Based upon this command signal, the discharge control circuit 132 outputs a signal equivalent to a gate voltage at which the balancing switches 129A~129D constituted with MOSFETs as explained earlier, enter the continuous state. The IC control circuit 123, upon receiving through communication a discharge time command indicating the discharge time corresponding to the specific battery cell from the battery controller 20 in FIG. 1, executes the discharge operation described above.

The abnormality decision-making circuit 131 detects whether or not an abnormality has occurred at any of the balancing switches 129A~129D.

The IC control circuit 123 outputs an abnormality signal indicating that an abnormality has occurred at any of the balancing switches 129A~129D from the one-bit transmission terminal FFO of the communication circuit 127 and the abnormality signal is subsequently transmitted to the battery controller 20 via the communication circuits 127 at the other integrated circuits. In addition, the IC control circuit 123 transmits information indicating that an abnormality has occurred at a balancing switch among the balancing switches 129A~129D and information enabling identification of the abnormal balancing switch to the battery controller 20 via the transmission terminal TX at the communication circuit 127.

(Communication Means)

Figure 3:
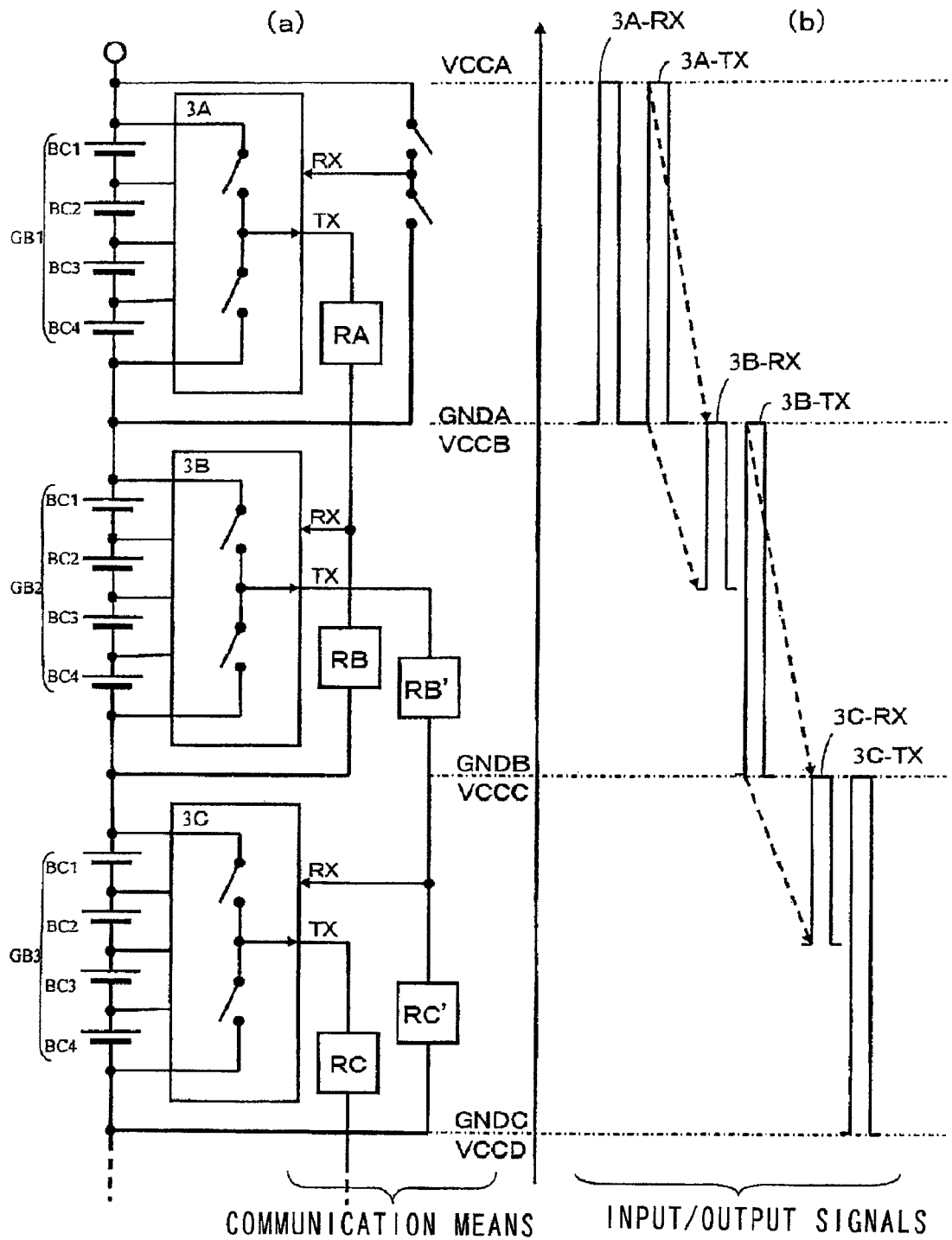
FIG. 3 illustrates an example of the communication command transmission/reception method adopted in the integrated circuits.

FIG. 3 illustrates a method that may be adopted to transmit and receive communication commands at the individual integrated circuits 3A, . . . , 3M, . . . and 3N. FIG. 3(*a*) shows a signal 3A-RX received at the terminal RX of the integrated circuit 3A, a signal 3A-TX transmitted from the terminal TX of the integrated circuit 3A, a signal 3B-RX received at the terminal RX of the succeeding integrated circuit 3B, a signal 3B-TX transmitted from the terminal TX of the integrated circuit 3B, a signal 3C-RX received at the terminal RX of the succeeding integrated circuit 3C and a signal 3C-TX transmitted from the terminal TX of the integrated circuit 3C.

The signal 3A-TX is split between a resistor RA within the integrated circuit 3A and a resistor RB within the integrated circuit 3B, and thus the signal 3B-RX is generated. The signal 3B-TX is split between a resistor RB' within the integrated circuit 3B and a resistor RC within the integrated circuit 3C, and thus the signal 3C-RX is generated. The subsequent transmission signals are likewise each split via the individual resistors within the integrated circuits connected in series along the communication path, thereby determining the potential of the corresponding reception signal.

FIG. 3(*b*) indicates the potential levels of the signals 3A-RX, 3A-TX, 3B-RX, 3B-TX, 3C-RX and 3C-TX.

As indicated in the figure, in a downstream-side group the voltage threshold value is set to a level matching half the total of the sum of voltages at the four battery cells and the sum of voltages at the two battery cells. If the signal from the terminal TX of the integrated circuit 3A is judged with a threshold value similar to that of the integrated circuit 3A in reference to voltages at battery cells controlled by the integrated circuit 3B, the low level of the signal will equal the half of the total voltage at the integrated circuit 3B, which is bound to lead to problems. Such problematic situation can be avoided by setting the threshold values as described above. It is to be noted that while the explanation is given above by assuming that the signals are transmitted from the higher potential-side toward the lower potential-side, signals may instead be transmitted from the lower potential-side toward the higher potential-side by shifting the signal levels through splitting via resistors in a similar manner.

(Diagnosis and Measurement: (1) Overview of Operation Schedule)

FIG. 4 illustrates the timing with which the measurement operation is executed. The integrated circuit 3A in FIG. 2 has a function of executing a diagnosis operation together with a measurement operation. It repeatedly executes measurement with the operational timing shown in FIG. 4 and also executes the diagnosis synchronously with the measurement. It is to be noted that while the groups GB1~GBN constituting the battery unit 9 each include four battery cells in the embodiment illustrated in FIGS. 1 and 2, the integrated circuits 3A~3N are each capable of handling up to six battery cells. In other words, the number of battery cells in each of the groups GB1~GBN can be increased up to six. Accordingly, the timing diagram presented in FIG. 4 indicates the timing with which the operation is executed in conjunction with six battery cells.

At the integrated circuits 3A~3N disposed in correspondence to the specific groups GB1~GBN, as shown in FIG. 1, the numbers of battery cells constituting the corresponding groups GB1~GBN are set. As a result, each of the integrated circuits 3A~3N is able to generate stage signals corresponding to the number of battery cells constituting the specific group. This structure allows the groups GB1~GBN to be constituted with varying numbers of battery cells, which, in turn, increases the level of freedom in design and enables high-speed processing.

As explained above, FIG. 4 illustrates the timing with which the diagnosis operation and the measurement operation are executed. The timing of the measurement operation, the measurement cycles and the diagnosis operation are managed by a startup circuit 254 and a stage counter unit constituted with a first stage counter 256 and a second stage counter 258. The stage counters 256 and 258 generate control signals (timing signals) to be used to manage the overall operation of the integrated circuit 3A. While the stage counters 256 and 258 are not separate entities in reality, they are shown as separate counters in the figure for ease of comprehension. The stage counter unit may be a standard counter or it may be constituted with a shift register.

Upon (1) receiving at the terminal RX a communication command indicating a wake-up request, transmitted through the transmission path, (2) reaching a predetermined voltage as a power source voltage from the IC power source in the integrated circuit is supplied thereto or (3) receiving a signal indicating that the vehicle starter switch (key switch) has been turned on, the startup circuit 254 outputs a reset signal to the first and second stage counters 256 and 258, thereby initializing the stage counters 256 and 258. The startup circuit also outputs a clock signal with a predetermined frequency. Namely, under the conditions described in any of (1)~(3) above, the integrated circuit 3A executes the measurement operation and the diagnosis operation. If, on the other hand, a communication command indicating a sleep request is received through the transmission path or the communication command is not received over a predetermined length of time or more, the startup circuit 254 stops outputting the clock with the timing with which the stage counters 256 and 258 resume the reset state, i.e., the initial state. As the clock output stops, the stage progress also stops and thus, the execution of the measurement operation and the diagnosis operation enters the stopped state.

Upon receiving the clock signal provided from the startup circuit 254, the first stage counter 256 outputs a count value to be used to control the processing timing with which the processing is executed within each period (each of the [STGCal RES] phase~the [STGPSBG measurement] phase, to be described in detail later) of each stage. A decoder 257 generates a timing signal STG1 to be used to control the processing timing with which the processing is executed in each period according to the count value provided from the first stage counter 256. As the count value at the second stage counter 258 progresses, the period in the corresponding stage is switched from the left-hand side stage to the right-hand side stage in an operation table 260. A decoder 259 outputs a stage signal STG2 to be used to select a specific stage and period according to the count value at the second stage counter 258.

The first stage counter 256 is a low-order counter. The second stage counter 258 is a high-order counter. During the count value at the second stage counter 258 is "0000" and the count value at the first stage counter 256 is "0000"-"1111," the stage signal STG2 indicating the RES phase of the stage STGCal (hereafter referred to as the [STGCal RES] phase) is output from the decoder 259. All processing executed during the [STGCal RES] phase is executed based upon the timing signal STG1 output from the decoder 257 based upon the count value "0000"-"1111" at the first stage counter 256.

It is to be noted that in FIG. 4 the first stage counter 256 is shown in a simplified manner as a 4-bit counter. However, the number of bits is not limited to the above. For instance, if the first stage counter 256 is a 8-bit counter and a different processing operation is executed per each count, 256 types of processing can be executed. As in the case of the first stage counter 256, numerous processing are enabled through numerous counts enabled at the second stage counter 258.

When the count value at the first stage counter 256 reaches "1111," the [STGCal RES] phase ends. Then, the count value at the second stage counter 258 becomes "0001" and the [STGCal measurement] phase starts. During the [STGCal measurement] phase in which the count value at the second stage counter 258 is "0001," all processing is executed based upon the timing signal STG1 output from the decoder 257 based upon the count value "0000"~"1111" at the first stage counter 256. When the count value at the first stage counter 256 reaches "1111," the [STGCal measurement] phase ends. Then, the count value at the second stage counter 258 becomes "0010" and the [STGCV1 RES] phase starts. When the count value at the first stage counter 256 reaches "1111" in the [STGCV1 RES] phase, the [STGCV1 RES] phase ends. Then, the count value at the second stage counter 258 becomes "0011" and the [STGCV1 measurement] phase starts.

Starting from the [STGCal RES] phase in FIG. 4, the operation period is thus switched to the right-hand side stage in the operation table 260 as the count value at the second stage counter 258 progresses. As the [STGPSGB measurement] phase ends, the basic operation ends. As the count value at the second stage counter 258 progresses again, the [STGCal RES] phase starts again.

It is to be noted that in the embodiment illustrated in FIG. 2, the groups GB1~GBN constituting the battery unit 9 are each made up with four battery cells and accordingly, stages STGCV5 and STGCV6 in the operation table 260 may either be skipped and remain unused. In other words, the presence of the stages STGCV5 and STGCV6 is not relevant in the operation table 260. If a specific count value is forcibly set at the second stage counter 258, the processing is executed at the phase corresponding to the specific count value.

(Diagnosis and Measurement: (2) Diagnosis and Measurement in Each Stage)

Next, details of the measurement and the diagnosis executed at each of the stages listed in row 260Y1 of the operation table 260 of FIG. 4 are explained. As described above, each of the stages includes the RES phase and the measurement phase. The diagnosis operation is executed during the RES phase. The measurement operation, the diagnosis operation, and the diagnosis for the measurement target based upon the measured value are executed during the measurement phase. Circles in rows 260Y3~260Y9 of the table 260 indicate that the individual diagnosis sessions listed in the individual rows are executed during the periods on which the circles are marked. These diagnosis sessions are self-diagnoses executed for the control device including the integrated circuit, i.e., self-diagnoses for the measurement system or the battery cell discharge control system shown in FIG. 2.

It is to be noted that during the RES phase of each stage, an analog/digital converter 122A to be used for the measurement is initialized in addition to executing the diagnosis for the sessions on which the circles are marked in the list. In the present embodiment, the analog/digital converter 122A adopting a charge/discharge method in conjunction with a capacitor is used so as to lessen the adverse effect of noise. The electrical charge having been accumulated at the capacitor during the previous operation is discharged during this RES phase. During the measurement phase at each of the stages listed in row 260Y2, measurement is executed via the analog/digital converter 122A and diagnosis is executed for the measurement target based upon the measured value.

During the RES phase at the stage STGCal, the self-diagnoses shown in rows 260Y6, 260Y7, and 260Y9 are primarily executed. In the self-diagnosis listed in row 260Y6, diagnosis (HVMUX) is executed for the input circuit 116, which functions as a multiplexer. In the self-diagnosis listed in row 260Y7, diagnosis (HVMUX signal selection) is executed for a switching circuit that executes a switching operation for the input circuit 116. In the self-diagnosis listed in row 260Y9, diagnosis of a selection signal (a selection signal used at a current value storage circuit 274 or a reference value storage circuit 278 in FIG. 6) used in the digital comparison operation within the integrated circuit is executed.

During the measurement phase at the stage STGCal, the self-diagnoses shown in rows 260Y3, 260Y5, 260Y7, 260Y8, and 260Y9 are executed. In the self-diagnosis listed in row 260Y3, a measurement of the terminal voltage at the balancing switch 129 used to adjust the SOC of a specific battery cell and a diagnosis for the balancing switch 129 are executed. In the self-diagnosis listed in row 260Y5, a diagnosis for the digital comparator circuit within the integrated circuit is executed. In the diagnosis listed in row 260Y8, a diagnosis is executed to determine whether or not the circuit that generates a threshold value to be used to detect an over-charged state of a battery cell is in the normal state. If an abnormality occurs at the threshold value generating circuit, an accurate over-charge diagnosis cannot be executed. The diagnosis sessions in rows 260Y7 and 260Y9 are as described above. It is to be noted that the individual diagnosis sessions listed in row 260Y7 and the sessions listed in row 260Y9 are all executed during the RES phase and the measurement phase at all the stages. However, these diagnosis cycles simply represent examples and the diagnoses may be executed over longer intervals instead of at each stage.

During the measurement phase at the stages STGCV1~STGCV6, the voltages at the terminals of the battery cells are measured in sequence and the diagnosis is executed based upon the values obtained through the measurement as to whether any of the battery cells may be at risk of over-charge or over-discharge. The over-charge/over-discharge diagnosis is executed with safety margins so as to prevent the battery cells from entering an over-charged state or an over-discharged state. It is to be noted that when each of the subject battery cell group GB1~GBN is made up with four battery cells, as shown in FIGS. 1 and 2, the stages STGCV5 and STGCV6 are skipped. During the measurement phase at the stage STGVDD, the output voltage from the power circuit 121 is measured as shown in FIG. 2. During the measurement phase at the stage STGTEM, the voltage output at the thermometer is measured. During the measurement phase at the stage STGPSBG, the reference voltage is measured.

During the RES phases at the stages STGCV1~STGPSBG, a diagnosis operation similar to that executed during the RES phase at the stage STGCal is executed. Moreover, in any of the measurement phase at the stages STGCV1~STGTEM, the diagnosis sessions shown in rows 260Y7 and 260Y9 are executed. During the measurement phase at the stage STGPSBG, the diagnosis session listed in row 260Y4 is executed. This diagnosis session includes the diagnosis as to whether or not the analog circuits and the analog/digital converter within the integrated circuit and the referenced voltage generating circuit are together operating in a normal state. Furthermore, the diagnosis sessions shown in rows 260Y7 and 260Y9 are executed during the measurement phase at the stage STGPSBG. The voltage output from the referenced voltage generating circuit assumes a known voltage value, and if the results of voltage value measurement do not indicate a value within a predetermined range, it is determined that an abnormality has occurred at one of the circuits listed above. Under such circumstances, execution of control is judged to be avoided.

(Diagnosis and Measurement: (3) Measurement of Battery Cell Terminal Voltages)

Figure 5:
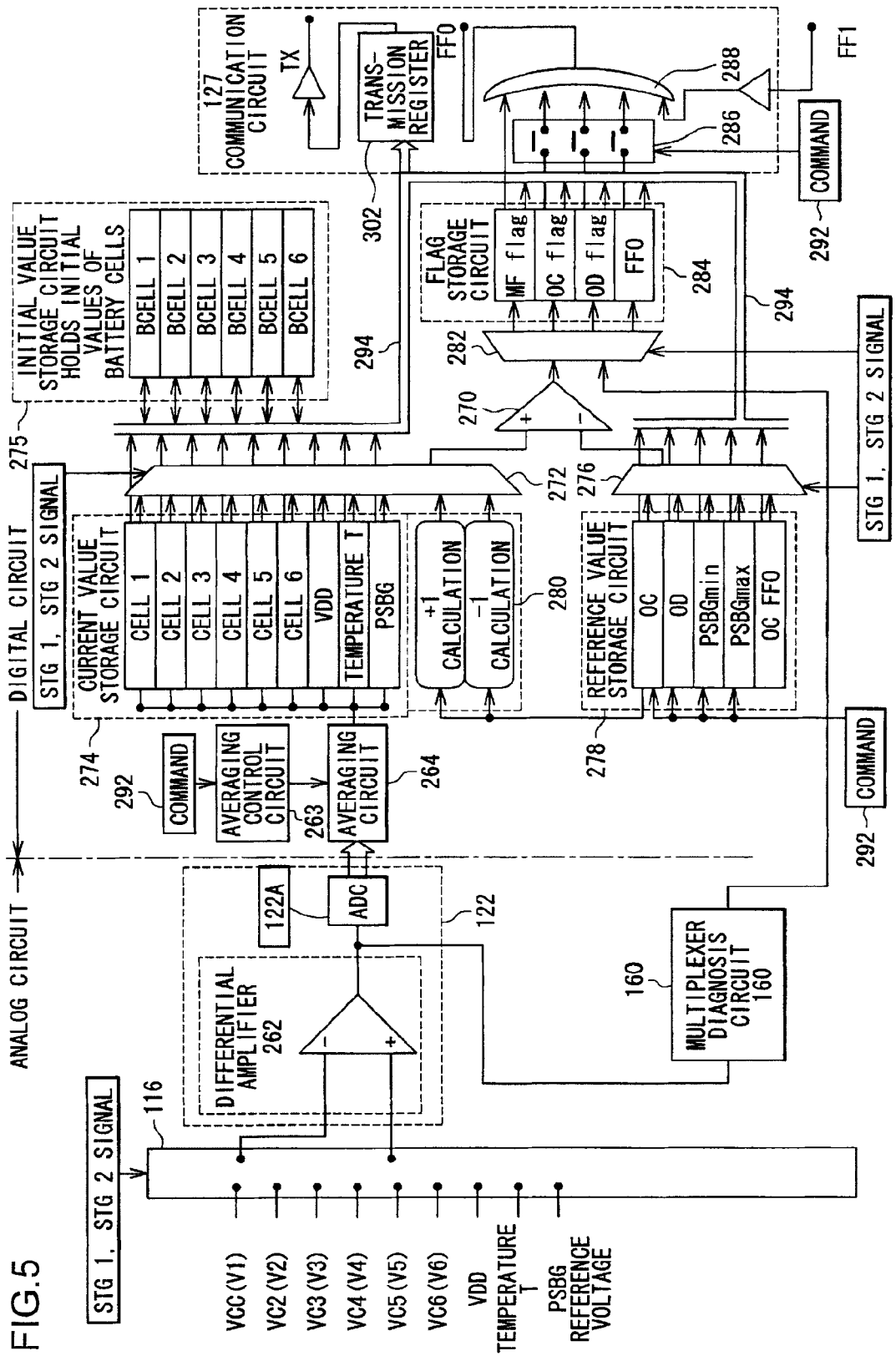
FIG. 5 illustrates a circuit that relates to the diagnosis operation and the measurement operation.

FIG. 5 shows the measurement circuit and the diagnosis circuit. The input circuit 116 is a circuit that functions as a multiplexer and is provided with multiplexers 118 and 120 as described below. The signals STG1 and STG2 are input to the input circuit 116 via the decoders 257 and 259 shown in FIG. 4. Based upon the signals, a selection operation is executed by the multiplexer. In the multiplexer diagnosis (HVMUX), the output signal of a differential amplifier 262 of the voltage detection circuit 122 is taken into a diagnosis circuit 160, executing the diagnosis described below. For example, for measuring the voltage at the battery cell BC1, selecting the terminals V1 and V2 causes the voltage at the battery cell BC1 to be output from the input circuit 116 to the voltage detection circuit 122. A battery cell terminal voltage measurement is now explained.

The voltage detection circuit 122 includes the differential amplifier 262 and the analog/digital converter 122A. It should be noted that since the battery cells BC1~BC4 (or BC1~BC6) are serially connected, the negative potential of each of the terminal voltages is different from each other. The differential amplifier 262 is used to equalize the reference potential (GND potential in each integrated circuit 3A~3N). The output from the differential amplifier 262 is digitized by the analog/digital converter 122A and the digitized output is then output to an averaging circuit 264. The averaging circuit 264 determines the average value of the values indicated in the results of a predetermined number of measurements. The average value thus calculated is held at a register CELL1 in the current value storage circuit 274 as for the battery cell BC1. The averaging circuit 264 calculates the average value of the values obtained through a predetermined number of measurements indicated at an averaging control circuit 263 and the average value output from the averaging circuit is held at the current value storage circuit 274 mentioned earlier. If the averaging control circuit 263 indicates 1, the output from the analog/digital converter 122A is directly held at the register CELL1 in the current value storage circuit 274 without undergoing averaging operation. If, on the other hand, the averaging control circuit 263 indicates 4, the values indicated in the results of the four measurements of the terminal voltage at the battery cell BC1 are averaged and the average value is held at the register CELL1 in the current value storage circuit 274. While four measurements need to be executed initially at the corresponding stages shown in FIG. 4 in order to calculate the average value of the four measurement values, the averaging operation at the averaging circuit 264 can be subsequently executed following each measurement session by using the four measurement values indicated in the most recent measurement results. As explained earlier, the adverse effect of noise can be eliminated via the averaging circuit 264, which calculates the average value of a predetermined number of measurement values. The DC power from the battery unit 9 shown in FIG. 1 is supplied to the inverter where it is converted to AC power. As the DC power is converted to AC power at the inverter, current on/off operation is executed at high speed, generating significant noise. The adverse effect of such noise can be reduced by the averaging circuit 264.

The digital value indicating the terminal voltage at the battery cell BC1, resulting from the digital conversion, is held at the register CELL1 in the current value storage circuit 274. The measurement operation described above is executed during the [STGCV1 measurement] phase shown in FIG. 4. Subsequently, the diagnosis operation is executed based upon the measurement value during the measurement phase at the stage STGCV1. During the diagnosis operation, over-charge diagnosis and over-discharge diagnosis are executed. The digital value indicating the terminal voltage at the battery cell BC1 is held at the register CELL1 in the current value storage circuit 274. Then, a digital multiplexer 272 reads out the terminal voltage at the battery cell BC1 from the register CELL1 in the current value storage circuit 274 and transmits it to a digital comparator 270. In addition, a digital multiplexer 276 reads out an over-charge decision-making reference value OC from the reference value storage circuit 278 and transmits it to the digital comparator 270. The digital comparator 270 compares the terminal voltage at the battery cell BC1 having been read from the register CELL1 with the over-charge decision-making reference value OC and if the terminal voltage at the battery cell BC1 is greater than the over-charge decision-making reference value OC, it sets a flag [MF flag] indicating an abnormality at a flag storage circuit 284. It also sets a flag [OC flag] indicating an over-charge. Occurrence of an actual over-charged state is rare since control is executed so as to prevent such an eventuality. However, the diagnosis is executed repeatedly in order to guarantee a required level of reliability.

Following the over-charge diagnosis, the over-discharge diagnosis is executed. The digital multiplexer 272 reads out the terminal voltage at the battery cell BC1 from the register CELL1 in the current value storage circuit 274 and transmits it to the digital comparator 270. In addition, the digital multiplexer 276 reads out an over-discharge decision-making reference value OD from the reference value storage circuit 278 and transmits it to the digital comparator 270. The digital comparator 270 compares the terminal voltage at the battery cell BC1 having been read from the register CELL1 with the over-discharge decision-making reference value OD and if the terminal voltage at the battery cell BC1 is less than the over-discharge decision-making reference value OD, it sets the flag [MF flag] indicating an abnormality at the flag storage circuit 284. It also sets a flag [OD flag] indicating an over-discharge. As in the case of over-charge diagnosis, the control is executed so as to preempt a situation in which an over-discharged state actually occurs, such an over-discharge hardly ever manifests. However, the diagnosis is executed repeatedly in order to guarantee a required level of reliability.

The explanation provided above relates to the measurement and the diagnosis executed for the battery cell BC1 during the measurement phase at the stage STGCV1 in FIG. 4. Likewise, the input circuit 116 in FIG. 5 selects the terminal voltage at the battery cell BC2 and outputs the selected terminal voltage to the voltage detection circuit 122 at the next stage STGCV2. The terminal voltage is digitized at the voltage detection circuit 122, the average value is calculated at the averaging circuit 264 and the average value is held at the register CELL2 in the current value storage circuit 274. The digital comparator 270 then compares the terminal voltage at the battery cell BC2 read out from the register CELL2 by the digital multiplexer 272 with the over-charge decision-making reference value OC and also the terminal voltage at the battery cell BC2 is compared with the over-discharge decision-making reference value OD. An abnormal state is judged through the comparison of the terminal voltage with the over-charge decision-making reference value OC and the comparison of the terminal voltage with the over-discharge decision-making reference value OD. If it is judged to be an abnormal state, the flag [MF flag] indicating an abnormality is set and the flag [OC flag] or the flag [OD flag] indicating the cause of the abnormality is also set in the flag storage circuit 284.

Subsequently, the terminal voltage at the battery cell BC3 is measured and the over-charge/over-discharge diagnosis is executed for the battery cell BC3 during the measurement phase at the stage STGCV3 in FIG. 4. The terminal voltage at the battery cell BC4 is measured and the over-charge/over-discharge diagnosis is executed for the battery cell BC4 during the measurement phase at the stage STGCV4 in FIG. 4.

(Diagnosis and Measurement: (4) Diagnosis)

The following is an explanation for the multiplexer diagnosis shown in row 260Y6 from among the diagnosis sessions to be executed during the RES phase at each of the stages shown in FIG. 4.

First Embodiment

Figure 33:
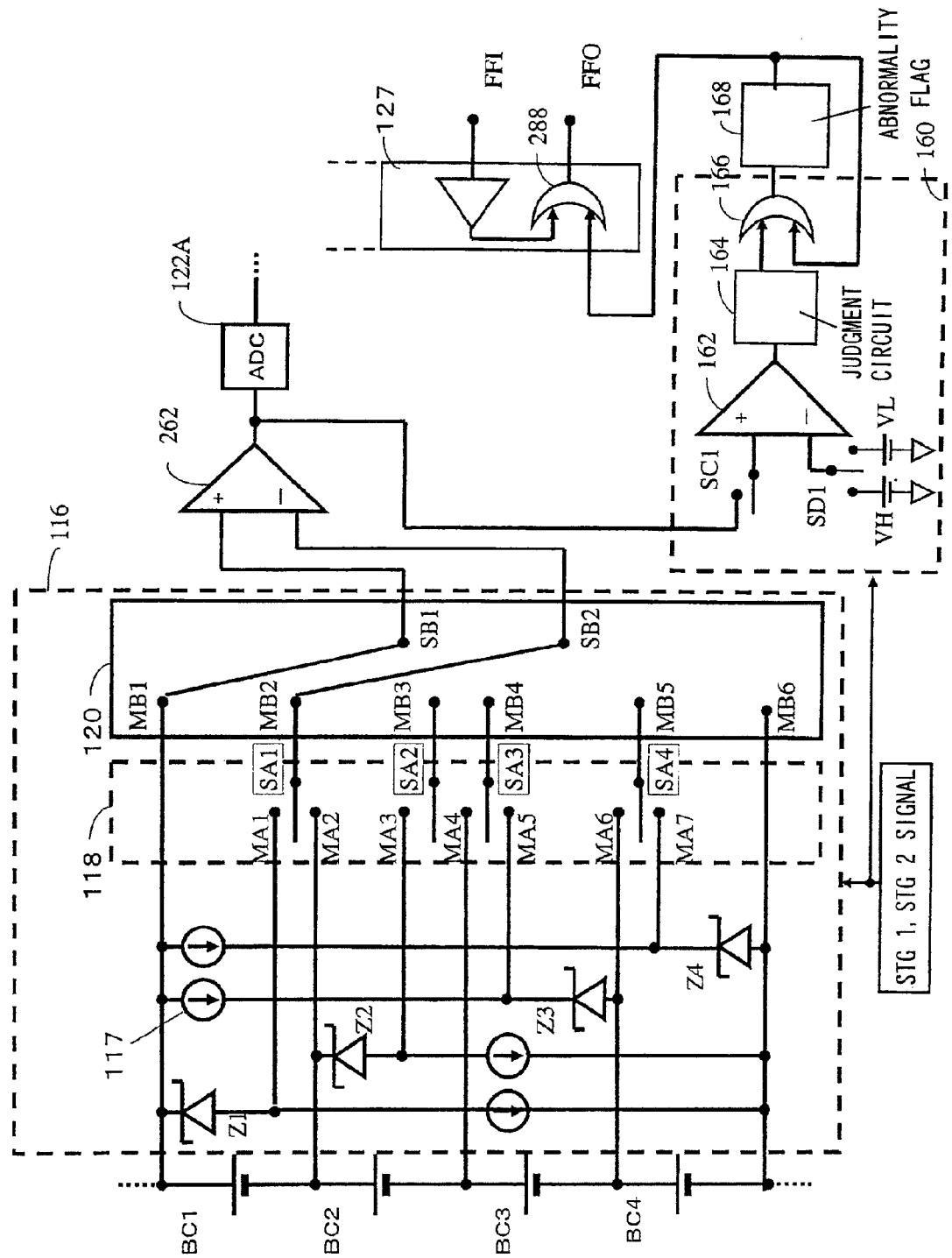
FIG. 33 is a diagram showing the multiplexer diagnosis achieved in the first embodiment.
Figure 34:
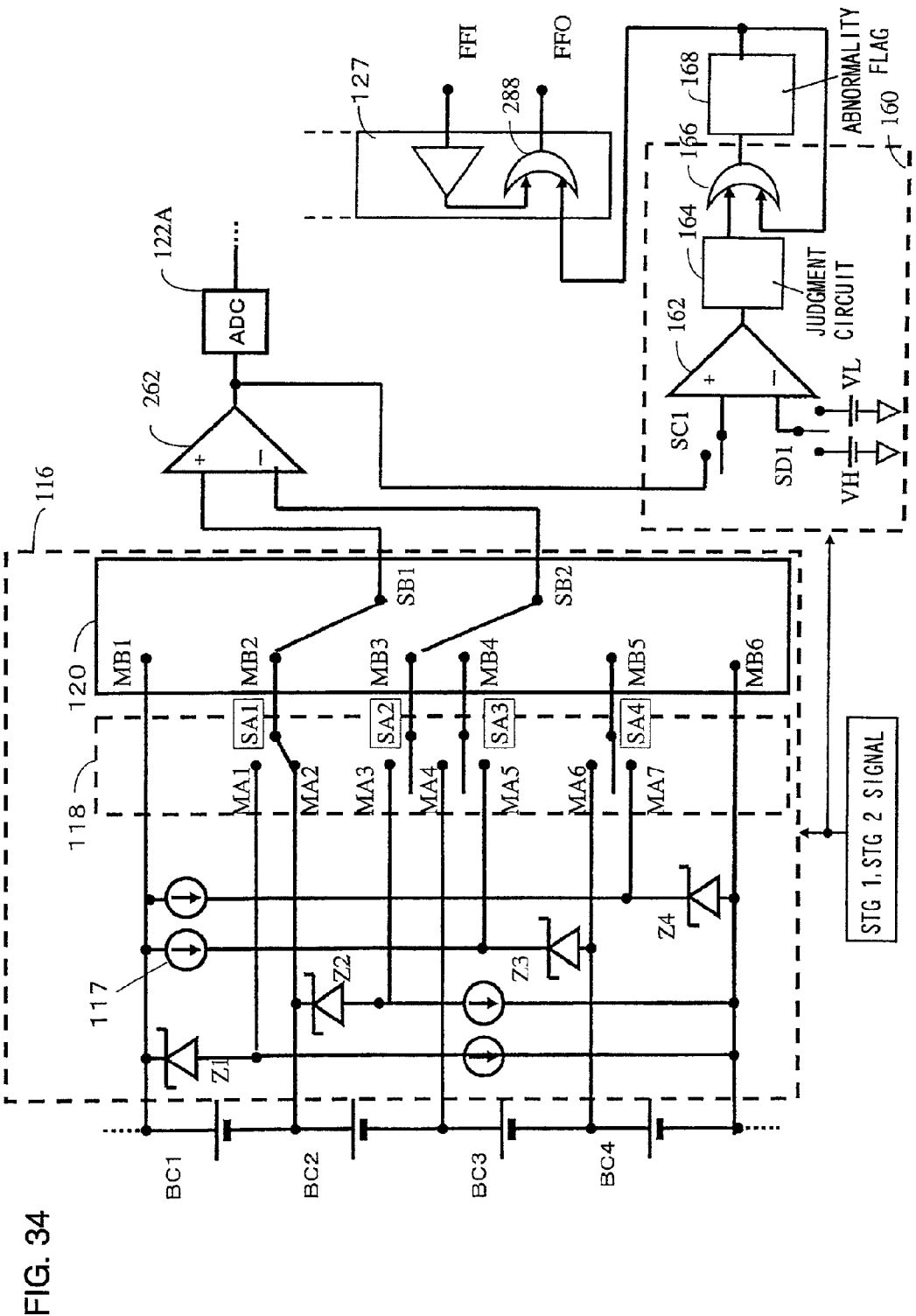
FIG. 34 is a diagram showing an operation that may be executed during RES phase of the stage STGCV2.

A first embodiment of a multiplexer diagnosis operation will now be described in reference to FIGS. 6, 33, and 34. FIG. 33 shows a circuit that relates to the multiplexer diagnosis from among the circuits shown in FIG. 5. The input circuit 116 is an internal logic of the integrated circuits 3A~3N shown in FIG. 1 and is provided with the multiplexers 118 and 120. Z1~Z4 are devices or circuits that generate a given constant voltage. Zener diodes are used herein. Each of the Zener diodes Z1~Z4 generates the constant voltage Vz at both ends by the current flowing through a constant current circuit 117. The Zener voltage Vz at each of the Zener diodes Z1~Z4 is equally set.

The diagnosis circuit 160 is provided with a voltage comparator circuit 162, a judgment circuit 164, an OR circuit 166, and voltage sources VH and VL. The signals STG1 and STG2 are input to the input circuit 116 and the diagnosis circuit 160. Operations of switches (described later) provided in the input circuit 116 and the diagnosis circuit 160 are executed according to instructions by the signals STG1 and STG2. It is to be noted that FIG. 33 shows the state of a multiplexer 120 at the stage STGCV1.

As row 260Y6 of FIG. 4 shows, the diagnosis for the multiplexer 120 is executed at all the periods (RES phases and measurement phases) of the stage STGCal~the stage STGPSBG. Each of the periods at the stages STGCV1~STGCV4 will now be described as a representative example. In the measurement phase at each of the stages STGCV1~STGCV4, the measurement of the terminal voltages at the battery cells is executed after the multiplexer 120 is assured through a diagnosis to operate in the normal state. The measurements during the measurement phases at the stage STGCal, the stage STGVDD~the stage STGPSBG are executed similarly: measurement is executed after the multiplexer 120 is assured to operate in the normal state.

FIG. 6 presents the operations at the stage STGCV1~the stage STGCV4, progressing from the left-hand side stage to the right-hand side stage in the table as time progresses. The input circuit 116 and the diagnosis circuit 160 are instructed by the STG1 and STG2 signals to execute the switch connecting operation as shown. The stage STGCV1 will now be explained. As for the multiplexer 120, a switch SB1 is connected to a contact point MB1 and a switch SB2 is connected to a contact point MB2 during both of the RES phase and the measurement phase at the stage STGCV1. As for the multiplexer 118, on the other hand, a switch SA1 is connected to a contact point MA1 during the RES phase, and the switch SA1 is connected to a contact point MA2 during the measurement phase. Other switches SA2~SA4 of the multiplexer 118 are in an open state during any of the phases.

The multiplexer diagnosis operation will now be described in reference to FIGS. 33 and 34. When the switch SA1 is connected to the contact point MA1 during the RES phase of the stage STGCV1, the Zener voltage Vz of the Zener diode Z1 is input to the multiplexer 120. The then output voltage from the multiplexer 120 is input to the voltage comparator circuit 162 via the differential amplifier 262. Since the battery cells BC1~BC4 (or BC1~BC6) are serially connected, the negative potential of each of the terminal voltages is different from each other. Therefore, as described above, the differential amplifier 262 is used to equalize the reference potential (GND potential in each of the integrated circuits 3A~3N).

A switch SC1 of the voltage comparator circuit 162 is set in a continuous state during the [STGCV1 RES] phase, in which the multiplexer diagnosis is executed. A switch SD1 is connected to the voltage source VH for comparing the higher limit so as to verify whether or not the output voltage Vm from the multiplexer 120 equals to the Zener voltage Vz that has been input, i.e., whether or not the multiplexer 120 works normally. The voltage $V_H$ generated by the voltage source VH is set to be higher than the Zener voltage Vz (known voltage) described above. If, based upon the output of the voltage comparator circuit 162, the relationship Vm>$V_H$ is held, i.e., if the output voltage Vm is not equal to the Zener voltage Vz that has been input, the judgment circuit 164 judges that the state of switch connection of the multiplexer 120 is not normal and outputs an abnormality signal.

Then, the switch SD1 is connected to the voltage source VL for comparing the lower limit. The voltage $V_L$ generated by the voltage source VL is set to be lower than the Zener voltage Vz (known voltage). If, based upon the output of the voltage comparator circuit 162, the relationship Vm<$V_L$ is held, i.e., if the output voltage Vm is not equal to the Zener voltage Vz that has been input, the judgment circuit 164 outputs an abnormality signal. Here, the output from the differential amplifier 262 is input to the voltage comparator circuit 162 so as to judge whether or not an abnormality has occurred. Therefore, the judgment circuit 164 can detect an abnormality not only when an abnormality has occurred in the multiplexer 120 but also when it has occurred in the multiplexer 118 or in the differential amplifier 262.

The OR circuit 166 of the diagnosis circuit 160 outputs an abnormality signal to an abnormality flag storage circuit 168 when an abnormality signal from the judgment circuit 164 is input to the OR circuit 166. Accordingly, an abnormality flag is set at the abnormality flag storage circuit 168. The abnormality flag storage circuit 168 is the same as the MF flag register at the flag storage circuit 284 shown in FIG. 5. When an abnormality flag is set, the abnormality flag storage circuit 168 outputs an abnormality signal to the OR circuit 166 and the OR circuit 288 of the communication circuit 127. Thus, when an abnormality flag is held at the abnormality flag storage circuit 168, an abnormality signal is output from the OR circuit 166 even if a normality signal has been output from the judgment circuit 164.

It is to be noted that the abnormality flag that has been set at the abnormality flag storage circuit 168 can be reset by a command transmitted via the communication circuit 127. (A detailed circuit is not figured herein.)

When an abnormality flag is held at the abnormality flag storage circuit 168, an abnormality signal is constantly output to the OR circuit 288. Signals from other integrated circuits are input to the OR circuit 288 via an input terminal FFI. The OR circuit 288 outputs an abnormality signal via an output terminal FFO either when an abnormality signal is input to the OR circuit 288 from one of the other integrated circuits via the input terminal FFI or when an abnormality signal is input to the OR circuit 288 from the abnormality flag storage circuit 168. In other words, the OR circuit 288 outputs a signal indicating a normality via an output terminal FFO only when the signal indicating a normality is input via the input terminal FFI and when an abnormality flag is not held at the abnormality flag storage circuit 168.

During the [STGCV1 measurement] phase, to which the operation progresses from the [STGCV1 RES] phase based upon the STG1 and STG2 signals, as the operation diagram of FIG. 6 shows, the terminal voltage at the battery cell BC1 is measured with the switches SC1 and SD1 of the diagnosis circuit 160 in an open state as well as with the switch SA1 of the multiplexer 118 connected to the contact point MA2. At this time, the judgment circuit 164 is in a non-operating state and any normality/abnormality signal is not output from the judgment circuit 164 to the OR circuit 166. The terminal voltage measurement at the battery cell BC1 is assured since terminal voltage is measured through switching the switch SA1 of the multiplexer 118 while sustaining the state of the switch of the multiplexer 120 that is diagnosed to be normal through the multiplexer diagnosis. The terminal voltage measurement will be described in detail below.

Upon completion of the [STGCV1 measurement] phase, the operation progresses to the RES phase of the stage STGCV2. At the stage STGCV2, as FIG. 34 shows, the switch SB1 is connected to the contact point MB2 and the switch SB2 is connected to the contact point MB3. As FIG. 6 shows, this state of the switches remains throughout both the RES phase and the measurement phase. On the other hand, as for the multiplexer 118, the switch SA1 is connected to the contact point MA2 and the switch SA2 is connected to the contact point MA3 during the RES phase, while the switch SA1 is connected to the contact point MA2 and the switch SA2 is connected to the contact point MA4 during the measurement phase. The other switches SA3 and SA4 of the multiplexer 118 are in an open state in any of the periods.

The switch SC1 of the voltage comparator circuit 162 is set in a continuous state during the [STGCV2 RES] phase, in which the multiplexer diagnosis is executed. The switch SD1 is connected to the voltage source VH (voltage $V_H$) for comparing the higher limit as to verify whether or not the output voltage Vm from the multiplexer 120 equals to the Zener voltage Vz that has been input, i.e., whether or not the multiplexer 120 works normally. As mentioned above, the voltage $V_H$ is set to be higher than the Zener voltage Vz (known voltage) described above. If, based upon the output of the voltage comparator circuit 162, the relationship $Vm > V_H$ is held, the judgment circuit 164 outputs an abnormality signal.

Next, the switch SD1 is connected to the voltage source VL (voltage $V_L$) for comparing the lower limit. The voltage VL that is set to be lower than the Zener voltage Vz (known voltage) is input to the voltage comparator circuit 162. If, based upon the output of the voltage comparator circuit 162, the relationship $Vm < V_L$ is held, the judgment circuit 164 outputs an abnormality signal. The processing to be executed after the output of the abnormality signal from the voltage comparator circuit 162 is the same as that during the RES phase of the stage STGCV1 described above. Therefore, descriptions on it will now be omitted.

Upon completion of the [STGCV2 RES] phase, the operation progresses to the [STGCV2 measurement] phase, in which, as the operation diagram of FIG. 6 shows, the terminal voltage at the battery cell BC2 is measured with the switches SC1 and SD1 of the diagnosis circuit 160 in an open state as well as with the switch SA2 of the multiplexer 118 connected to the contact point MA4. For the terminal voltage measurement during the [STGCV2 measurement] phase as well, the terminal voltage measurement at the battery cell BC2 is assured since terminal voltage is measured via switching the switch SA2 of the multiplexer 118 while sustaining the state of the switch of the multiplexer 120 that is diagnosed to be normal through the multiplexer diagnosis.

At the stage STGCV3, as FIG. 6 shows, the switch SB1 is connected to the contact point MB4 and the switch SB2 is connected to the contact point MB5 throughout both the RES phase and the measurement phase. On the other hand, as for the multiplexer 118, the switch SA3 is connected to the contact point MA5 and the switch SA4 is connected to the contact point MA6 during the RES phase, while the switch SA3 is connected to the contact point MA4 and the switch SA4 is connected to the contact point MA6 during the measurement phase. The other switches SA1 and SA2 of the multiplexer 118 are in an open state in any of the periods. The diagnosis for the multiplexer 120 during the [STGCV3 RES] phase is executed similarly to that during the [STGCV2 RES] phase mentioned above. Upon completion of the [STGCV3 RES] phase, the terminal voltage at the battery cell BC3 is measured during the [STGCV3 measurement] phase.

At the stage STGCV4, as FIG. 6 shows, the switch SB1 is connected to the contact point MB5 and the switch SB2 is connected to the contact point MB6 throughout both the RES phase and the measurement phase. On the other hand, as for the multiplexer 118, the switch SA4 is connected to the contact point MA7 during the RES phase, while the switch SA4 is connected to the contact point MA6 during the measurement phase. The other switches SA1~SA3 of the multiplexer 118 are in an open state in any of the periods. The same operations as those during the stage STGCV1~the stage STGCV3 are executed on the switches SC1 and SD1 so as to diagnose the multiplexer 120 and measure the terminal voltage at the battery cell BC4.

During both of the stages STGCV3 and the STGCV4 as well, the terminal voltage measurement at the battery cells BC3 and BC4 is assured since terminal voltage is measured via switching the switches of the multiplexer 118 while sustaining the state of the switch of the multiplexer 120 that is diagnosed to be normal through the multiplexer diagnosis.

Second Embodiment

Figure 35:
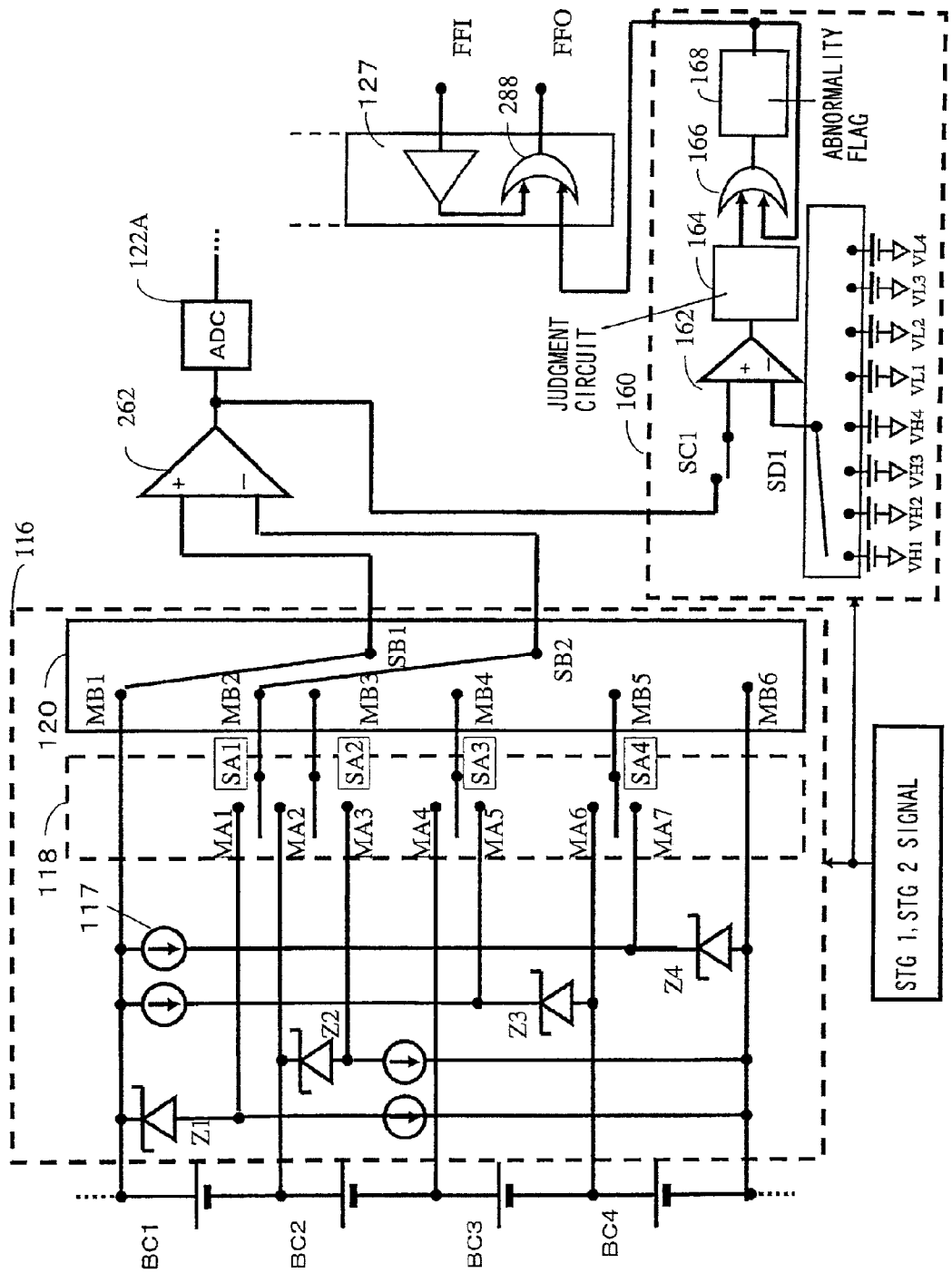
FIG. 35 is a diagram showing a circuit that relates to the multiplexer diagnosis achieved in the second embodiment.

FIG. 35 shows a second embodiment of the multiplexer diagnosis operation. In the second embodiment, the Zener voltages Vz1~Vz4 at the Zener diodes Z1~Z4 provided in the input circuit 116 are all set to values different from each other. The diagnosis circuit 160 is provided with the voltage sources VH1~VH4 and VL1~VL4, corresponding to each Zener diodes Z1~Z4. The rest of the structure is the same as that in the circuits shown in FIGS. 33~35.

The state of connection of the multiplexers 118 and 120 and the switch SC1 is identical to that shown in FIG. 6 for each of the phases in the multiplexer diagnosis operation. On the other hand, the state of connection of the switch SD1, with which the voltage source for comparison is selected, is different from that shown in FIG. 6 as described below. During the [STGCV1 RES] phase shown in FIG. 4, the diagnosis circuit 160 connects the switch SD1 to the voltage source VH1 for comparing the higher limit, which is corresponding to the Zener diode Z1, based upon the STG1 and STG2 signals that have been input. Accordingly, the voltage $V_{H1}$ from the voltage source VH1 and the output Vm from the multiplexer 120 that is input via the differential amplifier 262 are input to the comparator circuit 162. The judgment circuit 164 judges, based upon the output of the comparator circuit 162, whether or not the multiplexer 120 is working normally. The voltage $V_{H1}$ is set to be higher than the Zener voltage Vz1, which is generated by the Zener diode Z1. If Vm>$V_{H1}$, i.e., if the output Vm is not equal to the Zener voltage Vz1, the judgment circuit 164 judges the state of switch connection of the multiplexer 120 to be not normal and outputs an abnormality signal.

Next, the switch SD1 is connected to the voltage source VL1 for comparing the lower limit, which is corresponding to the Zener diode Z1. The voltage $V_{L1}$ from the voltage source VL1 is set to be lower than the Zener voltage Vz1 from the Zener diode Z1. If Vm<$V_{L1}$, i.e., if the output Vm is not equal to the Zener voltage Vz1, the judgment circuit 164 judges the state of switch connection of the multiplexer 120 to be not normal and outputs an abnormality signal. The processing to be executed after the output of the abnormality signal from the voltage comparator circuit 162 (the processing to be executed after the OR circuit 166) is similar to that in the first embodiment described above. Therefore, descriptions on it will now be omitted.

Upon completion of the [STGCV1 RES] phase, the operation progresses to the [STGCV1 measurement] phase based upon the STG1 and STG2 signals. The switch operation during the [STGCV1 measurement] phase is identical to that shown in FIG. 6. The switch SA1 of the multiplexer 118 is connected to the contact point MA2 and the switches SC1 and SD1 of the diagnosis circuit 160 are in an open state. Accordingly, the terminal voltage at the battery cell BC1 is input to the differential amplifier 262.

During the [STGCV2 RES] phase, as FIG. 6 shows, open/close of the switches SA1, SA2, SB1, SB2, and SC1 of the multiplexers 118 and 120 is controlled. The switch SD1 is connected to the voltage source VH2 for comparing the higher limit, which is corresponding to the Zener diode Z2, so as to compare the voltage $V_{H2}$ from the voltage source VH2 with the output Vm from the multiplexer 120 that is input via the differential amplifier 262. The voltage $V_{H2}$ is set to be higher than the Zener voltage Vz2 generated by the Zener diode Z2. If Vm>$V_{H2}$, i.e., if the output Vm is not equal to the Zener voltage Vz2, the judgment circuit 164 outputs an abnormality signal. Next, the switch SD1 is connected to the voltage source VL2 for comparing the lower limit, which is corresponding to the Zener diode Z2. The voltage $V_{L2}$ from the voltage $V_{L2}$ is set to be lower than the Zener voltage Vz2 from the Zener diode Z2. If Vm<$V_{L2}$, i.e., if the output Vm is not equal to the Zener voltage Vz2, the judgment circuit 164 outputs an abnormality signal. The processing to be executed after the output of the abnormality signal from the voltage comparator circuit 162 (the processing to be executed after the OR circuit 166) is similar to that in the first embodiment described above. Therefore, descriptions on it will now be omitted.

Upon completion of the [STGCV2 RES] phase, the operation progresses to the [STGCV2 measurement] phase based upon the STG1 and STG2 signals. The switch operation during the [STGCV2 measurement] phase is identical to that shown in FIG. 6. The switches SA1 and SA2 of the multiplexer 118 are connected to the contact points MA2 and MA4 respectively, and the switches SC1 and SD1 of the diagnosis circuit 160 are in an open state. Accordingly, the terminal voltage at the battery cell BC2 is input to the differential amplifier 262.

During the [STGCV3 RES] phase, as FIG. 6 shows, open/close of the switches SA1, SA2, SB1, SB2, and SC1 of the multiplexers 118 and 120 is controlled. The switch SD1 is connected to the voltage source VH3 for comparing the higher limit, which is corresponding to the Zener diode Z3, so as to compare the voltage $V_{H3}$ from the voltage source VH3 with the output Vm from the multiplexer 120 that is input via the differential amplifier 262. The voltage $V_{H3}$ is set to be higher than the Zener voltage Vz3 generated by the Zener diode Z3. If Vm>$V_{H3}$, i.e., if the output Vm is not equal to the Zener voltage Vz3, the judgment circuit 164 outputs an abnormality signal. Next, the switch SD1 is connected to the voltage source VL3 for comparing the lower limit, which is corresponding to the Zener diode Z3. The voltage $V_{L3}$ from the voltage source VL3 is set to be lower than the Zener voltage Vz3 from the Zener diode Z3. If Vm<$V_{L3}$, i.e., if the output Vm is not equal to the Zener voltage Vz3, the judgment circuit 164 outputs an abnormality signal. The processing to be executed after the output of the abnormality signal from the voltage comparator circuit 162 (the processing to be executed after the OR circuit 166) is similar to that in the first embodiment described above. Therefore, descriptions on it will now be omitted.

Upon completion of the [STGCV3 RES] phase, the operation progresses to the [STGCV3 measurement] phase based upon the STG1 and STG2 signals. The switch operation during the [STGCV3 measurement] phase is identical to that shown in FIG. 6. The switches SA3 and SA4 of the multiplexer 118 are connected to the contact points MA5 and MA6 respectively, and the switches SC1 and SD1 of the diagnosis circuit 160 are in an open state. Accordingly, the terminal voltage at the battery cell BC3 is input to the differential amplifier 262.

During the [STGCV4 RES] phase, as FIG. 6 shows, open/close of the switches SA1, SA2, SB1, SB2, and SC1 of the multiplexers 118 and 120 is controlled. The switch SD1 is connected to the voltage source VH4 for comparing the higher limit, which is corresponding to the Zener diode Z4, so as to compare the voltage $V_{H4}$ from the voltage source VH4 with the output Vm from the multiplexer 120 that is input via the differential amplifier 262. The voltage $V_{H4}$ is set to be higher than the Zener voltage Vz4 generated by the Zener diode Z4. If Vm>$V_{H4}$, i.e., if the output Vm is not equal to the Zener voltage Vz4, the judgment circuit 164 outputs an abnormality signal. Next, the switch SD1 is connected to the voltage source VL4 for comparing the lower limit, which is corresponding to the Zener diode Z4. The voltage $V_{L4}$ from the voltage source VL4 is set to be lower than the Zener voltage Vz4 from the Zener diode Z4. If Vm<$V_{L4}$, i.e., if the output Vm is not equal to the Zener voltage Vz4, the judgment circuit 164 outputs an abnormality signal. The processing to be executed after the output of the abnormality signal from the voltage comparator circuit 162 (the processing to be executed after the OR circuit 166) is similar to that in the first embodiment described above. Therefore, descriptions on it will now be omitted.

Upon completion of the [STGCV4 RES] phase, the operation progresses to the [STGCV4 measurement] phase based upon the STG1 and STG2 signals. The switch operation during the [STGCV4 measurement] phase is identical to that shown in FIG. 6. The switch SA4 of the multiplexer 118 is connected to the contact point MA6, and the switches SC1 and SD1 of the diagnosis circuit 160 are in an open state. Accordingly, the terminal voltage at the battery cell BC4 is input to the differential amplifier 262.

In the second embodiment, the constant voltages Vz1~Vz4 generated by the Zener diodes Z1~Z4 are set to values different from each other according to the state of connection of the switches SB1 and SB2 of the multiplexer 120. This improves the accuracy of the multiplexer diagnosis. For example, assuming that during the [STGCV2 RES] phase in the first embodiment, the state of switch connection of the multiplexer 120 is not that shown in FIG. 34 but that with the switch SB1 connected to the contact point MB1 and with the switch SB2 connected to the contact point MB2. Even in that case, the judgment circuit 164 still judges the output Vm from the multiplexer 120 to be equal to the Zener voltage Vz, and results in not outputting the abnormality signal but outputting the signal indicating a normality.

In the second embodiment, however, the Zener voltage differs according to the state of switch connection of the multiplexer 120 (i.e., the state of selection of the battery cell) instructed by the STG1 and STG2 signals. Therefore, as assumed above, if the state of switch connection of the multiplexer 120 is not corresponding to the voltage source to which the switch SD1 is connected, the judgment circuit 164 outputs an abnormality signal, ensuring the multiplexer diagnosis.

Third Embodiment

A third embodiment of the multiplexer diagnosis operation will now be described in reference to FIGS. 36~38. FIG. 37 shows a circuit that relates to the multiplexer diagnosis from among the circuits shown in FIG. 5. The input circuit 116 is provided with the multiplexer 120, the constant current circuit 117, resistors R, and switches S1~S4. Output terminals MP1 and MP2 of the multiplexer 120 are connected to the input terminals of the differential amplifier 262. A serial circuit including the constant current circuit 117, the resistor R, and the switch S1 is connected between the output terminal MP1 of the multiplexer 120 and a power supply line. A serial circuit including the switch S2, the resistor R, and the constant current circuit 117 is connected between the output terminal MP1 and a ground (reference potential) of the integrated circuits. Likewise, a serial circuit including the constant current circuit 117, the resistor R, and the switch S3 is connected between the output terminal MP2 and a power supply line; and a serial circuit including the switch S4, the resistor R, and the constant current circuit 117 is connected between the output terminal MP2 and a ground (reference potential) of the integrated circuits. The multiplexer 120 is provided with the switches SB1 and SB2 to select the battery cells BC1~BC4. The switches SB1 and SB2 achieved in the present embodiment are each constituted with five switches as shown in FIG. 37. The positive pole sides of the battery cells BC1~BC4 are selected through open/close of the five switches provided in the switch SB1, while the negative pole sides of the battery cells BC1~BC4 are selected through open/close of the five switches provided in the switch SB2. The circuit structure other than the input circuit 116 is the same as that shown in FIG. 34 in the first embodiment.

The diagnosis operation of the multiplexer 120 will now be described in reference to FIG. 36, an operation diagram achieved in the third embodiment. FIG. 36 shows a part of the operation corresponds to the stage STGCV3 in the operation diagram shown in FIG. 6, representing open/close operation of the switches S1~S4 during the stage STGCV3. The open operation diagnosis of the multiplexer 120 is executed during the first time segment of the [STGCV3 RES] phase. The selection operation diagnosis of the multiplexer 120 is executed during the second time segment of the [STGCV3 RES] phase. The multiplexer diagnosis operation during the stage STGCV3 will now be described as a representative example. The multiplexer diagnosis operation during the RES phase of other stages assumes the same.

During the first time segment of the [STGCV3 RES] phase, the open operation diagnosis of the switch SB1, which is provided in the multiplexer 120, is executed, and that of the other switch SB2 is executed thereafter. In the open operation diagnosis of the switch SB1, the STG1 and STG2 signals transmit an instruction to the input circuit 116 so that all the switches provided in the switches SB1 and SB2 of the multiplexer 120 are in an open state, so that the switches S2~S4 provided in the input circuit 116 are in an open state, and so that the switch S1 is in a closed state. In addition, the STG1 and STG2 signals transmit an instruction to the diagnosis circuit 160 so as to connect the switch SC1 to the contact point MD2 and so as to connect the switch SD1 to the voltage source VH.

When the switch S1 is in a closed state, the upper input terminal (non-inverting input terminal) of the comparator circuit 162 is connected to the high potential-side power source via the constant current circuit 117 and the resistor R. The lower input terminal (inverting input terminal) of the comparator circuit 162, on the other hand, is connected to the voltage source VH of the voltage $V_H$. The voltage $V_H$ is set to be either the maximum voltage of the lithium ion battery cell group to which the integrated circuits are connected, i.e., four or six lithium ion battery cells or somewhat lower than the maximum voltage. Therefore, if the switch SB1 of the multiplexer 120 is in an open state, the measurement voltage to be input through the upper terminal of the comparator circuit 162 is supposed to meet the normality judgment condition "measurement voltage>$V_H$". The judgment circuit 164 judges whether or not the condition "measurement voltage>$V_H$" is met based upon the output from the comparator circuit 162. Unless the condition "measurement voltage>$V_H$" is met, the judgment circuit 164 outputs an abnormality signal to the OR circuit 166. The processing to be executed after the OR circuit 166 will not be described now since it is similar to the processing in the first embodiment described above.

It is to be noted that in the present embodiment, the same potential is assumed in the voltage of the power supply line to which the constant current circuit 117 is connected and in the positive-pole terminal of the battery cell BC1. Accordingly, diagnosis through the switches S1 or S3 can not be executed if the positive-pole terminal of the battery cell BC1 is selected. On the other hand, the ground potential and the negative potential of the battery cell BC4 equal to each other. Therefore, diagnosis through the switches S2 or S4 can not be executed if the negative-pole terminal of the battery cell BC4 is selected. However, diagnosis can be executed if another terminal is selected, assuring higher reliability.

Next, the STG1 and STG2 signals transmit an instruction to the input circuit 116 so that all the switches provided in the switches SB1 and SB2 of the multiplexer 120 are in an open state, so that the switches S1, S3, and S4 provided in the input circuit 116 are in an open state, and so that the switch S2 is in a closed state. In addition, the STG1 and STG2 signals transmit an instruction to the diagnosis circuit 160 so as to connect the switch SC1 to the contact point MD2 and so as to connect the switch SD1 to the voltage source VL.

When the switch S2 is in a closed state, the potential at the upper input terminal of the comparator circuit 162 equals to that at the GND of the integrated circuits. The lower input terminal of the comparator circuit 162, on the other hand, is connected to the voltage source VL of the voltage $V_L$. The voltage $V_L$ is set to be about 0.5V (slightly higher than ground voltage of the integrated circuits and sufficiently lower than terminal voltages of the lithium ion battery cells). Therefore, if the switch SB1 of the multiplexer 120 is in an open state, the measurement voltage to be input through the upper terminal of the comparator circuit 162 is supposed to meet the normality judgment condition "measurement voltage<$V_L$". The judgment circuit 164 judges whether or not the condition "measurement voltage<$V_L$" is met based upon the output from the comparator circuit 162. Unless the condition "measurement voltage<$V_L$" is met, the judgment circuit 164 outputs an abnormality signal to the OR circuit 166. The processing to be executed after the OR circuit 166 will not be described now since it is similar to the processing in the first embodiment described above. The open operation diagnosis for the switch SB1 enables a diagnosis whether or not the switch SB1 of the multiplexer 120 is in an open state as per the instruction.

Next, the open operation diagnosis for the switch SB2 of the multiplexer 120 is executed. At this time, the STG1 and STG2 signals transmit an instruction to the input circuit 116 so that all the switches provided in the switches SB1 and SB2 of the multiplexer 120 are in an open state, so that the switches S1, S2, and S4 provided in the input circuit 116 are in an open state, and so that the switch S3 is in a closed state. In addition, the STG1 and STG2 signals transmit an instruction to the diagnosis circuit 160 so as to connect the switch SC1 to the contact point MD1 and so as to connect the switch SD1 to the voltage source VH.

When the switch S3 is in a closed state, the potential at the upper input terminal of the comparator circuit 162 is connected to the high potential-side power source via the constant current circuit 117 and the resistor R. The lower input terminal of the comparator circuit 162, on the other hand, is connected to the voltage source VH of the voltage $V_H$. Therefore, if the switch SB2 of the multiplexer 120 is in an open state, the measurement voltage to be input through the upper terminal of the comparator circuit 162 is supposed to meet the normality judgment condition "measurement voltage>$V_H$". The judgment circuit 164 judges whether or not the condition "measurement voltage>$V_H$" is met based upon the output from the comparator circuit 162. Unless the condition "measurement voltage>$V_H$" is met, the judgment circuit 164 outputs an abnormality signal to the OR circuit 166. The processing to be executed after the OR circuit 166 will not be described now since it is similar to the processing in the first embodiment described above.

Next, the STG1 and STG2 signals transmit an instruction to the input circuit 116 so that all the switches provided in the switches SB1 and SB2 of the multiplexer 120 are in an open state, so that the switches S1~S3 provided in the input circuit 116 are in an open state, and so that the switch S4 is in a closed state. In addition, the STG1 and STG2 signals transmit an instruction to the diagnosis circuit 160 so as to connect the switch SC1 to the contact point MD1 and so as to connect the switch SD1 to the voltage source VL.

When the switch S4 is in a closed state, the potential at the upper input terminal of the comparator circuit 162 equals to that at the GND of the integrated circuits. The lower input terminal of the comparator circuit 162, on the other hand, is connected to the voltage source $V_L$ of the voltage $V_L$. Therefore, if the switch SB2 of the multiplexer 120 is in an open state, the measurement voltage to be input through the upper terminal of the comparator circuit 162 is supposed to meet the normality judgment condition "measurement voltage<$V_L$". The judgment circuit 164 judges whether or not the condition "measurement voltage<$V_L$" is met based upon the output from the comparator circuit 162. Unless the condition "measurement voltage<$V_L$" is met, the judgment circuit 164 outputs an abnormality signal to the OR circuit 166. The processing to be executed after the OR circuit 166 will not be described now since it is similar to the processing in the first embodiment described above. The open operation diagnosis of the switch SB2 enables a diagnosis whether or not the switch SB2 of the multiplexer 120 is in an open state as per the instruction.

Figure 36:
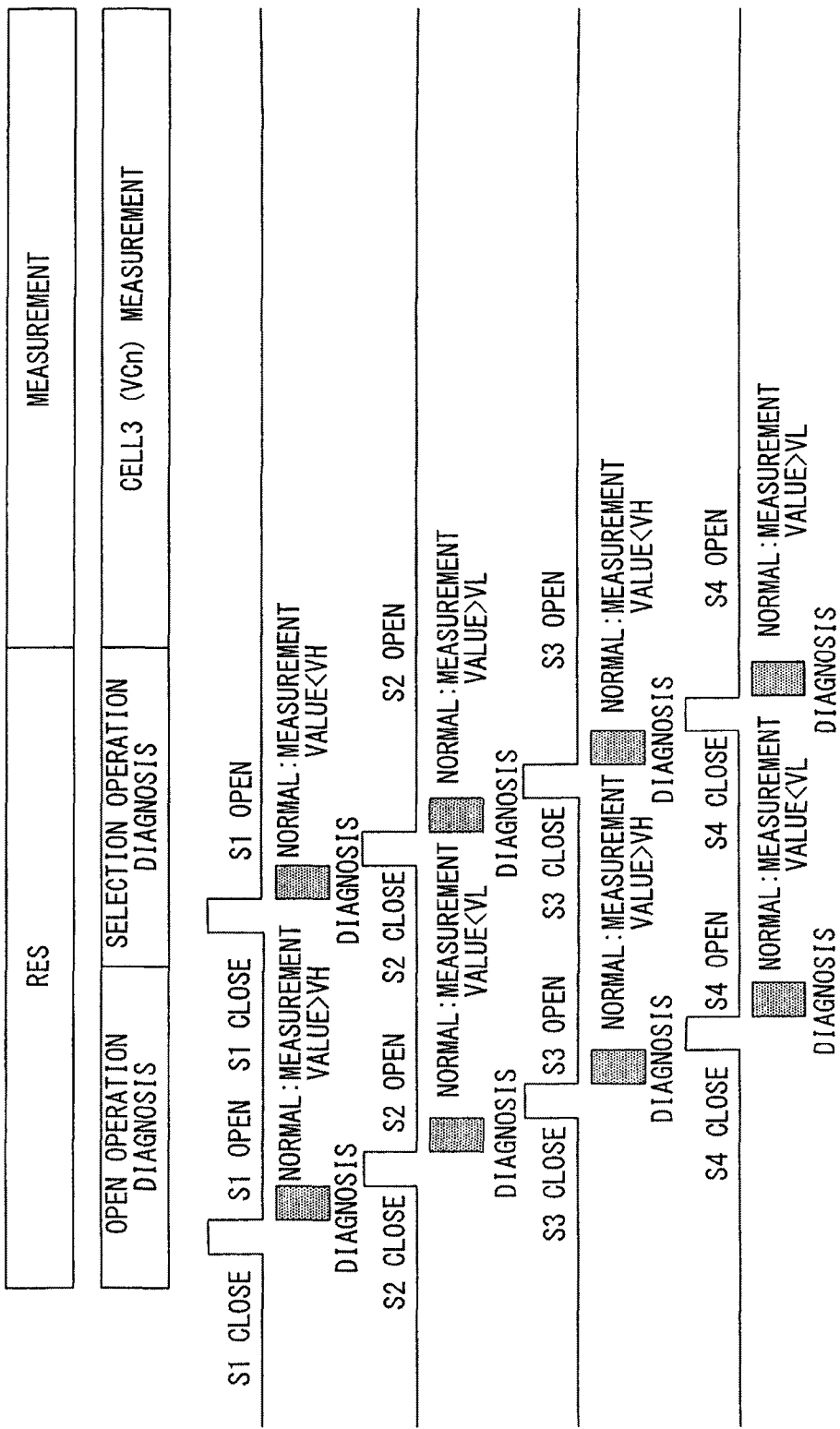
FIG. 36 is an operation diagram illustrating the multiplexer diagnosis achieved in the second embodiment.
Figure 37:
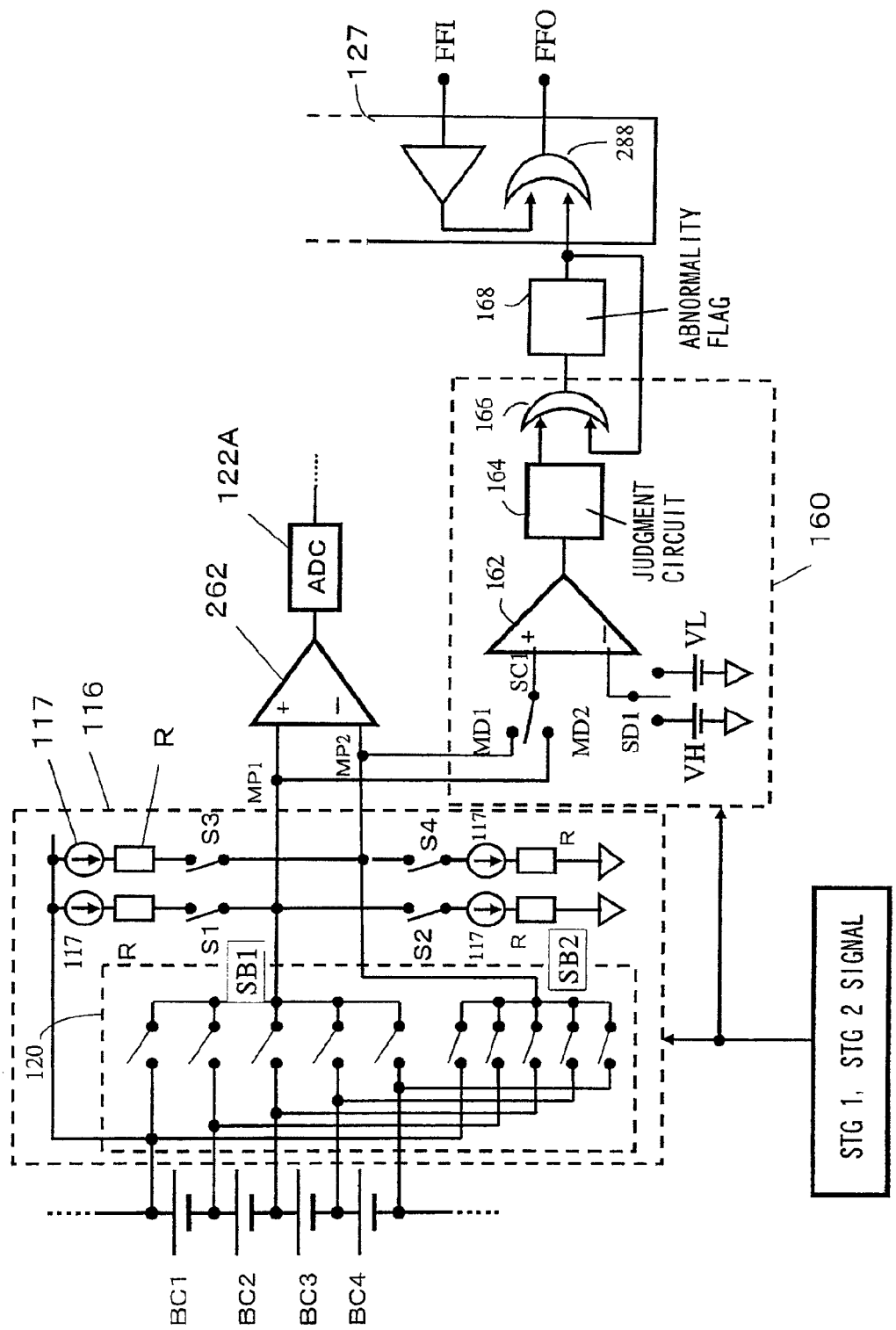
FIG. 37 is a diagram showing a circuit that relates to the multiplexer diagnosis achieved in the third embodiment.

The following is a description of the selection operation diagnosis of the multiplexer 120, which is executed during the second time segment of the [STGCV3 RES] phase in FIG. 36. In the selection operation diagnosis, the selection operation diagnosis of the switch SB1, which is provided in the multiplexer 120, is executed, and that of the other switch SB2 is executed thereafter. In the selection operation diagnosis of the switch SB1, the STG1 and STG2 signals instruct the multiplexer 120 to execute an operation to select the battery cell BC3, and instruct the input circuit 116 to put the switches S2~S4 in an open state and the switch S1 in a closed state. In addition, The STG1 and STG2 signals instruct the diagnosis circuit 160 to connect the switch SC1 to the contact point MD2 and to connect the switch SD1 to the voltage source VH.

At this time, the upper input terminal of the comparator circuit 162 is connected to the high potential-side power source via the constant current circuit 117 and the resistor R, and is connected to the positive pole side of the battery cell BC3 via the switch SB1. The lower input terminal of the comparator circuit 162, on the other hand, is connected to the voltage source VH of the voltage $V_H$. If the switch SB1 is in an open state, the potential at the upper input terminal of the comparator circuit 162 rises to about the value of the potential of the high potential-side power source. If the switch SB1 is properly connected to the positive pole side of the battery cell BC3, the potential at the input terminal is affected by the cell voltage, being supposed to result in "measurement voltage<$V_H$". The judgment circuit 164 thus judges whether or not the condition "measurement voltage<$V_H$" is met based upon the output from the comparator circuit 162. Unless the condition "measurement voltage<$V_H$" is met, the judgment circuit 164 outputs an abnormality signal to the OR circuit 166. The processing to be executed after the OR circuit 166 will not be described now since it is similar to the processing in the first embodiment described above.

Next, the STG1 and STG2 signals instruct the multiplexer 120 to execute an operation to select the battery cell BC3, and instruct the input circuit 116 to put the switches S1, S3, and S4 in an open state and the switch S2 in a closed state. The STG1 and STG2 signals instruct the diagnosis circuit 160 to connect the switch SC1 to the contact point MD2 and to connect the switch SD1 to the voltage source VL.

At this time, the upper input terminal of the comparator circuit 162 is connected to the GND of the integrated circuits via the switch S2 and is connected to the high potential side of the battery cell BC3 via the switch SB1. The lower input terminal of the comparator circuit 162, on the other hand, is connected to the voltage source VL of the voltage $V_L$. If the switch SB1 is in an open state, the potential at the upper input terminal of the comparator circuit 162 equals to the GND potential of the integrated circuits. If the switch SB1 is properly connected to the positive pole side of the battery cell BC3, the potential at the input terminal is affected by cell voltage, being supposed to result in "measurement voltage>$V_L$". The judgment circuit 164 thus judges whether or not the condition "measurement voltage>$V_L$" is met based upon the output from the comparator circuit 162. Unless the condition "measurement voltage>$V_L$" is met, the judgment circuit 164 outputs an abnormality signal to the OR circuit 166. The processing to be executed after the OR circuit 166 will not be described now since it is similar to the processing in the first embodiment described above.

In the selection operation diagnosis of the switch SB2, the STG1 and STG2 signals instruct the multiplexer 120 to execute an operation to select the battery cell BC3, and instruct the input circuit 116 to put the switches S1, S2, and S4 in an open state and the switch S3 in a closed state. In addition, the STG1 and STG2 signals instruct the diagnosis circuit 160 to connect the switch SC1 to the contact point MD1 and to connect the switch SD1 to the voltage source VH.

At this time, the upper input terminal of the comparator circuit 162 is connected to the high potential-side power source via the constant current circuit 117 and the resistor R, and is connected to the negative pole side of the battery cell BC3 via the switch SB2. The lower input terminal of the comparator circuit 162, on the other hand, is connected to the voltage source VH of the voltage $V_H$. If the switch SB1 is in an open state, the potential at the upper input terminal of the comparator circuit 162 rises to about the value of the potential of the high potential-side power source. If the switch SB2 is properly connected to the negative pole side of the battery cell BC3, the potential at the input terminal is affected by cell voltage, being supposed to result in "measurement voltage<$V_H$". The judgment circuit 164 thus judges whether or not the condition "measurement voltage<$V_H$" is met based upon the output from the comparator circuit 162. Unless the condition "measurement voltage<$V_H$" is met, the judgment circuit 164 outputs an abnormality signal to the OR circuit 166. The processing to be executed after the OR circuit 166 will not be described now since it is similar to the processing in the first embodiment described above.

Next, the STG1 and STG2 signals instruct the multiplexer 120 to execute an operation to select the battery cell BC3, and instruct the input circuit 116 to put the switches S1~S3 in an open state and the switch S4 in a closed state. In addition, the STG1 and STG2 signals instruct the diagnosis circuit 160 to connect the switch SC1 to the contact point MD1 and to connect the switch SD1 to the voltage source VL.

At this time, the upper input terminal of the comparator circuit 162 is connected to the GND of the integrated circuits via the switch S4, and is connected to the negative pole side of the battery cell BC3 via the switch SB2. The lower input terminal of the comparator circuit 162, on the other hand, is connected to the voltage source VL of the voltage $V_L$. If the switch SB2 is in an open state, the potential at the upper input terminal of the comparator circuit 162 equals to the GND potential of the integrated circuits. If the switch SB2 is properly connected to the negative pole side of the battery cell BC3, the potential at the input terminal is affected by cell voltage, being supposed to result in "measurement voltage>$V_L$". The judgment circuit 164 thus judges whether or not the condition "measurement voltage>$V_L$" is met based upon the output from the comparator circuit 162. Unless the condition "measurement voltage>$V_L$" is met, the judgment circuit 164 outputs an abnormality signal to the OR circuit 166. The processing to be executed after the OR circuit 166 will not be described now since it is similar to the processing in the first embodiment described above.

Thus executing the selection operation diagnosis by the multiplexer 120 in order, as shown in the selection operation diagnosis period of FIG. 36, will enable a judgment whether or not the multiplexer 120 normally executes the selection operation of the battery cell BC3. Upon completion of the [STGCV3 RES] phase shown in FIG. 36, the terminal voltage at the battery cell BC3 is measured during the [STGCV3 measurement] phase.

Figure 38:
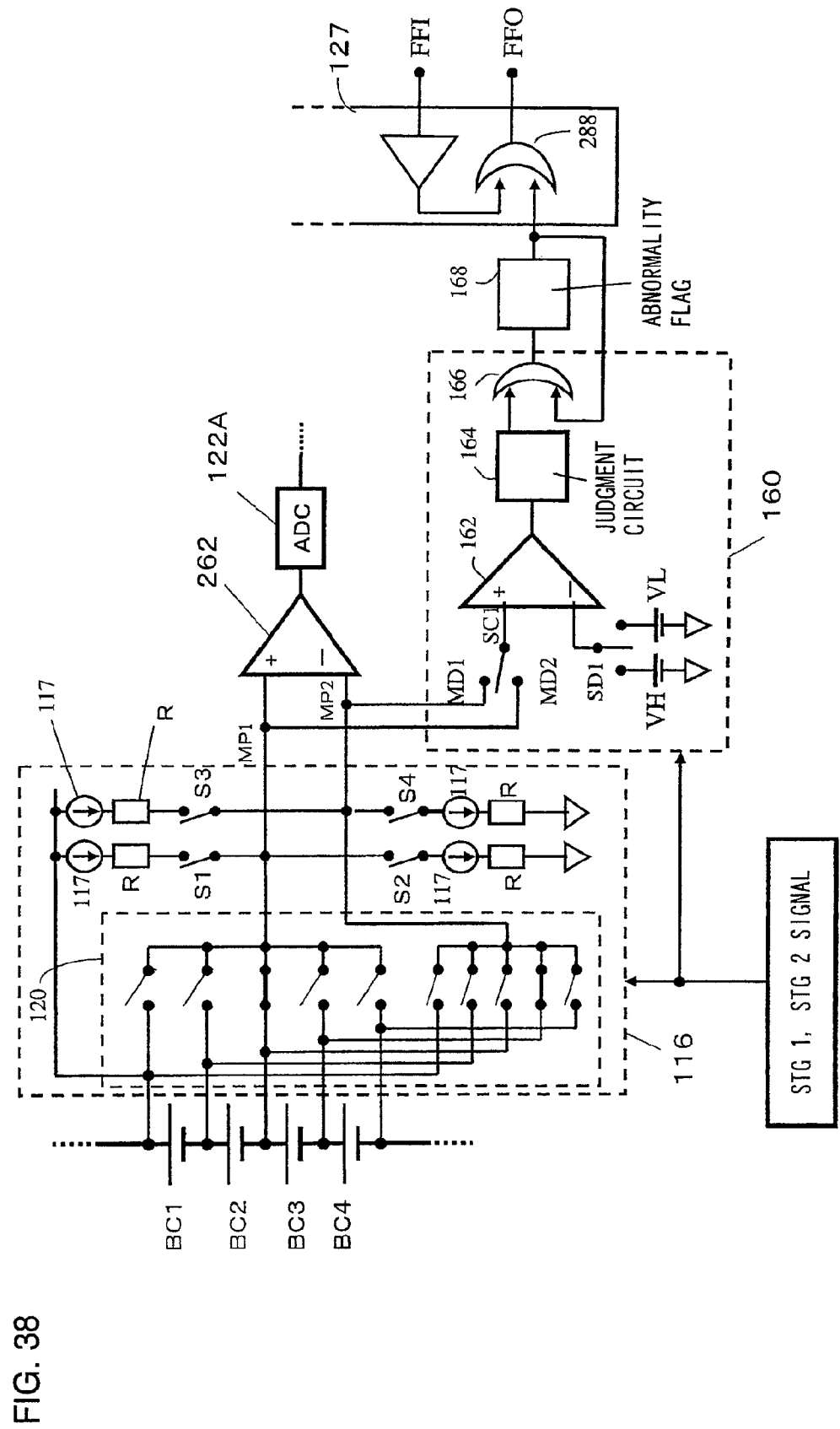
FIG. 38 is a diagram illustrating a terminal voltage measurement operation at the battery cell BC3.

FIG. 38 is a diagram illustrating the terminal voltage measurement operation at the battery cell BC3. In this terminal voltage measurement operation, the STG1 and STG2 signals instruct the multiplexer 120 to execute an operation to select the battery cell BC3, and instruct the input circuit 116 to put the switches S1~S4 in an open state. In addition, the STG1 and STG2 signals instruct the diagnosis circuit 160 to put the switches SC1 and SD1 in an open state. Since the battery cell BC3 selection state of the multiplexer 120 has been judged to be normal through the diagnosis operation during the [STGCV3 RES] phase, the terminal voltage at the battery cell BC3 is output from the multiplexer 120.

Fourth Embodiment

Figure 39:
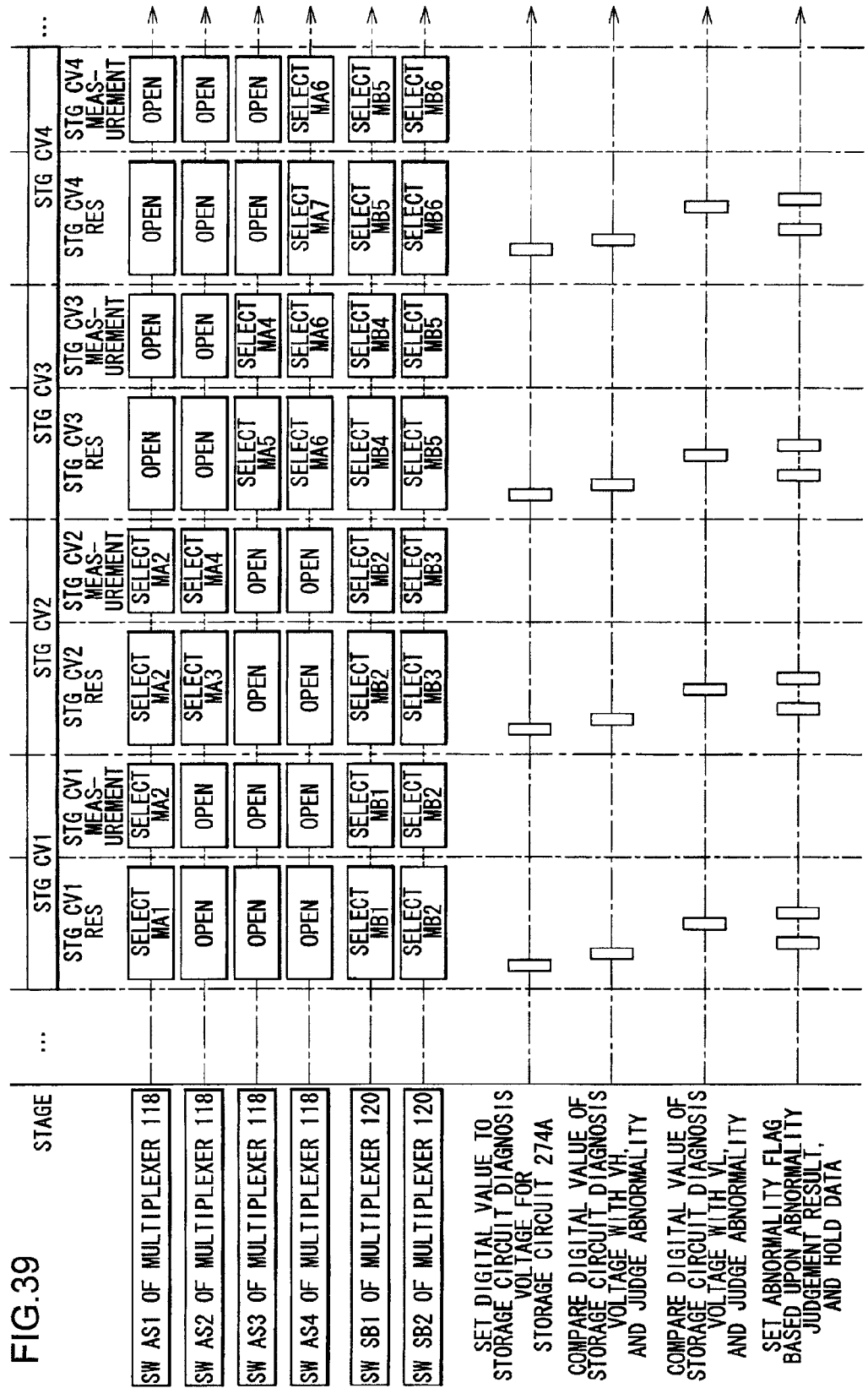
FIG. 39 is an operation diagram illustrating the multiplexer diagnosis achieved in the fourth embodiment.

In the second embodiment described above, the diagnosis of the multiplexer 120 is executed through an analog circuit. In the fourth embodiment shown in reference to FIGS. 39 and 40, the diagnosis of the multiplexer 120 is executed through a digital circuit. FIG. 39 is an operation diagram achieved in the fourth embodiment, illustrating operations executed during the stages STGCV1~STGCV4, where terminal voltages of the battery cells are measured. A multiplexer diagnosis during the stage STGCV1 will now be described as a representative example. The multiplexer diagnoses during the stages STGCV2~STGCV4 are executed likewise. It is to be noted that the state of switch connection of the multiplexers 118 and 120 during each of the stages is the same as that in the second embodiment.

Figure 40:
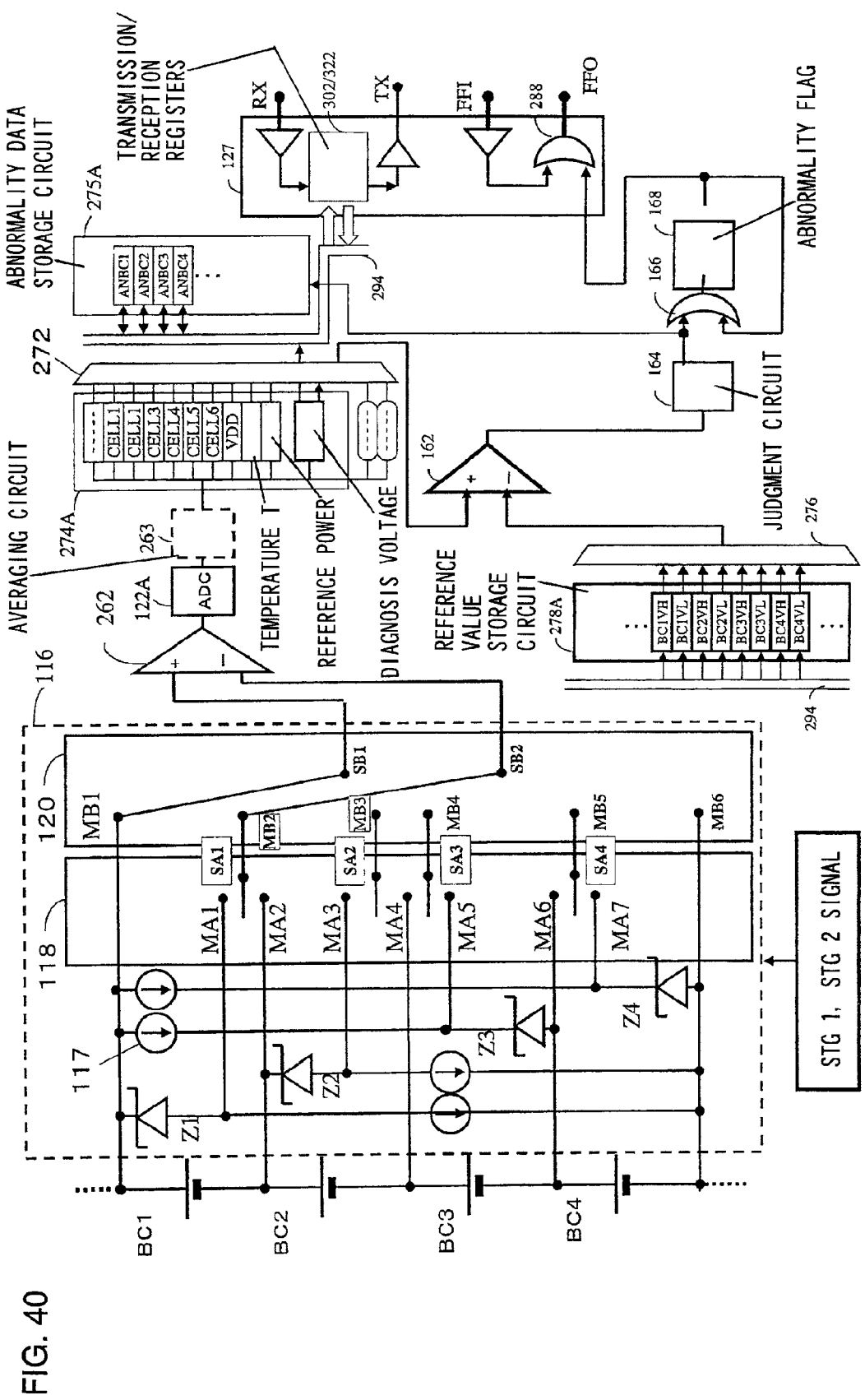
FIG. 40 is a diagram showing a circuit that relates to the multiplexer diagnosis achieved in the fourth embodiment.

FIG. 40 is a diagram of a circuit that relates to the multiplexer diagnosis, showing a multiplexer diagnosis operation during the RES phase of the stage STGCV1. The switch SB1 of the multiplexer 120 is connected to the contact point MB1. The switch SB2 is connected to the contact point MB2. When the switch SA1 of the multiplexer 118 is connected to the contact point MA1, the Zener voltage Vz1 generated by the Zener diode Z1 is input to the multiplexer 120. If the multiplexer 120 works normally, the multiplexer 120 is supposed to output the Zener voltage Vz1 as an output voltage Vm. The output voltage Vm from the multiplexer 120 is input to the analog/digital converter 122A via the differential amplifier 262 and is converted to a digital value therein.

The digital value converted by the analog/digital converter 122A at the diagnosis operation is held at a diagnosis voltage register provided in a current value storage circuit 274A. The current value storage circuit 274A is a circuit in which the diagnosis voltage register is added to the current value storage circuit 274 achieved in the second embodiment. A reference value storage circuit 278A differs from the reference value storage circuit 278 achieved in the second embodiment in that the reference value storage circuit 278A is provided with registers BC1VH~BC4VH4 and BC1VL~BC4VL that hold digital values corresponding to the analog voltages $V_{H1}$~$V_{H4}$ and $V_{L1}$~$V_{L4}$. It is to be noted that values of the registers BC1VH~BC4VH4 and BC1VL~BC4VL in the reference value storage circuit 278A can be rewritten via a communication terminal RX and an internal data bus 294.

It is first verified whether or not the output voltage Vm from the multiplexer 120 is identical to the voltage Vz1, a known voltage, from the Zener diode Z1. For that purpose, the digital comparator circuit 162 compares the digital value converted by the analog/digital converter 122A with the value BC1VH held at the register BC1VH, and then compares the above digital value with the value BC1VL held at the register BC1VL. The value BC1VH is set to be higher than the voltage Vz1, and the value BC1VL is set to be lower than the voltage Vz1. The judgment circuit 164 judges, based upon the output of the digital comparator circuit 162, whether or not the multiplexer 120 is working normally.

In the present embodiment, as in the second embodiment, an abnormality occurring in the multiplexer 118 in which the multiplexer 120 is included, the differential amplifier 262, or the analog/digital converter 122A can be detected through the judgment circuit 164. Upon detecting the abnormality occurred, an abnormality flag is set at the abnormality flag storage circuit 168. Since the operation related to the processing for abnormality signals output from the abnormality flag storage circuit 168 is the same as that in the second embodiment, detailed descriptions on it will not be included herein. Having been judged to be abnormal by the judgment circuit 164, the value held at the diagnosis voltage register in the current value storage circuit 274A is stored at the register ANBC1 in an abnormality data storage circuit 275A. Abnormality data information stored in the abnormality data storage circuit 275A is output to an external recipient via the data bus 294, transmission/reception registers 302/322, and an output terminal TX according to a transmission instruction. This enables to ascertain the abnormality cause.

After verifying the diagnosis operation during the [STGCV1 RES] phase, the operation progresses to the [STGCV1 measurement] phase, in which the switch SA1 is switched to be connected to the contact point MA2, and the terminal voltage at the battery cell BC1 is input to the multiplexer 120, converted to a digital value by the analog/digital converter 122A, and held at the register CELL1 in the current value storage circuit 274A. As FIG. 39 shows, the same operation as the one mentioned above is executed in sequence from the stage STGCV2, the stage STGCV3, to the stage STGCV4.

As in the present embodiment, the diagnosis with digital conversion through the digital comparator circuit is subject to the adverse effect of noise. The average value obtained through a plurality of the analog/digital conversions may be used so as to eliminate the adverse effect of noise. The averaging circuit 264 shown in FIG. 40 is a circuit that calculates the average of the values obtained through a plurality of operations of the analog/digital converter 122A. Particularly for high-speed analog/digital conversion operations, it is desirable to automatically calculate the average value of the values obtained through the plurality of operations and to use the calculation result as an analog/digital conversion output.

Fifth Embodiment

Figure 41:
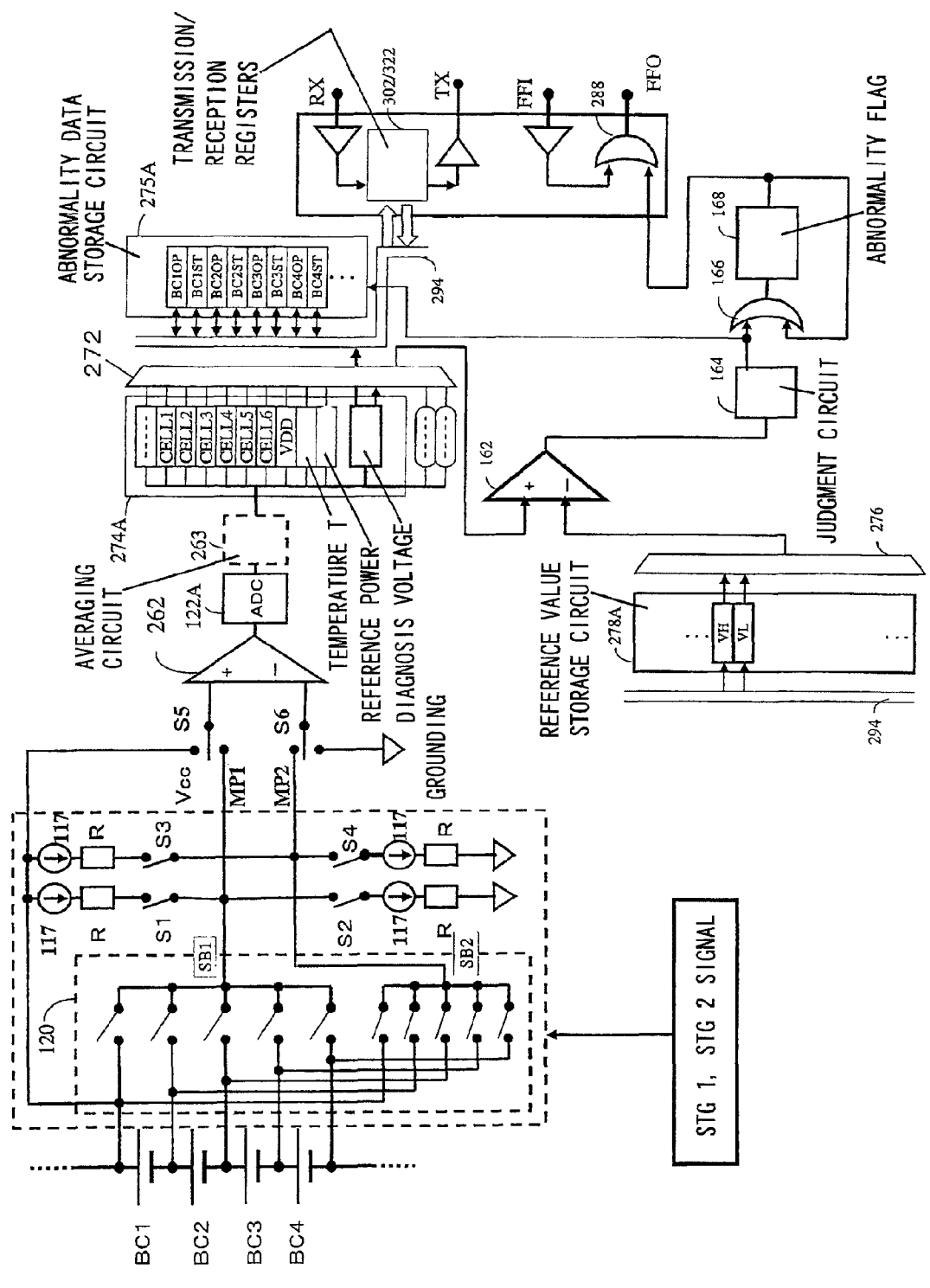
FIG. 41 is a diagram showing the multiplexer diagnosis achieved in the fifth embodiment.

In a fifth embodiment shown in FIG. 41, the diagnosis operation achieved in the third embodiment (FIG. 36) is digitally executed. It is to be noted that the state of connection of the switches SB1, SB2, and S1~S4 at the diagnosis operation is the same as that achieved in the third embodiment. The digital value converted by the analog/digital converter 122A is held at a diagnosis voltage register provided in the current value storage circuit 274A, as that achieved in the fourth embodiment. The reference value storage circuit 278A is provided with registers VH and VL that hold digital values corresponding to the voltages $V_H$ and $V_L$ achieved in the third embodiment. In the period during which the output terminal MP1 of the multiplexer 120 is diagnosed, a switch S5 is connected to the output terminal MP1 and a switch S6 is connected to the ground potential. In the period during which the output terminal MP2 of the multiplexer 120 is diagnosed, the switch S5 is connected to Vcc and the switch S6 is connected to the output terminal MP2.

It is first verified whether or not the output voltage Vm from the multiplexer 120 is identical to the voltage Vz1, a known voltage, from the Zener diode Z1. For that purpose, the digital comparator circuit 162 compares the digital value converted by the analog/digital converter 122A with the value VH held at the register VH, and then compares the above digital value with the value VL held at the register VL. The judgment circuit 164 judges, based upon the output of the digital comparator circuit 162, whether or not the multiplexer 120 is working normally. In the present embodiment as well, an abnormality occurring in the multiplexer 118 in which the multiplexer 120 is included, the differential amplifier 262, or the analog/digital converter 122A can be detected through the judgment circuit 164. Upon detecting the abnormality occurred, an abnormality flag is set at the abnormality flag storage circuit 168.

Having been judged to be abnormal by the judgment circuit 164, the value held at the diagnosis voltage register in the current value storage circuit 274A is stored in the abnormality data storage circuit 275A. In the diagnosis operation for the battery cell BC1, if an abnormality occurs during the open operation diagnosis for the multiplexer 120, the value held at the diagnosis voltage register is held at a register BC1OP in the abnormality data storage circuit 275A. If an abnormality occurs during the selection operation diagnosis for the multiplexer 120, the value held at the diagnosis voltage register is held at a register BC1ST in the abnormality data storage circuit 275A. The same operation is executed for the battery cells BC2~BC4: For the battery cell BC2, the value held at the diagnosis voltage register is held at a register BC2OP or BC2ST in the abnormality data storage circuit 275A; For the battery cell BC3, the value held at the diagnosis voltage register is held at a register BC3OP or BC3ST in the abnormality data storage circuit 275A; And, for the battery cell BC4, the value held at the diagnosis voltage register is held at a register BC4OP or BC4ST in the abnormality data storage circuit 275A.

Sixth Embodiment

The multiplexer diagnosis has been described in the first through the fifth embodiments. The HVMUX signal selection diagnosis listed in row 260Y7 of FIG. 4 will be described with reference to FIG. 42 in a sixth embodiment. In the integrated circuits 3A through 3N each provided in the cell controller 80, the multiplexer 120 and other circuits are operated based upon the outputs from the stage counters 256 and 258 shown in FIG. 4. In other words, the entire operation of each of the integrated circuits 3A through 3N is controlled based upon the outputs from the incorporated stage counters 256 and 258. The multiplexer 120 is operated as one of the circuits to execute the entire operation of the integrated circuits.

The multiplexer 120 is constituted with numerous switching circuits. The switching circuits of the multiplexer 120 execute ON/OFF (open/close) operations based upon a signal from a selection circuit 2592, which is constituted with decoder circuits. A selection operation is executed by the multiplexer 120 based upon the ON/OFF operations by the switching circuits. Accordingly, an erroneous open/close signal transmitted from the selection circuit 2592 to the multiplexer 120 causes the multiplexer 120 working normally to execute an erroneous selection operation.

Figure 42:
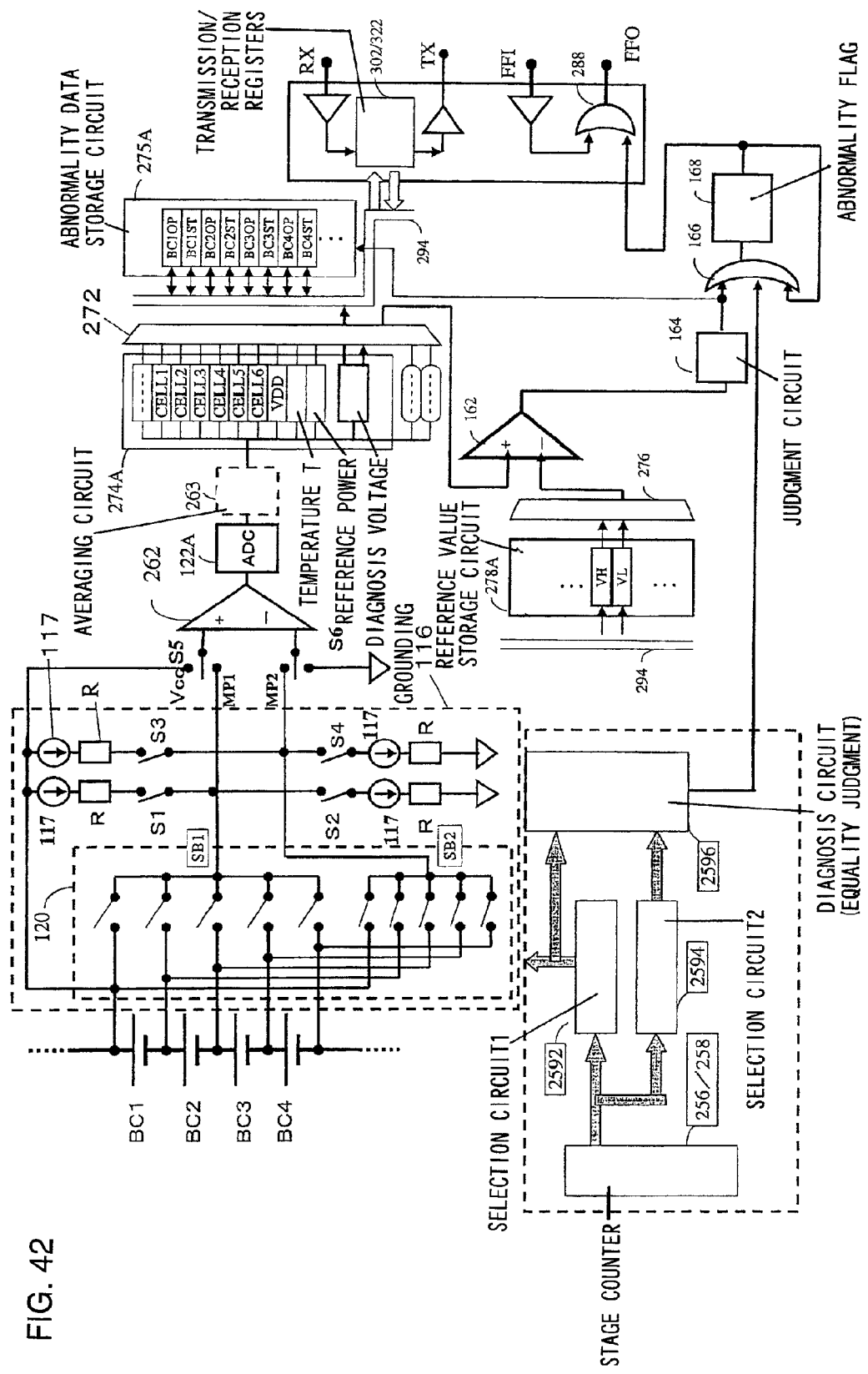
FIG. 42 is a diagram illustrating an HVMUX signal selection diagnosis in the multiplexer diagnosis achieved in the sixth embodiment.

For instance, in the [STGCV3 measurement] phase during which the terminal voltage at the battery cell BC3 is measured, an erroneous operation by the selection circuit 2592 may cause the multiplexer 120 to select the terminal voltage at the battery cell BC2. Under such circumstances, an overcharge diagnosis for the battery cell BC3 may not be executed at all because the terminal voltage selected for the overcharge diagnosis of the battery cell BC3 is not the terminal voltage at battery cell BC3. In the present embodiment, a second selection circuit 2594 is provided as shown in FIG. 42 to execute the HVMUX signal selection diagnosis as described below, verifying whether or not a correct open/close signal is transmitted to the multiplexer 120. This will avoid situations described above.

The second selection circuit 2594 has the circuit structure identical to that of the selection circuit 2592. Signals from the stage counters 256 and 258 are input to both of the selection circuits 2592 and 2594. When both of the selection circuits 2592 and 2594 work normally, an identical open/close signal is supposed to be output from both of the selection circuits 2592 and 2594. The open/close signal from the selection circuit 2592 is input to the multiplexer 120 and a diagnosis circuit 2596, whereas the open/close signal from the selection circuit 2594 is input to the diagnosis circuit 2596. The diagnosis circuit 2596 compares the two open/close signals input from the selection circuits 2592 and 2594 with each other. Only if the both signals equal to each other, the diagnosis circuit 2596 diagnoses the selection circuit 2592 to be normal. If, on the other hand, the both signals do not equal to each other, at least one of the selection circuits 2592 and 2594 is assumed to be abnormal, and the diagnosis circuit 2596 outputs an abnormality signal to the OR circuit 166.

It is to be noted that according to the embodiment as shown in FIG. 42, the selection circuits 2592 and 2594 are identical to each other, and, only if the outputs from the both circuits equal to each other, the selection circuit 2592 is diagnosed to be normal. However, at diagnosing whether or not an output signal is correct for an input signal from the selection circuit 2592, the circuit structures of the selection circuits 2592 and 2594 do not necessarily equal to each other. For example, the selection circuit 2594 may be configured so that the output from the selection circuit 2592 and the output from the selection circuit 2594 bear a definite relation to each other while working normally. The diagnosis circuit 2596 may be configured to diagnose whether or not the definite relation is borne.

(Diagnosis and Measurement: (5) Holding of Initial Data)

In the DC power supply system shown in FIG. 1, no current is supplied from the battery unit 9 to the inverter in a vehicle stopped state before the driver starts driving the vehicle. Based upon the terminal voltages at the individual battery cells measured while no charge/discharge currents are flowing through the battery cells, the states of charge (SOCs) of the battery cells can be determined accurately. Accordingly, in response to a vehicle key switch operation or a communication command 292 such as a wake-up request issued from the battery controller 20, the integrated circuits each automatically start measurement operation. At each integrated circuit, the measurement operation and the battery cell diagnosis operation start, as has been described in reference to FIG. 5. Once the measurement has been executed the number of times held in the averaging control circuit 263, the averaging circuit 264 executes arithmetic operation to calculate the average measurement value. The results of the arithmetic operation are held in the current value storage circuit 274. The integrated circuit executes the measurement operation and the measurement result averaging operation for all the battery cells in the corresponding group independently of the other integrated circuits. The arithmetic operation results are held at the registers CELL1~CELL6 in the current value storage circuit 274 of the particular integrated circuit.

It is desirable to measure the terminal voltages at the individual battery cells while no charge/discharge currents flow through the battery cells, in order to ensure that the state of charge (SOC) at each battery cell is subsequently ascertained accurately. As described above, each integrated circuit starts the measurement operation on its own so as to measure the terminal voltages at all the battery cells corresponding to the particular integrated circuit before the current supply from the battery unit 9 to the inverter starts and these terminal voltage measurement values are held at the registers CELL1~CELL6 in the current value storage circuit 274. Since each measurement value held at the current value storage circuit 274 is subsequently overwritten with a value indicating new measurement results, the measurement results obtained prior to the current supply start are transferred from the registers CELL1~CELL6 in the current value storage circuit 274 to registers BCELL1~BCELL6 in the initial value storage circuit 275 to be held therein. Since the measurement values obtained before starting the current supply from the battery unit 9 to the inverter are held at the initial value storage device 275 as described above, high priority diagnosis processing can be executed ahead by relegating processing such as calculation of the SOCs to a later step. Once the high priority processing is executed and the current supply from the battery unit 9 to the inverter starts, the SOCs of the individual battery cells are determined through arithmetic calculation based upon the measurement values held in the initial value storage circuit 275, enabling control for adjusting the states of charge (SOCs) to be executed based upon accurate state detection. The driver of the vehicle may wish to start driving immediately and, for this reason, it is desirable to immediately start the current supply to the inverter as explained above.

In the embodiment described in reference to FIG. 5, as the measurement values obtained prior to starting the current supply to the electrical load, i.e., the inverter, become held at the current value storage circuit 274, the digital comparator circuit 270 is allowed to execute the over-charge/over-discharge diagnosis and also diagnosis for current leakage or the like. This means that an abnormal state can be detected even before starting the DC power supply to the inverter. If an abnormal state exists, the abnormality can be detected through the diagnosis executed prior to the current supply start, allowing appropriate action such as refraining from supplying DC power to the inverter, to be taken. In addition, the measurement values obtained prior to the current supply start are transferred from the current value storage circuit 274 to the initial value storage circuit 275, which is used as a dedicated storage circuit for holding the preliminary measurement values. In short, the operation executed as described above is markedly advantageous in that better safety is assured and that the states of charge (SOCs) can be ascertained with better accuracy.

(Communication Commands)

The communication circuit 127 via which communication commands are transmitted/received is installed within the integrated circuit 3A shown in FIG. 2. FIG. 7 is a circuit diagram showing the circuit structure and the operation of the communication circuit 127. As explained earlier, the other integrated circuits assume structures identical to that of the integrated circuit 3A and execute operations identical to that executed in the integrated circuit 3A. Accordingly, the operation of the communication circuit 127 is described by referring to the circuit structure assumed in the integrated circuit 3A representing the other integrated circuits as well. Accordingly, the operation of the communication circuit 127 is described by referring to the circuit structure assumed in the integrated circuit 3A representing the other integrated circuits as well. A communication command transmitted from the battery controller 20 and received at a reception terminal RX of the communication circuit 127 is constituted with a total of five data segments each corresponding to an 8-bit unit and its basic structure includes five bytes. However, a communication command may sometimes be longer than five bytes, as explained later, and accordingly, the length of communication commands is not limited to five bytes. The communication command is input to a reception register 322 from the terminal RX and is held at the communication register 322. It is to be noted that the reception register 322 is a shift register at which signals input serially from the terminal RX are shifted in sequence in the order with which the signals are input to the reception register 322. The leading segment of the communication command is held as a break field segment 324 at the leading segment of the register and the subsequent segments of the communication command are held in sequence.

As described above, the communication command 292 held at the reception register 322 assumes the following structure. The leading eight bits constitute the break field 324 made up with a signal indicating a signal arrival and the second eight bits constitute a synchronous field 326 made up with a synchronizing signal. The third eight bits constitute an identifier 328 indicating a specific integrated circuit among the integrated circuits 3A, . . . , 3M, . . . and 3N, the target address, which indicates the location of the instruction target circuit and the contents of the command. The fourth eight bits are data 330 indicating the communication contents (control contents), which are needed in the execution of the instruction. This segment may contain data other than one-byte data. The fifth eight bits constitute a checksum 332 used to check whether or not there has been any error in the transmission/reception operation with which a failure to communicate the command accurately due to noise or the like can be detected. As described above, the communication commands originating from the battery controller 20 is constituted of five segments, i.e., the break field 324, the synchronous field 326, the identifier 328, the data 330 and the checksum 332. Assuming each segment is constituted with a single byte of data, the overall communication command is constituted with five bytes. While communication commands basically adopt this five-byte structure, the length of the data 330 may be other than one byte. In other words, the length may be increased as necessary.

The synchronous field 326 is used to synchronize a transmission clock on the transmission side and a reception clock on the reception side. A synchronous circuit 342 detects the timing with which the individual pulses of the synchronous field 326 are transmitted and synchronizes itself with the timing with which each pulse of the synchronous field 326 is transmitted. The reception register 322 receives at the subsequent signals with the synchronized timing. Through these measures, the optimal timing with which a received signal is compared with the threshold value used to judge the true value of the signal can be selected accurately so as to minimize the risk of erroneous transmission/reception.

As shown in FIG. 1, the communication command 292 is transmitted from the battery controller 20 to the terminal RX of the integrated circuit 3A, is transmitted from the terminal TX of the integrated circuit 3A to the terminal RX of the succeeding integrated circuit, . . . , is transmitted to the terminal RX of the succeeding integrated circuit 3M, is transmitted from the terminal TX of the integrated circuit 3M to the terminal RX of the succeeding integrated circuit, . . . , is transmitted to the terminal RX of the succeeding integrated circuit 3N and is transmitted from the terminal TX of the integrated circuit 3N to the terminal RX of the battery controller 20. In short, the communication command 292 is communicated through a transmission path 52 constituted by serially connecting the transmission/reception terminals of the individual integrated circuits in a loop.

While the integrated circuit 3A is described as a representative example of all the integrated circuits, and the other integrated circuits assume structures and execute operations identical to those of the integrated circuit 3A. The communication command 292 is transmitted to the terminal RX of the integrated circuit 3A and at each subsequent integrated circuit, the communication command 292 is transmitted from the terminal TX thereof to the next integrated circuit. During this operation, a command processing circuit 344 shown in FIG. 7 makes a decision as to whether or not the instruction target of the communication command 292 having been received is the subject integrated circuit. If the subject integrated circuit is judged to be the instruction target, processing is executed based upon the communication command. The procedure described above is executed at the individual integrated circuits in sequence as the communication command 292 is transmitted and received.

Accordingly, even when the communication command 292 held at the reception register 322 does not concern the integrated circuit 3A, the communication command 292 having been received must be passed on to the succeeding integrated circuit. The contents of the identifier 328 in the received communication command 292 are taken into the command processing circuit 344 and, based upon the identifier thus taken in, the command processing circuit makes a decision as to whether or not the subject integrated circuit 3A itself is the target of the communication command 292. If it is decided that the integrated circuit 3A is not the target of the communication command 292, the contents of the identifier 328 and the data 330 are directly transferred into portions of a transmission register 302 designated as an identifier 308 and data 310 respectively. In addition, a transmission signal is generated within the transmission register 302 by inputting the checksum 312 used to check for any erroneous transmission/reception operation and the transmission signal thus generated is transmitted from the terminal TX. As is the reception register 322, the transmission register 302 is constituted with a shift register.

If the target of the received communication command 292 is the subject integrated circuit itself, the instruction is executed based upon the communication command 292. The command execution is described below.

The target of the received communication command 292 may be all the integrated circuits including the subject integrated circuit. Such a communication command may be, for instance, an RES command, a wake-up command or a sleep command. Upon receiving the RES command, the command processing circuit 344 decodes the contents of the command and outputs an RES signal. As the RES signal is generated, the data held in the current value storage circuit 274, the initial value storage circuit 275 and the flag storage circuit 284 in FIG. 5 are all reset to the initial value "0." While the data at the reference value storage circuit 278 in FIG. 5 are not initialized to "0", they may also be reset to "0." However, if the contents of the data held at the reference value storage circuit 278 are reset to "0", new diagnosis reference values to be used in the subject integrated circuit while independently executing the measurement and the diagnosis, as shown in FIG. 4, following the RES signal generation, need to be set promptly at the reference value storage circuit 278. In order to avoid such a complication in the operational procedure, the reference value storage circuit 278 in the embodiment adopts a circuit structure in which the contents of the data held therein are not altered in response to the RES signal. Since the attribute of the data held at the reference value storage circuit 278 is such that the data values do not change frequently, the previous values may be directly utilized. If they need to be adjusted, they can be individually altered in response to another communication command 292. In response to the RES signal, the value held at the averaging control circuit 263 assumes a predetermined value, e.g., 16. Namely, unless it is adjusted in response to another communication command 292, the averaging circuit will calculate the average of 16 measurement values.

As the wake-up command is output from the command processing circuit 344, the startup circuit 254 in FIG. 4 is started up and the measurement/diagnosis operation starts. As a result, power consumption at the subject integrated circuit increases. If, on the other hand, a sleep signal is output from the command processing circuit 344, the operation of the startup circuit 254 in FIG. 4 stops and thus, the measurement/diagnosis operation also stops. Under these circumstances, the power consumption at the subject integrated circuit decreases markedly.

Next, the data write/modification executed in response to a communication command 292 is described in reference to FIG. 5. The identifier 328 (FIG. 9) in the communication command 292 indicates a specific integrated circuit to be selected. If the data 300 constitute a data write instruction for writing data into an address register 348 or the reference value storage circuit 278 or a data write instruction for writing data into the averaging control circuit 263 or the selection circuit 286, the command processing circuit 344 specifies the write target based upon the instruction contents and writes data 330 into the write target register.

The address register 348 holds the address of the subject integrated circuit and the address of the subject integrated circuit is determined based upon the contents of the data held at the address register. The contents of the data held at the address register 348 are set to 0 in response to the RES signal, thereby setting the address of the subject integrated circuit to "0." As the contents of the data held at the address register 348 are modified in response to a new instruction, the address of the subject integrated circuit is switched to that corresponding to the modified contents.

Based upon the communication command 292, the contents of the data held at the reference value storage circuit 278, the flag storage circuit 284, the averaging control circuit 263 and the selection circuit 286 in FIG. 5, as well as the contents of the data stored at the address register 348, can be modified. As a modification target circuit among these circuits is specified, the contents of the data 330 indicating a modified value are provided to the modification target circuit via a data bus 294, thereby modifying the contents of the data held at the target circuit. The circuit in FIG. 5 executes operation based upon the modified data.

The communication command 292 contains a transmission instruction for transmitting data held inside the integrated circuit. The transmission target data are specified based upon the instruction in the identifier 328. For instance, if an internal register in the current value storage circuit 274 or the reference value storage circuit 278 is specified, the contents of the data held at the specified register are transferred via the data bus 294 to the transmission register 302 where they are held in the circuit for the data 310. They are then transmitted as the requested data contents. Thus, the battery controller 20 in FIG. 1 is able to take in a measurement value from a specific integrated circuit or a flag indicating the state of the integrated circuit by issuing the communication command 292.

(Setting Addresses of the Integrated Circuits)

The address registers 348 in the individual integrated circuits 3A, . . . , 3M, . . . and 3N are each constituted with a highly reliable volatile memory and the integrated circuits assume a structure that allows a new address to be set whenever the contents of the volatile memory become lost or the contents of the data held in the volatile memory become unstable. For instance, when the cell controller 80 starts execution, the battery controller 20 may transmit a command for initializing the address registers 348 at the individual integrated circuits. In response to this command, the address registers 348 at the integrated circuits are initialized to, for instance, "0" and then a new address is set at each integrated circuit. The new address is set at each of the integrated circuits 3A, . . . , 3M, . . . and 3N as an address setting command originating from the battery controller 20 is transmitted to the individual integrated circuits 3A, . . . , 3M, . . . and 3N.

Since the addresses of the individual integrated circuits 3A, . . . , 3M, . . . and 3N can be set in response to a command, the integrated circuits do not need to include an address setting terminal or external wiring to be connected to the address setting terminal. In addition, since the addresses can be set through communication command processing, a higher level of control freedom is afforded.

Figure 8:
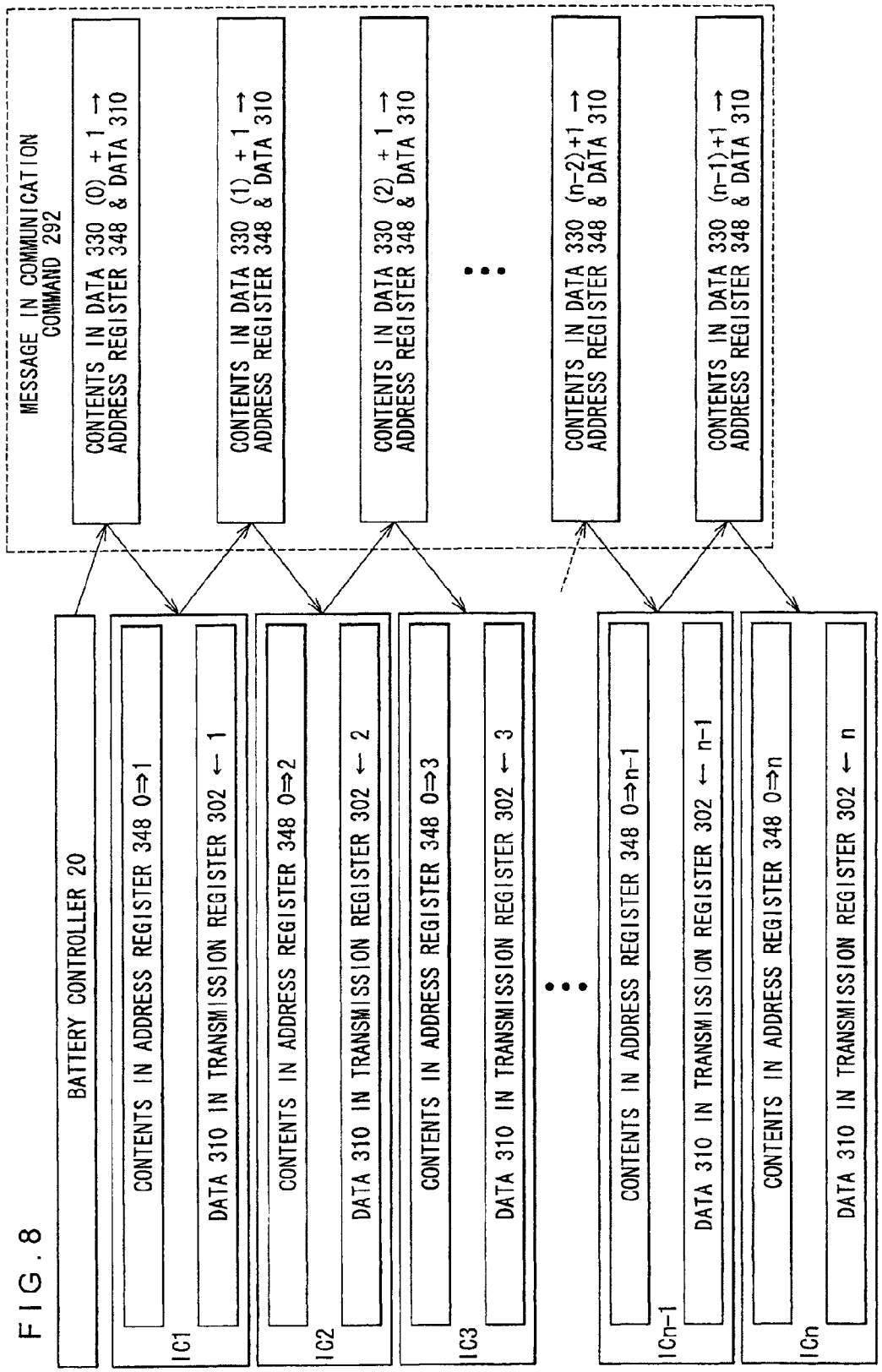
FIG. 8 presents an example of a procedure through which the address register may be set for each integrated circuit based upon a communication command from the battery controller.
Figure 9:
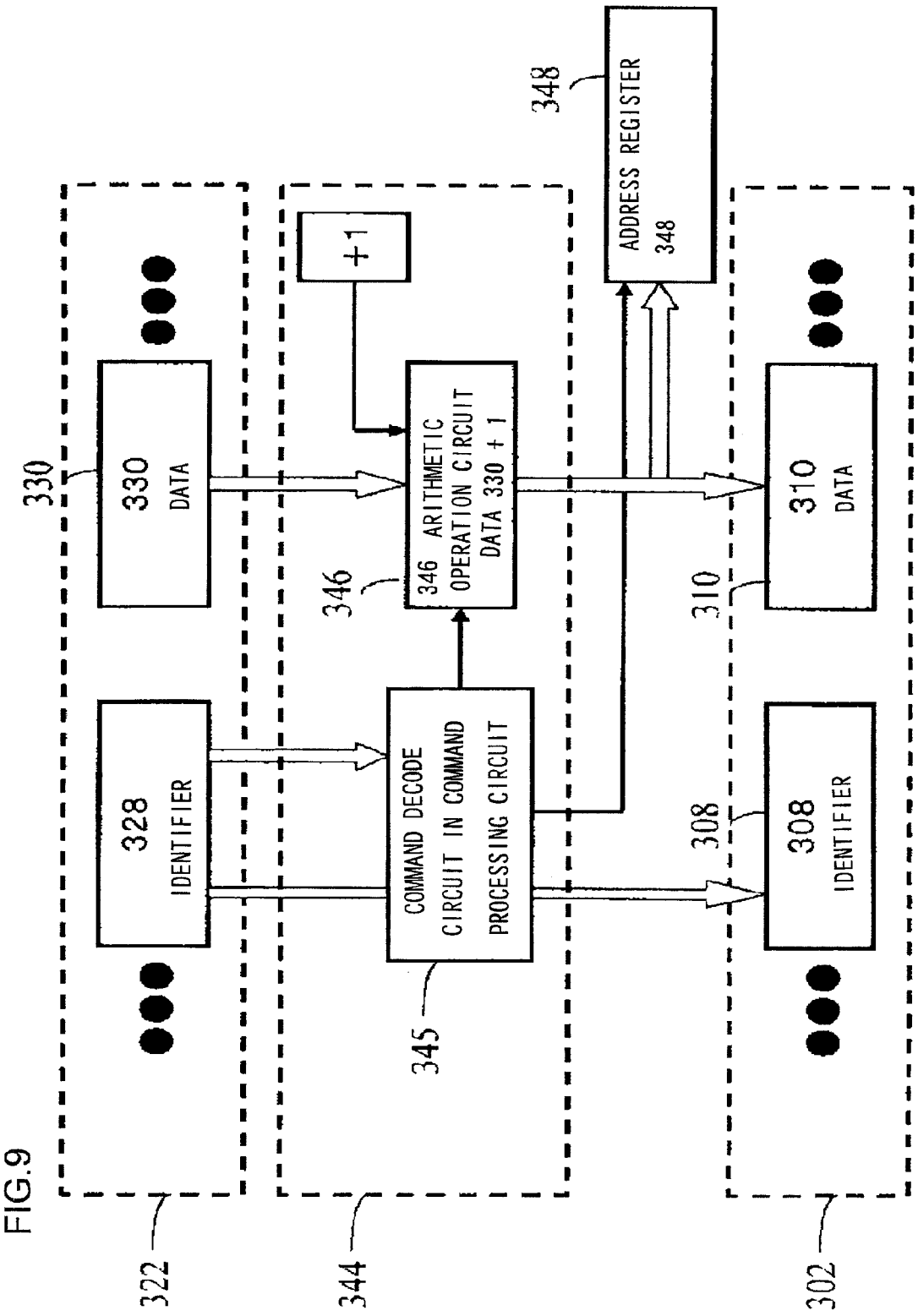
FIG. 9 illustrates the operation executed in the circuit shown in FIG. 7 in response to transmission of the communication command.

FIG. 8 presents an example of a procedure through which addresses may be set at the address registers 348 of the integrated circuits 3A, . . . , 3M, . . . and 3N in response to a communication command 292 issued from the battery controller 20. FIG. 9 illustrates the operation executed in the circuit shown in FIG. 7 based upon the communication command 292 transmitted as shown in FIG. 8. In FIG. 8, the integrated circuits 3A, . . . , 3M, . . . and 3N are indicated as integrated circuits IC1, IC2, IC3, . . . ICn−1 and ICn assuming a positional arrangement matching the order in which the communication command 292 is transmitted/received. Addresses 1, 2, 3, . . . n−1 and n are respectively set for IC1, IC2, IC3, . . . ICn−1 and ICn through the following method. The numeral assigned to a given integrated circuit IC matches the corresponding address number so as to simplify the explanation provided below. However, it is not necessary that they match.

FIG. 8 illustrates the flow of messages carried in the communication command 292 as it is passed on among the battery controller 20 and the individual integrated circuits IC. FIG. 8 also indicates the contents of the data held at the address registers 348 and the contents of the data 310 held at the transmission registers 302 within the individual integrated circuits IC. First, a communication command 292 for initializing the address registers 348 in all the integrated circuits is transmitted from, for instance, the cell controller 80, thereby initializing the address registers 348 in the integrated circuits to "0". FIG. 8 does not include an illustration of this process. Through this operation, the address registers 348 at the integrated circuits IC1, IC2, IC3, . . . and ICn−1 are made to hold the initial value, i.e., "0". Upon receiving the communication command 292 for initializing the address registers 348 in all the integrated circuits, as shown in FIG. 9, the integrated circuit IC1 holds the communication command 292 at the reception register 322. A command decode circuit 345 in the command processing circuit 344 takes in the contents of the identifier 328 and initializes the address register 348 based upon the initialization message. The contents of the identifier 328 are directly set at the identifier 308 at the transmission register 302 and are then transmitted to the succeeding integrated circuit IC2. The integrated circuits IC execute this operation in sequence upon receiving the communication command 292 for initializing the address registers 348 and, as a result, the address registers at all the integrated circuits IC become initialized. Ultimately, the command is sent back from the integrated circuit ICn to the battery controller 20 which is then able to verify that the address registers 348 in all the integrated circuits IC have been initialized.

Based upon the verification described above, a new address is subsequently set at each integrated circuit IC. More specifically, the battery controller 20 transmits a communication command 292 carrying a message "set the instruction execution target address to "0", set the value indicated by the data 330 to "0" and set a value obtained by adding "1" to the value of the data 330 for the address register 348 and the transmission data 310". This communication command 292 is input to the reception register 322 of the integrated circuit IC1 taking up the first position in the transmission path 52. The data segment corresponding to the identifier 328 in the communication command 292 is then taken into the command decode circuit 345. Since the address register 348 in the integrated circuit IC1 holds data indicating "0" at the time of the reception, (1) the value obtained by adding "1" to "0" indicated by the data 330 is set at the address register 348 and (2) the sum resulting from the addition is set as the data 310 at the transmission register 302.

Based upon the data decoded via the command decode circuit 345 in FIG. 9, an arithmetic operation circuit 346 takes in the value "0" indicated by the data 330 and then adds "1" to the value thus taken in. The result of the addition, i.e., "1", is set in the address register 348 and is also set as the data 310. This operation is now described in reference to FIG. 8. As the communication command 292 originating from the battery controller 20 is received at the integrated circuit IC1, the data at the address register 348 in the integrated circuit IC1 assume the value "1" and the data 310 also assume the value "1". The data 310 in the communication command 292, modified to indicate "1" in the integrated circuit IC1 are then transmitted to the integrated circuit IC2. The identifier 308 in the communication command 292 transmitted from the integrated circuit IC1 remains unchanged from that is the communication command initially transmitted from the battery controller 20 and the contents of the data 310 alone are modified.

As data indicating "0" are held at the address register 348 in the integrated circuit IC2, the arithmetic circuit 346 in the integrated circuit IC2 adds "1" to the value "1" indicated in the data 330 and sets the sum at the address register 348 and for the data 310 in the integrated circuit IC2, as shown in FIG. 9. Thus, the value indicated at the address register 348 in the integrated circuit IC2 is switched from "0" to "2". As illustrated in FIG. 8, the value indicated at the address register 348 in the integrated circuit IC2 is switched from "0" to "2" and the data 310 at the transmission register 302 are modified to indicate "2". The modified data 310 are then transmitted to the succeeding integrated circuit IC3. In a similar manner, the value indicated at the address register 348 in the integrated circuit IC3 is switched from "0" to "3" and the data 310 in the transmission register 302 in the integrated circuit IC3 are modified to indicate "3".

Subsequently, the operation described above is repeatedly executed in sequence and eventually the value indicated at the address register 348 in the integrated circuit ICn−1 is switched from "0" to "n−1" and the data 310 in the transmission register 302 in the integrated circuit ICn−1 are modified to indicate "n−1". The data indicating "n−1" are then transmitted to the succeeding integrated circuit ICn. The value held at the address register 348 of the integrated circuit ICn is switched from "0" to "n" and the data 310 at the transmission register 302 are modified to indicate "n". The communication command 292 is then returned from the integrated circuit ICn to the battery controller 20. Since the data 330 in the returned communication command 292 have been modified to indicate "n", the battery controller 20 is able to verify that the address setting operation has been executed correctly.

At the address registers 348 in the individual integrated circuits IC1, IC2, IC3, IC4, . . . , ICn−1 and ICn, 1, 2, 3, 4, . . . , n−1 and n are respectively set in sequence through this procedure.

The integrated circuits in the embodiment all have a function with which the address registers 348 at the individual integrated circuits are reset to the initial value (0), and thus, the address setting operation can be executed reliably.

(Another Embodiment of Address Setting)

Figure 10:
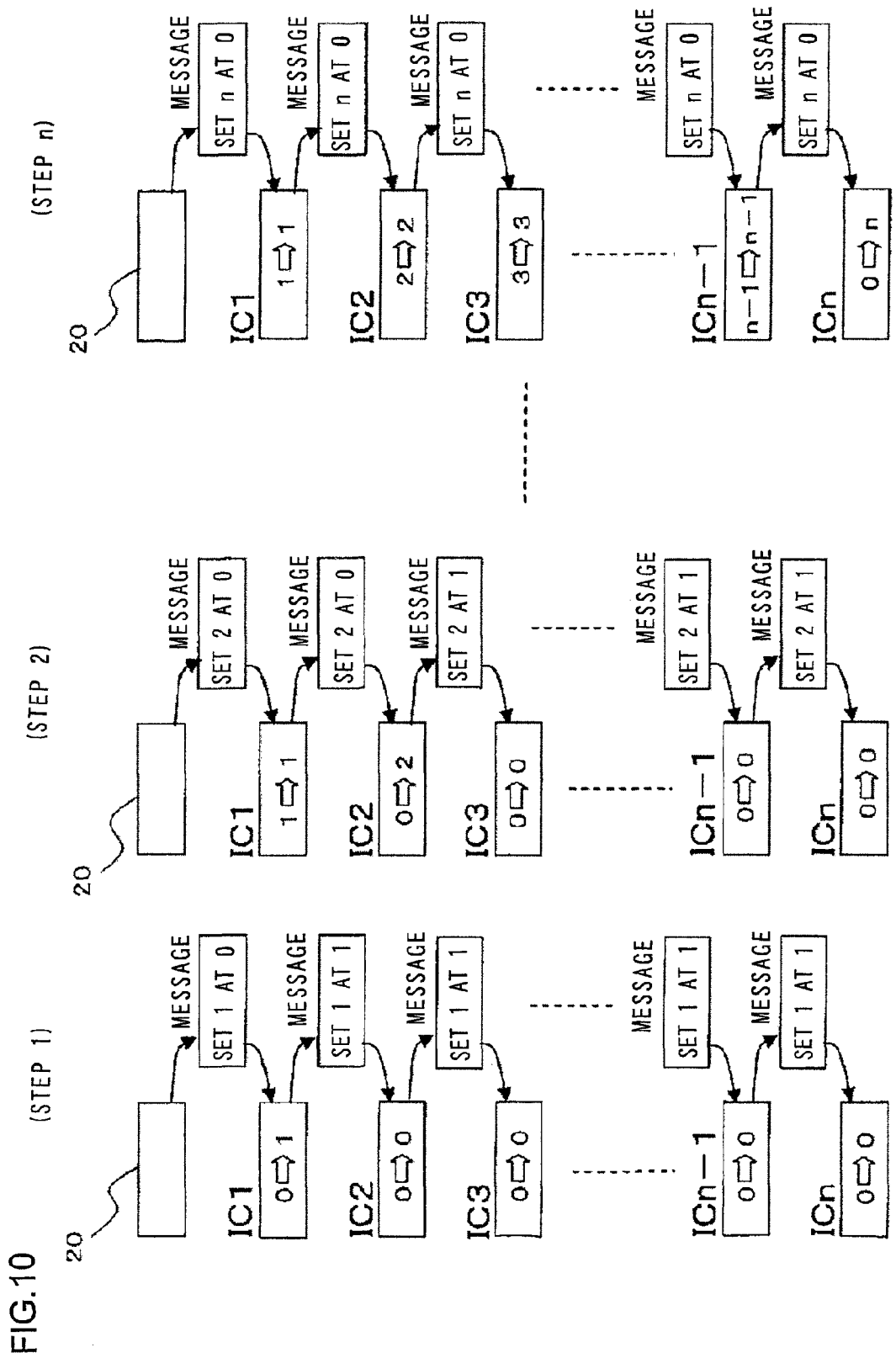
FIG. 10 illustrates an embodiment in which addresses are sequentially set at the individual integrated circuits in FIG. 9 based upon the communication command from the battery controller.

In reference to FIG. 10, another embodiment that may be adopted when sequentially setting addresses by transmitting a communication command 292 from the battery controller 20 to the integrated circuits IC1, IC2, IC3, IC4, . . . , ICn−1 and ICn in FIG. 9 is explained.

First, as in the operation described in reference to FIGS. 8 and 9, a communication command 292 carrying a message "initialize the contents in the address registers 348 of all the integrated circuits to, for instance, '0'" is transmitted from the battery controller 20 so as to reset the contents of the data held in the address registers 348 of all the integrated circuits to "0". Next, in step 1 in FIG. 10, the battery controller 20 transmits a communication command 292 carrying a message "designate an integrated circuit with its address set at '0'" (initial value) as a target, change the contents of the data held in the address register 348 thereof to '1' and thus set the address of the target integrated circuit to which the transmitted communication command 292 is directed to '1'". In this situation, the address of the target integrated circuit to which the transmitted communication command 292 is directed may be set to a value other than "1" as long as it is set to a value other than "0" (initial value).

As shown in FIG. 1, the integrated circuit that receives the communication command 292 first is the integrated circuit IC1 (3A) assuming the first position in the transmission path 52. At the communication circuit 127 of the integrated circuit IC1 structured as shown in FIG. 7, the communication command 292 is held in the reception register 322. Since the address register 348 in the integrated circuit IC1 already indicates "0" (initial value), the command processing circuit 344 judges based upon the identifier 328 that the integrated circuit IC1 is a target integrated circuit where the communication command 292 is to be executed as indicated in the message therein. As indicated in the message in the communication command 292, the command processing circuit 344 modifies the contents in the address registers 348 to "1". Then, the contents in the identifier 308 in the transmission register 302 are modified so as to switch the address of the target integrated circuit to execute the communication command 292 to "1". The modified communication command 292 is transmitted from the transmission terminal TX to the succeeding integrated circuit IC2.

The contents of the address of the data held in the address register 348 of the integrated circuit IC2 that receives the communication command 292 next indicate "0" (initial value) and accordingly, the command processing circuit 344 in the integrated circuit IC2 judges that the integrated circuit IC2 is not a target integrated circuit to execute the communication command. Thus, the received communication command 292 is directly set in the transmission register 302 and the unaltered communication command 292 is transmitted to the subsequent integrated circuit. At the integrated circuit IC3 and all subsequent integrated circuits IC, where the contents of the data held in the address registers 348 invariably indicate "0" (initial value), the subject integrated circuits are each judged not to be a target integrated circuit to execute the communication command. Consequently, the communication command 292 is returned to the battery controller 20 without any of the subsequent integrated circuits executing the communication command.

Upon verifying that the communication command 292 has been returned, the battery controller 20 transmits in step 2 in FIG. 10 a communication command 292 carrying a message "designate an integrated circuit with the address thereof indicating '0' (initial value), modify the contents in the address register 348 to '2' and set the address of the target integrated circuit to which the transmitted communication command 292 is directed to '2'". In this situation, the address of the target integrated circuit to which the transmitted communication command 292 is directed may be set to a value other than "2" as long as a given address setting is not replicated. The contents of the data held in the address register 348 of the integrated circuit IC1 that receives the communication command 292 first indicate "1" and accordingly, the command processing circuit 344 in the integrated circuit IC1 judges that the integrated circuit IC1 is not a target integrated circuit to execute the communication command. Thus, the received communication command 292 is directly transmitted to the succeeding integrated circuit IC2.

The value indicated at the address register 348 in the integrated circuit IC2 that receives the communication command next is "0" and, accordingly, its command processing circuit 344 executes the communication command 292, sets "2" at the address register 348, modifies the address of the target to execute the communication command 292 to "2" and then transmits the communication command to the subsequent integrated circuit. Since the values held at the address registers 348 at the integrated circuits IC3 and all subsequent integrated circuits are invariably "0" and thus none of these integrated circuits is an execution target, the communication command 292 is returned to the battery controller 20 without any of the subsequent integrated circuits executing the communication command.

Subsequently, as the battery controller 20 transmits communication commands 292 in sequence, the contents of the address register 348 in the integrated circuit IC3 are modified from "0" to "3", the contents of the address register 348 in the integrated circuit IC4 are modified from "0" to "4" and so forth, until the contents in the address register 348 of the integrated circuit ICn are modified from "0" to "n".

(Adjustment of the States of Charge SOCs)

Figure 11:
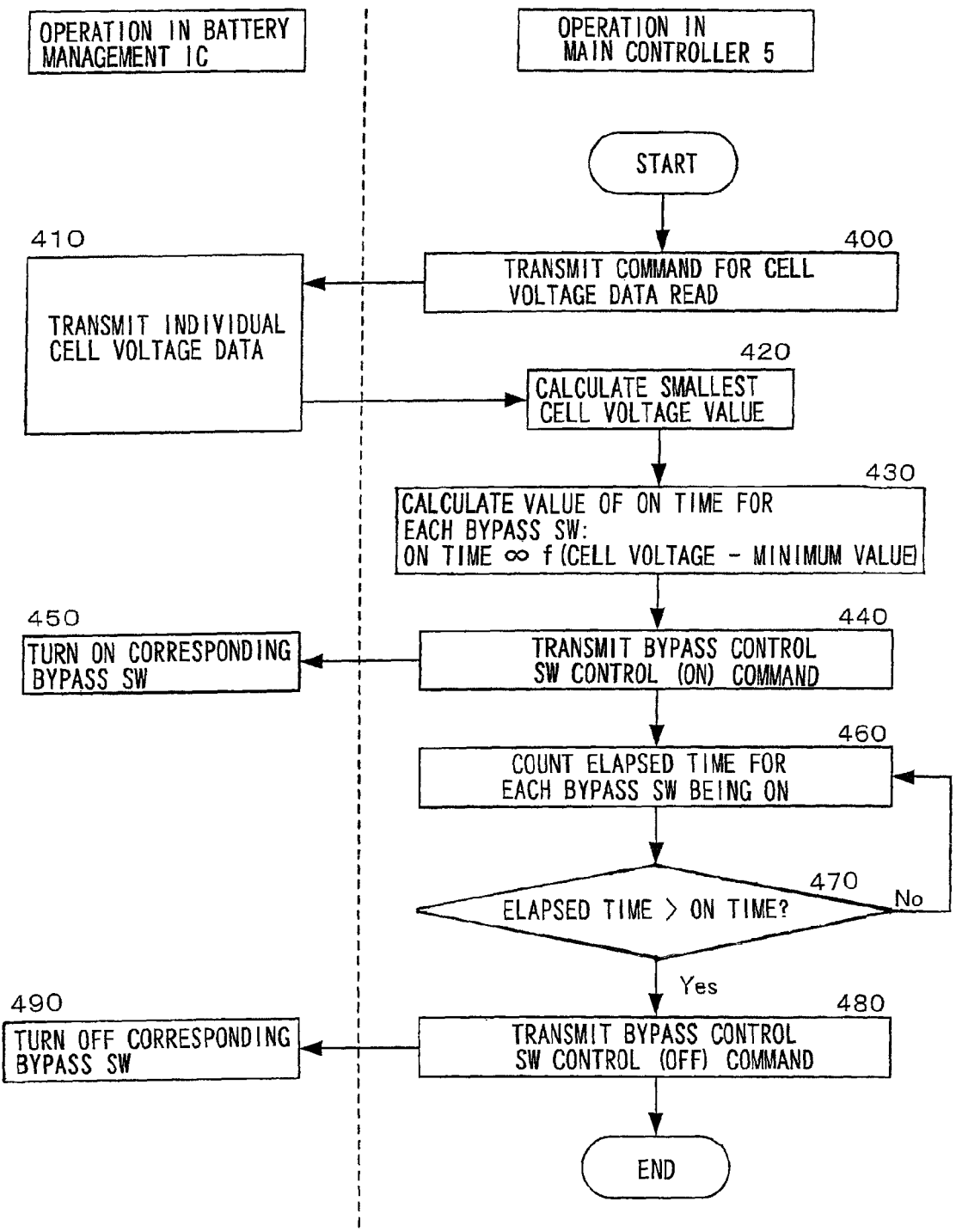
FIG. 11 presents a flowchart of an example of processing through which the state of charge at each battery cell is measured and any battery cell indicating a large charge quantity is discharged.

FIG. 11 presents a flowchart of the processing through which the states of charge SOCs at the battery cells in the battery unit 9 are measured, battery cells charged to significant extents are selected, the required discharge time is determined through arithmetic operation for each of the selected battery cells and the battery cells are discharged accordingly. In the figure, the operation executed at each integrated circuit is indicated on the left side and the operation executed at the battery controller 20 is indicated on the right side.

In step 400 in FIG. 11, the battery controller 20 transmits a communication command 292 for the integrated circuit 3A designated as the command target, requesting that the voltages at the battery cells in the initial state be read. As the integrated circuit 3A receives the communication command 292, the command processing circuit 344 in FIG. 7 sets the contents held at the initial value storage circuit 275 as the data 310 in the transmission register 302 and the data thus set are transmitted to the next integrated circuit (step 410).

The battery controller 20 then designates the integrated circuit succeeding the integrated circuit 3A for the read of the voltages at the battery cells in the initial state. It further takes in the data from the integrated circuits 3M and 3N in sequence. Consequently, the voltage values at all the battery cells in the battery unit 9 in the initial state are taken in from the initial value storage circuit 275 of the individual integrated circuits.

Next, in step 420, the battery controller 20 takes in the values of the voltages measured at all the battery cells in the battery unit 9 and determines through arithmetic operation the state of charge SOC of each battery cell based upon the information thus taken in. The average of the values having been determined through the arithmetic operation is then calculated and, in step 430, the length of time over which the corresponding balancing switch among the balancing switches 129A~129D, needs to remain in a continuous state in order to adjust the SOC of any battery cell indicating a value greater than the average value is calculated. The length of time over which the balancing switch 129A, 129B, 129C or 129D is to remain in the continuous state may be determined through any of various methods other than that described above. Through any of these methods, the length of time over which the balancing switch 129A, 129B, 129C or 129D correlated to the battery cell with the SOC thereof indicating a large value is to remain in the continuous state can be determined.

In step 440, the battery controller 20 transmits a communication command 292 containing information indicating the length of time the balancing switch is to remain in the continuous state to the corresponding integrated circuit.

In step 450, the integrated circuit, having received the information indicating the required length of time sets the balancing switch in the continuous state based upon the command.

In step 460, the length of time elapsing while the balancing switch remains in the continuous state is measured. In step 470, the length of time having elapsed in the continuous state is compared with the required length of time over which the particular balancing switch needs to remain in the continuous state and a decision is made as to whether or not the measured value indicating the elapsed time has become equal to the required length of time having been calculated. Once the measured value indicating the elapsed time becomes equal to the required length of time calculated for the particular balancing switch, the operation shifts into the next step 480.

In step 480, the battery controller 20 transmits a communication command 292 to the corresponding integrated circuit for opening the balancing switch having remained in the continuous state over a length of time matching the calculated length of power supply time. In response to this communication command 292, in step 490, the corresponding integrated circuit sets the target balancing switch specified in the communication command 292 in the open state by stopping the drive signal originating from a switch drive circuit 133. As a result, the discharge of the corresponding battery cell stops.

(Test Executed to Determine Whether or Not the Individual Integrated Circuits and the Like are in an Abnormal State)

Figure 12:
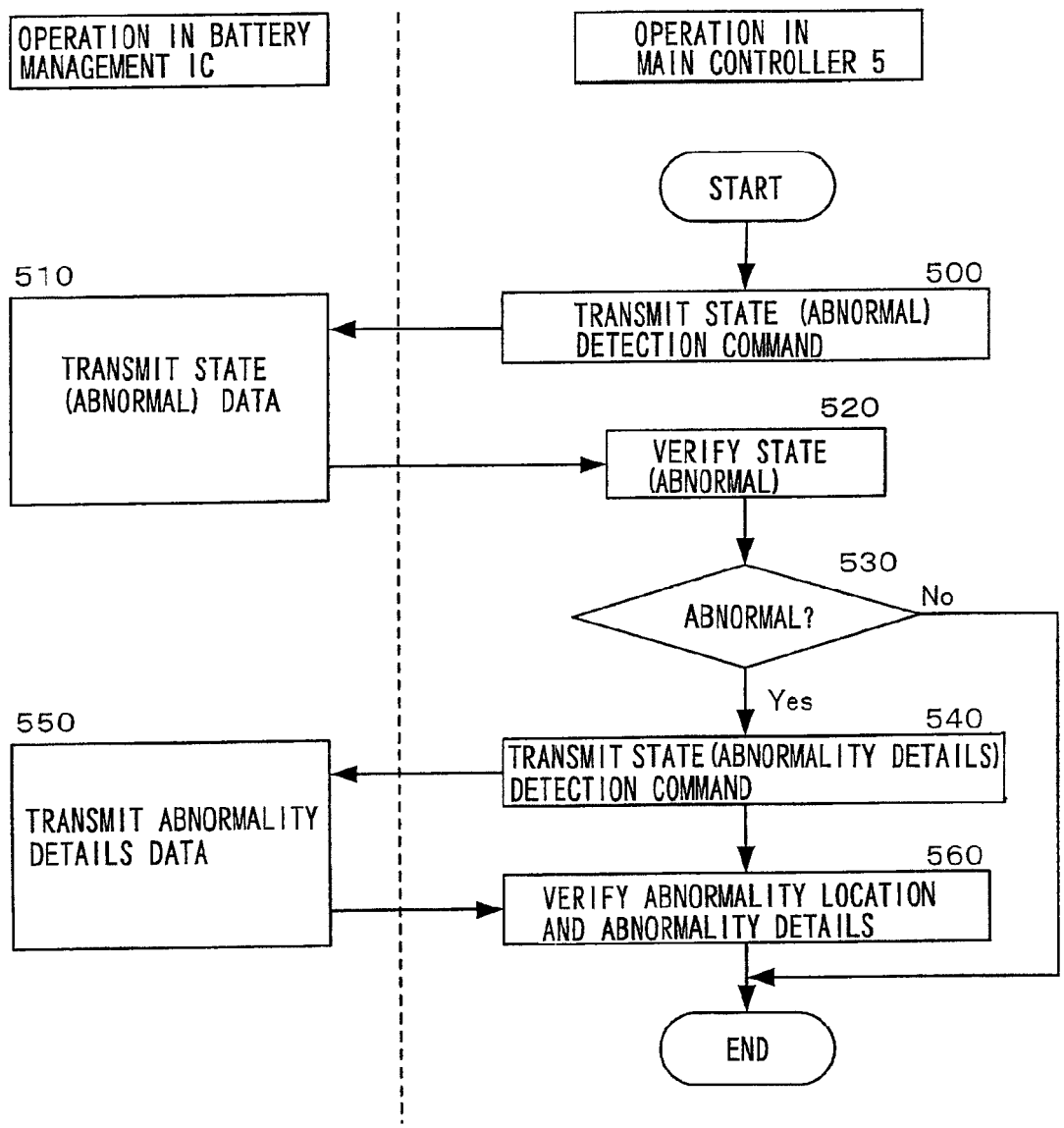
FIG. 12 presents a flowchart of an example of processing through which each integrated circuit or each battery cell is tested for abnormality.

FIG. 12 presents a flowchart of the processing executed to test whether or not the individual integrated circuits 3A, ..., 3M, ... and 3N or the individual battery cells are in an abnormal state. In the figure, the operation executed in each of the integrated circuits 3A, ..., 3M, ... and 3N is indicated on the left side and the operation executed at the battery controller 20 is indicated on the right side.

In step 500, the battery controller 20 transmits a communication command for state (abnormality) detection to the integrated circuit 3A. Next, in step 510, the state (abnormality) detection communication command is transmitted from the integrated circuit 3A to be passed on to the integrated circuits ..., 3M, ... and 3N in sequence before it is ultimately returned to the battery controller 20.

In step 520, the battery controller 20 receives state (abnormality) information having been transmitted from the individual integrated circuits and verifies the states (abnormality) indicated in the received information. Next, in step 530, the battery controller 20 makes a decision as to whether or not an abnormality has occurred at any of the integrated circuits 3A, ..., 3M, ... and 3N or whether or not an abnormality has occurred at any of the battery cells BC1~BC4 in each group. If it is decided that no abnormality has occurred at any integrated circuit or the corresponding battery cells, the flow ends. However, if it is decided that an abnormality has occurred at any of the integrated circuits 3A, ..., 3M, ... and 3N, the operation shifts into step 540.

In step 540, the battery controller 20 transmits a communication command for state (abnormality details) detection to determine the particulars of the abnormality by specifying the address of the integrated circuit where the abnormality has occurred.

In step 550, the integrated circuit with the specified address transmits the measurement value attributed to the abnormal state (abnormality details) or the diagnosis results indicating the abnormal state. In step 560, the battery controller 20 verifies the integrated circuit where the abnormality has occurred and the cause of the abnormality. Once the cause of the abnormality is verified, the processing in FIG. 12 ends. Subsequently, based upon the cause of the abnormality, a decision is made as to whether or not to supply the DC power from the lithium batteries or whether or not to charge the lithium batteries with generated power. In the event of an abnormality, the power supply is stopped by setting the relay disposed between the DC power supply system and the electrical load such as the inverter in the open state.

(Automotive Power Supply System)

FIG. 13 is a circuit diagram of the DC power supply system described above in reference to FIG. 1, adopted in a drive system for an automotive rotating electrical machine. A battery module 900 includes the battery unit 9, the cell controller 80 and the battery controller 20. It is to be noted that the battery cells constituting the battery unit 9 in FIG. 13 are divided into two blocks, a high potential-side block 10 and a low-potential-side block 11. The high potential-side block 10 and the low-potential-side block 11 are connected in series via an SD (service disconnect) switch 6, which is constituted by serially connecting a switch and a fuse and is installed for purposes of maintenance/inspection.

The positive pole of the high potential-side block 10 is connected to the positive pole of an inverter 220 via a positive pole high-rate cable 81 and a relay RLP. The negative pole of the low-potential-side block 11 is connected to the negative pole of the inverter 220 via a negative pole high-rate cable 82 and the relay RLN. The high potential-side block 10 and the low-potential-side block 11, connected in series via the SD switch 6 together constitute a high-rate battery (a battery in a power supply system constituted by connecting in series two battery units 9) with a nominal voltage of, for instance, 340 V and a capacity of 5.5 Ah. It is to be noted that the rated current of the fuse in the SD switch 6 may be, for instance, approximately 125 A. By adopting this structure, an even higher level of safety is assured.

As described earlier, the relay RLN is disposed between the negative pole of the low-potential-side block 11 and the inverter 220 and the relay RLP is disposed between the positive pole of the high potential-side block 10 and the inverter 220. A parallel circuit constituted with a resistor RPRE and a pre-charge relay RLPRE is connected in parallel to the relay RLP. A ammeter Si such as a Hall element or the like, which is installed in a junction box, is inserted between the positive pole-side main relay RLP and the inverter 220. It is to be noted that the output line of the ammeter SI is led out to the battery controller 20 so as to enable the inverter 220 to constantly monitor the quantity of current supplied from the lithium ion battery DC power source.

The rated current of the relays RLP and RLN may be approximately 80 A, whereas the rated current of the pre-charge relay RLPRE may be approximately 10 A. In addition, a resistor with a rated capacity of 60 W and assuming a resistance value of approximately 50 Ω may be utilized as the resistor RPRE. The rated current of the ammeter Si may be approximately ±200 A.

The negative pole high-rate cable 82 and the positive pole high-rate cable 81 are connected to the inverter 220 that drives a motor 230 of a hybrid vehicle, via the relay RLP and the relay RLN respectively and also via the output terminals 810 and 820. This structure assures a high level of safety.

The inverter 220 is constituted with a power module 226, an MCU 222, a drive circuit 224 via which the power module 226 is driven and a large capacity smoothing capacitor 228 with a capacity of approximately 700 μF~2000 μF. The power module 226 constitutes an inverter that converts the DC power supplied from the high-rate battery power source with a nominal voltage of 340 V to three-phase AC power to be used to drive the motor 230. A smoothing capacitor 228 constituted with a film capacitor rather than an electrolytic capacitor will provide better characteristics. The environment surrounding the vehicle is a factor that determines the condition under which the smoothing capacitor 228 installed in the vehicle operates. The smoothing capacitor 228 is likely to operate over a wide temperature range of, for instance, from a low temperature such as −20° C. or −30° C. to 100° C. When the temperature becomes lower than 0° C., the characteristics of an electrolytic capacitor will drastically deteriorate and its voltage noise removal performance will be negatively affected. Under such circumstances, the integrated circuits shown in FIGS. 1 and 2 may be subjected to very significant noise. The characteristics of a film capacitor, on the other hand, are not significantly compromised even at very low temperatures and thus, voltage noise applied to the integrated circuits can be effectively reduced with the film capacitor.

In response to an instruction issued from a higher-order controller 110, the MCU 222 charges the smoothing capacitor 228 by first switching the negative pole-side relay RLN from the open state to the closed state and then switching the pre-charge relay RLPRE from the open state to the closed state to drive the motor 230. Subsequently, it switches the positive pole-side relay RLP from the open state to the closed state thereby starting power supply from the high-rate batteries in the battery module 900 to the inverter 220. It is to be noted that when braking the hybrid vehicle, the inverter 220 executes regenerative braking control by controlling the phase of the AC power generated at the power module 226 relative to the rotor of the motor 230 and engaging the motor 230 in operation as a generator, so as to charge the high-rate batteries with the power regenerated through generator operation. If the state of charge at the battery unit 9 becomes lower than the reference level, the inverter 220 engages the motor 230 in operation as a power generator and charges the battery unit 9. The three-phase AC power generated at the motor 230 is converted to DC power via the power module 226 and the DC power resulting from the conversion is then supplied to the battery unit 9 constituted with the high-rate battery.

As described above, the inverter 220, which includes the power module 226, executes DC/AC power conversion. When the motor 230 is to be engaged in operation as a motor in response to an instruction issued by the higher-order controller 110, the drive circuit 224 is controlled so as to generate a rotating magnetic field along the advancing direction relative to the rotation of the rotor in the motor 230 in order to control the switching operation at the power module 226. In this situation, DC power is supplied from the battery unit 9 to the power module 226. The drive circuit 224 may instead be controlled so as to generate a rotating magnetic field along the retarding direction relative to the rotation of the rotor in the motor 230 to control the switching operation at the power module 226. Under such circumstances, power is supplied from the motor 230 to the power module 226 and DC power from the power module 226 is then supplied to the battery unit 9. As a result, the motor 230 functions as a power generator.

The power module 226 in the inverter 220 executes on/off operation at high speed to achieve DC/AC power conversion. At this time, a large electric current may be cut off at high-speed and, in such a case, a significant voltage fluctuation will occur due to the inductance of the DC circuit. The large capacity smoothing capacitor 228 is installed in the DC circuit in order to inhibit such a voltage fluctuation. The heat generated at the power module 226 poses a serious problem in the on vehicle inverter 220 and the speed with which the power module 226 is switched into the continuous state and the cut off state must be increased in order to inhibit heat generation. However, if the operation speed is raised, the extent to which the voltage jumps due to inductance also increases, which, in turn, generates more noise. For this reason, the smoothing capacitor 228 tends to assume a greater capacity.

At the start of operation of the inverter 220, the smoothing capacitor 228 holds substantially no electrical charge and, as the relay RLP is closed, a large initial current starts to flow in. Since the large initial current flows into the smoothing capacitor 228 from the high-rate battery, the negative pole-side main relay RLN and the positive pole-side main relay RLP may become fused and damaged. In order to prevent this, the MCU 222 first switches the negative pole-side relay RLN from the open state to the closed state, switches the pre-charge relay RLPRE from the open state to the closed state while holding the positive pole-side relay RLP in the open state and charges the smoothing capacitor 228 by regulating the maximum current via the resistor RPRE. Once the smoothing capacitor 228 is charged to a predetermined voltage, the initial state is cleared and the negative pole-side relay RLN and the positive pole-side relay RLP are set in the closed state so as to supply the DC power from the battery module 900 to the power module 226 without engaging the pre-charge relay RLPRE or the resistor RPRE in operation. Under this control, the relay circuit is effectively protected and the maximum current that may flow through the lithium ion battery cells and the inverter 220 is regulated so as not to exceed a predetermined value, thereby assuring a high level of safety.

Since the occurrence of noise voltage can be inhibited by reducing the inductance in the DC-side circuit of the inverter 220, the smoothing capacitor 228 is disposed in close proximity to a DC-side terminal of the power module 226. In addition, the smoothing capacitor 228 itself assumes a structure that reduces the inductance. As the smoothing capacitor 228 structured as described above undergoes the initial charge, a large electrical current flows in momentarily and significant heat generated at this time may damage the smoothing capacitor. However, the extent of such damage can be lessened via the pre-charge relay RLPRE and the resistor RPRE. While the MCU 222 controls the inverter 220, the initial charge of the smoothing capacitor 228 is also executed under control of the MCU 222.

A capacitor CN is inserted between a connecting cable, which connects the negative pole of the high-rate battery in the battery module 900 with the negative pole-side relay RLN, and the case ground (assuming a potential equal to that at the vehicle chassis). A capacitor CP is inserted between a connecting cable, which connects the positive pole of the high-rate battery with the positive pole-side relay RLP, and the case ground. The capacitors CN and CP are installed in order to prevent erroneous operation of the low-rate electrical circuit and destruction of the integrated circuit constituting the cell controller 80 due to a surge voltage, by eliminating noise generated via the inverter 220. While the inverter 220 includes a noise removal filter, the capacitors CN and CP are installed so as to even more effectively prevent erroneous operations of the battery controller 20 and the cell controller 80 and improve the noise withstanding reliability of the battery module 900. It is to be noted that in FIG. 13, the high-rate electrical circuit in the battery module 900 is indicated by the bold line. The high-rate electrical circuit is wired by using a flat copper wire with a large sectional area.

It is to be noted that a blower fan 17 in FIG. 13, which cools the battery unit 9, is engaged in operation via a relay 16 that is turned on in response to a command from the battery controller 20.

(Operational Flow in the Automotive Power Supply System)

Figure 14:
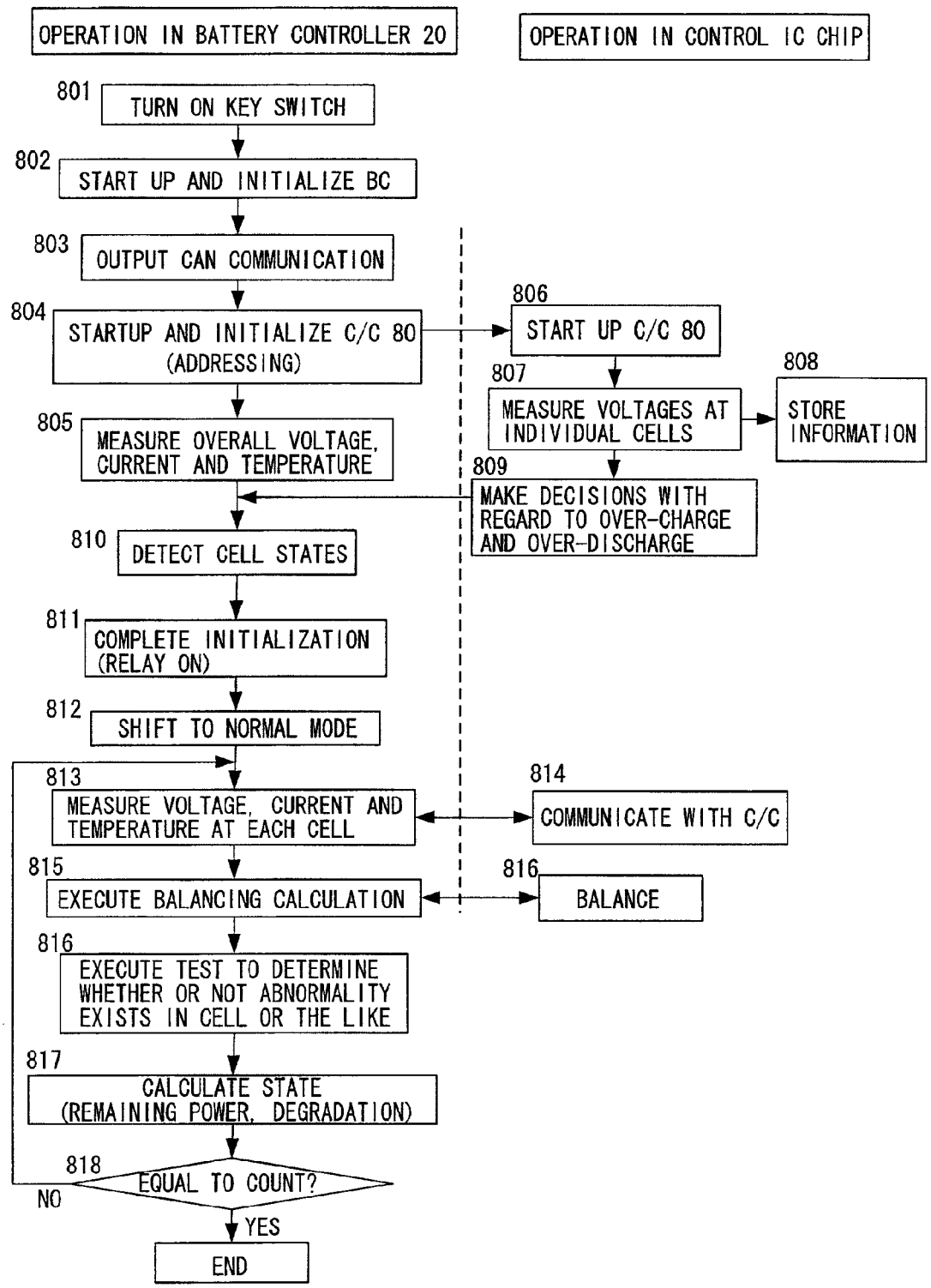
FIG. 14 presents a flowchart of an example of an operation that may be executed in the battery system for vehicle in FIG. 13.

FIG. 14 presents a flowchart of the operation executed in the automotive power supply system shown in FIG. 13. The following is a step by step description of the operational flow.

In step 801, as the key switch in the vehicle is turned on to start the engine, a specific operation is performed to switch the vehicle in a stationary state to a traveling state or the integrated circuits shift from the sleep state to the wake-up state. Then in step 802, the battery controller 20 is started up and initialized.

CAN communication is executed in step 803. As a result, a blank message is output to each controller so as to verify the state of communication among the individual control devices. In step 804, the battery controller 20 transmits a startup/initialization communication command 292 to the cell controller 80.

Upon receiving the communication command 292, the integrated circuits 3A, . . . , 3M, . . . and 3N each enter the wake-up state, the startup circuit 254 in FIG. 4 in each integrated circuit starts operation and the address registers 348 in the individual integrated circuits are initialized based upon the output from the command processing circuits 344 described in reference to FIG. 7. Subsequently, new addresses are set at the individual integrated circuits IC as has been explained in reference to FIGS. 8 and 10.

In step 805, the voltage and the current at the overall battery constituted with the individual battery cells all connected in series are respectively detected via the voltmeter Vd and the ammeter Si shown in FIG. 1 and the outputs are input to the battery controller 20. In addition, a temperature sensor (not shown) measures the temperature.

In addition, as the startup/initialization communication command 292 is received at the cell controller 80 in step 804 and each of the integrated circuits 3A, . . . , 3M, . . . and 3N receives the communication command 292, the first stage counter 256 and the second stage counter 258 at each integrated circuit described in reference to FIG. 4, start operation (step 806) and the measurement operation is executed repeatedly as indicated in the operation table 260 (step 807). As has been described in reference to FIGS. 4 and 6, the integrated circuits each measure the terminal voltages at the battery cells therein in step 807. The measurement values thus obtained are then stored into the current value storage circuit 274 and the initial value storage circuit 275 (step 808). Based upon the results of the battery cell voltage measurement executed in step 807, the integrated circuits each make a decision in step 809 with regard to whether or not any of the battery cells is over-charged or over-discharged. In the event of an abnormality, the diagnosis flag is set in the flag storage circuit 284 in FIG. 5 and thus, the battery controller 20, detecting the diagnosis flag, is able to detect the abnormality. Since the individual integrated circuits execute the battery cell voltage measurement and the battery cell abnormality diagnosis independently of one another, the states of all the battery cells can be diagnosed quickly even if the battery unit 9 is constituted with numerous battery cells. Consequently, the states of all the battery cells are diagnosed before turning on the relays RLP and RLN, assuring a high level of safety.

Upon verifying that the state of each battery cell has been detected in step 810, the initialization is completed in step 811 and also, it is verified that no abnormal state exists if no diagnosis flag has been set in a flag storage circuit 284. Once it is verified that no abnormality has occurred, the relay RLN in FIG. 13 is closed, then the relay RLPRE is closed and finally the relay RLP is closed. As the relays are closed, the DC power supply from the battery unit 9 to the inverter 220 starts.

The length of time to elapse between step 801 in which the key switch is turned on and the time point at which the power supply is enabled can be set to approximately 100 ms or less. Since the DC power supply is enabled quickly, as described above, the driver's desire to start the vehicle immediately is fully satisfied.

Furthermore, during this very short period of time, addresses are set at the various integrated circuits, the integrated circuits each measure the voltages at all the battery cells in the corresponding group, the measurement results are stored into the initial value storage circuit 275 shown in FIG. 5 and the abnormality diagnosis is completed.

The voltages at the battery cells are measured before the relays RLP, RLN and RLPRE are turned on, i.e., before the inverter 220 and the battery unit 9 become electrically connected with each other. In other words, the voltages at the battery cells are measured before starting the power supply to the inverter 220 and thus, accurate detection of the states of charge SOCs is enabled based upon the terminal voltages at the battery cells measured prior to the current supply.

Subsequently, the operation enters a normal mode in step 812 and the voltages, the currents and the temperatures at the individual cells are measured in step 813. The measurement is executed through communication with the cell controller 80 in step 812. It is to be noted that the temperatures are measured based upon the outputs from temperature sensors (not shown).

Then, based upon the measurement values indicating the voltages and the currents at the individual battery cells measured prior to the current supply start, and also based upon the temperature measurement values as necessary, the required lengths of discharge time (balancing time) are calculated in step 815. Based upon the calculation results, information indicating the lengths of time over which the balancing switches 129A, 129B, 129C and 129D in FIG. 2 are to remain in the continuous state is transmitted to each integrated circuit. In step 816, the integrated circuits each execute control under which the balancing switches remain closed based upon the required lengths of time over which they are to remain in the continuous state. This operation is executed through the flow shown in FIG. 11.

In step 817, a test is executed to determine whether or not an abnormality has occurred at any of the integrated circuits 3A~3N or at any of the battery cells. Next, in step 818, the state of each battery cell, indicating the remaining power available therein, the extent of degradation of the battery cell or the like is determined through arithmetic operation.

In step 818, a decision is made as to whether or not the length of time counted for each target balancing switch among the balancing switches 129A, 129B, 129c and 129D has become equal to the corresponding required length of time over which the balancing switch is to remain in the continuous state, having been determined through the arithmetic operation. If the measured length of time is still not equal to the required length of time, the operation returns to step 813 to repeatedly calculate the required length of balancing time in step 816, execute the test in step 817 and determine the state of each battery cell through arithmetic operation in step 818.

Once it is decided in step 818 that the length of time measured for the target balancing switch 129A, 129B, 129C or 129D has become equal to the required length of time over which it is to remain in the continuous state, an instruction for stopping the discharge operation by setting the target balancing switch 129A, 129B, 129C or 129D having remained in the continuous state over the required length of time, is set in the open state is transmitted from the battery controller to the corresponding integrated circuit. Since the discharge control, under which the target balancing switch is closed for discharge, is selectively executed only for battery cells indicating high SOC levels in the battery unit 9, the balancing switches for battery cells with low SOC values remain in the open state throughout. As explained earlier, the state of charge SOC in each battery cell in the battery unit 9 is determined through arithmetic operation, the required length of time over which the balancing switch corresponding to each battery cell is to remain in the continuous state is calculated and the required length of time thus calculated is held in a storage device at the battery controller 20. Since the required length of time over which each balancing switch is to remain in the continuous state is determined based upon the SOC of the corresponding battery cell, varying lengths of time are normally calculated for the individual balancing switches. It is naturally conceivable that there are battery cells that do not require the corresponding balancing switches to be set in the continuous state at all. For this reason, the length of time over which power is to be supplied to each battery cell is compared to the length of time having been counted in correspondence to the particular battery cell in step 818 and a command for stopping discharge of the battery cell having been supplied with power over the required length of time is transmitted to the integrated circuit controlling the discharge of the specific battery cell.

(Communication End Sequence)

Figure 15:
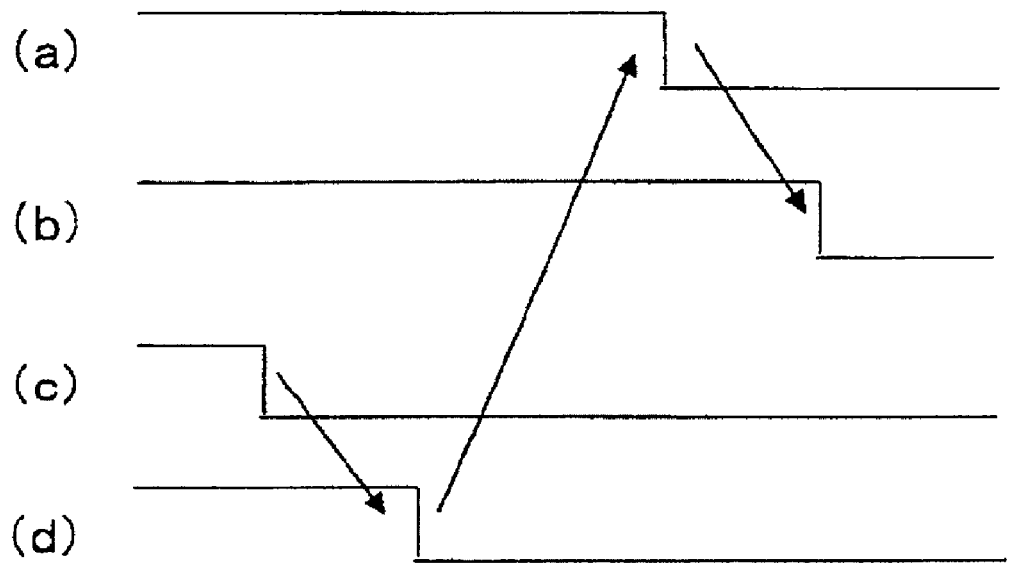
FIG. 15 presents an example of the sequence through which communication between the battery controller and the cell controller is terminated in the battery system for vehicle.

FIG. 15 illustrates the sequence through which the communication between the battery controller 20 and the cell controller 80 in the automotive power supply system shown in FIGS. 1 and 13 may be terminated.

FIG. 15(a) indicates the timing with which the power supply via the power (Vc) terminal of the battery controller 20 is stopped. FIG. 15(b) indicates the timing with which the power supply at the photocouplers PH 1 and PH 2 in the entry-side interface INT(E) constituting an insulating circuit and the photocouplers PH 3 and PH 4 in the exit-side interface INT(O) constituting another insulating circuit stops. FIG. 15(c) indicates the timing with which transmission to and reception from the battery controller 20 via the TX terminals and the RX terminals stops. FIG. 15(d) indicates the timing with which output of a signal originating from the battery controller 20 and transmitted via the wake-up terminal stops.

As the figure clearly indicates, transmission to and reception from the battery controller 20 via the TX terminals and the RX terminals are first stopped. Then, if a signal from the battery controller 20 provided via the wake-up terminal is being used in the system, the transmission of the signal is stopped. Next, the power supply is stopped at the power (VC) terminal of the battery controller 20 and subsequently, the power supply to the photocouplers PH 1 and PH 2 in the entry-side interface INT(E) constituting an insulating circuit and the photocouplers PH 3 and PH 4 at the exit-side interface INT(O) constituting an insulating circuit is also stopped.

By stopping the operation at the individual units in this order, the integrated circuits can be set into the sleep state reliably.

Figure 16:
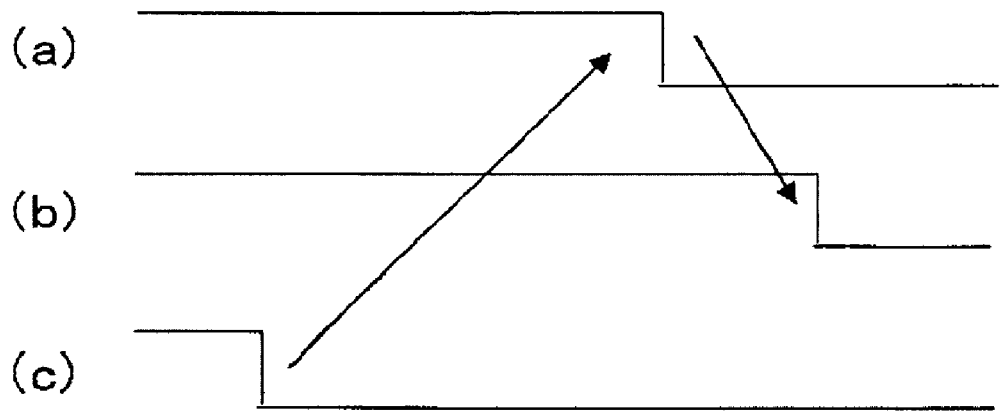
FIG. 16 presents another example of the sequence through which communication between the battery controller and the cell controller is terminated in the battery system for vehicle.

It is to be noted that FIG. 16 illustrates the operation in a system that does not utilize a signal provided through a wake-up terminal, unlike the system whose operation is illustrated in FIG. 15. Since a signal provided through the wake-up terminal is not utilized, the signal transmission does not need to be stopped, unlike in the system in the other system in which the signal transmission is stopped with the timing indicated in FIG. 15(d). The other aspects of the operational sequence are identical to those in FIG. 15.

(Structures of Individual Integrated Circuits and Battery Cells in the Corresponding Groups)

In the embodiment described earlier, all the battery cell groups are made up with equal numbers of battery cells with four battery cells connected to each of the integrated circuits 3A, . . . , 3M, . . . and 3N corresponding to specific battery cell groups. The integrated circuits 3A, . . . , 3M, . . . and 3N each obtain information indicating the voltages and the like from the four battery cells connected thereto and each control charge/discharge of the four battery cells therein. In other words, the integrated circuits 3A, . . . , 3M, . . . and 3N handle equal numbers of battery cells.

Figure 17:
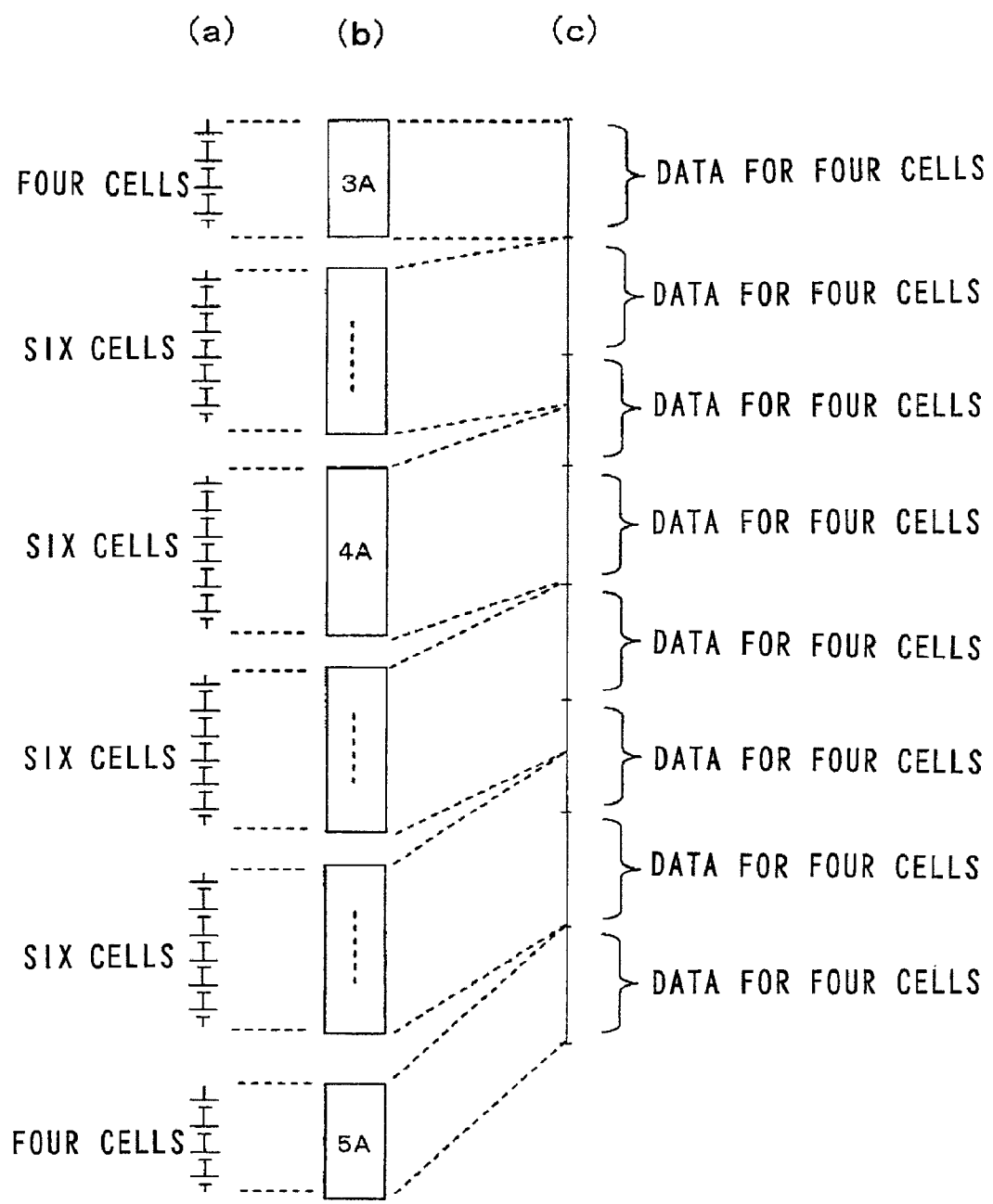
FIG. 17 shows an example of battery groups made up with varying numbers of battery cells.

Alternatively, the various battery cell groups in the battery unit 9 may be made up with different numbers of battery cells, as shown in FIG. 17. In such a case, the overall number of battery cells to constitute the battery unit 9 can be selected freely without having to limit it to a multiple of the number of groups. FIG. 17(a) indicates the numbers of battery cells making up the individual groups and FIG. 17(b) indicates the integrated circuits corresponding to the specific battery cell groups. In this case, varying numbers of sets of data, indicating the battery cell terminal voltages, will be held at the current value storage circuits 274 and the initial value storage circuits 275 installed in the individual integrated circuits. While varying numbers of sets of data may be transmitted to the battery controller 20 in response to a request from the battery controller 20, the data may be sorted so that they are transmitted in batches made up with equal numbers of sets of data, as shown in FIG. 17(c). By transmitting and receiving such a fixed number of sets of data, as described above, the transmission reliability can be improved.

As indicated in FIG. 17(b), the battery cell groups corresponding to the integrated circuits 3A, . . . , 3M, . . . and 3N are made up with varying numbers of battery cells. As FIG. 17(a) indicates, the battery cell groups corresponding to the highest-stage integrated circuit 3A and the lowest-stage integrated circuit 3N each include four battery cells, fewer than the number of battery cells making up the other battery cell groups. Battery cell groups other than those corresponding to the highest-stage and lowest-stage integrated circuits in the battery unit 9 each include a greater number of battery cells, e.g., 6, than the number of battery cells (i.e., 4) constituting the highest-stage and lowest-stage groups.

The integrated circuit 3A assuming the highest potential and the integrated circuit 3N assuming the lowest potential are connected to the battery controller 20 via insulating circuits constituted with the photocouplers PH 1 and PH 4, as explained earlier. It is desirable to set the voltage tolerance of the photocouplers PH 1 and PH 4 to a lower level from the viewpoint of safety and cost performance. By reducing the numbers of battery cells to constitute the battery cell groups corresponding to the integrated circuits connected with the photocouplers PH 1 and PH 4, the required photocoupler voltage tolerance level can be lowered. Namely, if six battery cells are connected to constitute each of the battery cell groups corresponding to the highest-order integrated circuit 3A and the lowest-order integrated circuit 3N, the required voltage tolerance of the photocouplers connected between the integrated circuits and the battery controller 20 will need to be greater than the highest terminal voltage among the terminal voltages at the six battery cells. In other words, when a battery cell group is made up with a greater number of battery cells, the required voltage tolerance rises.

The highest-order integrated circuit 3A and the lowest-order integrated circuit 3N in the embodiment each hold four sets of data indicating the terminal voltages at the four battery cells. Thus, they each exchange data related to the four battery cells through communication with the battery controller 20. In addition, the other integrated circuits including the integrated circuit 3M each hold data with data collected at the six battery cells, which need to be transmitted to the battery controller 20.

As indicated in FIG. 17(c), the data related to all the battery cells are transmitted/received in sequence in units of data corresponding to four battery cells. Namely, the first batch of data is constituted with the data related to the four battery cells connected to the integrated circuit 3A, the next batch of data is constituted with the data related to the four battery cells disposed on the highest-stage side among the data related to the six battery cells connected to the integrated circuit at the second stage, the next batch of data is constituted with the data related to the two battery cells disposed on the lower stage side among the data related to the six battery cells connected to the integrated circuit at the second stage and the data related to the two battery cells disposed on the highest-stage side among the data related to the six battery cells connected to the integrated circuit at the third stage, . . . , and the last batch of data is constituted with the data related to the four battery cells connected to the integrated circuits 3N at the last stage.

The volume of data that can be transmitted at a time through the communication between, for instance, the battery controller 20 and the higher-order controller 110 in the automotive power supply system shown in FIG. 13 is limited (e.g., the upper limit to the data volume may be equivalent to the data volume corresponding to four battery cells). Accordingly, by adopting the structure shown in FIG. 17(*c*) for the battery unit 9, signals can be transmitted/received in a volume never exceeding the upper limit, so as to assure highly reliable signal exchange.

In the embodiment described above, the uppermost-stage integrated circuit 3A and the lowermost-stage integrated circuit 3N are each connected with four battery cells and other integrated circuits are each connected with six battery cells. However, the present invention is not limited to this example and similar advantages can be achieved as long as fewer battery cells are connected to the uppermost-stage and lowermost-stage integrated circuits 3A and 3N, compared to the number of battery cells connected to the other integrated circuits. In addition, if either the uppermost-stage integrated circuit 3A or the lowermost-stage integrated circuit 3N is connected with a smaller number of battery cells than the other, the voltage tolerance level of the photocoupler corresponding to the integrated circuit connected with the smaller number of battery cells can be lowered.

Furthermore, in the embodiment described above, data are exchanged in sequence in batches each constituted with data related to four battery cells, even though the varying numbers of battery cells are connected to the individual integrated circuits. However, the battery cell data batches do not need to be prepared in the four-battery cell units and similar advantages can be achieved as long as battery cell data are exchanged in batches prepared in units each corresponding to a number of battery cells smaller than the largest number of battery cells among the varying numbers of battery cells connected to the individual integrated circuits.

(Battery Module Structure)

Figure 18:
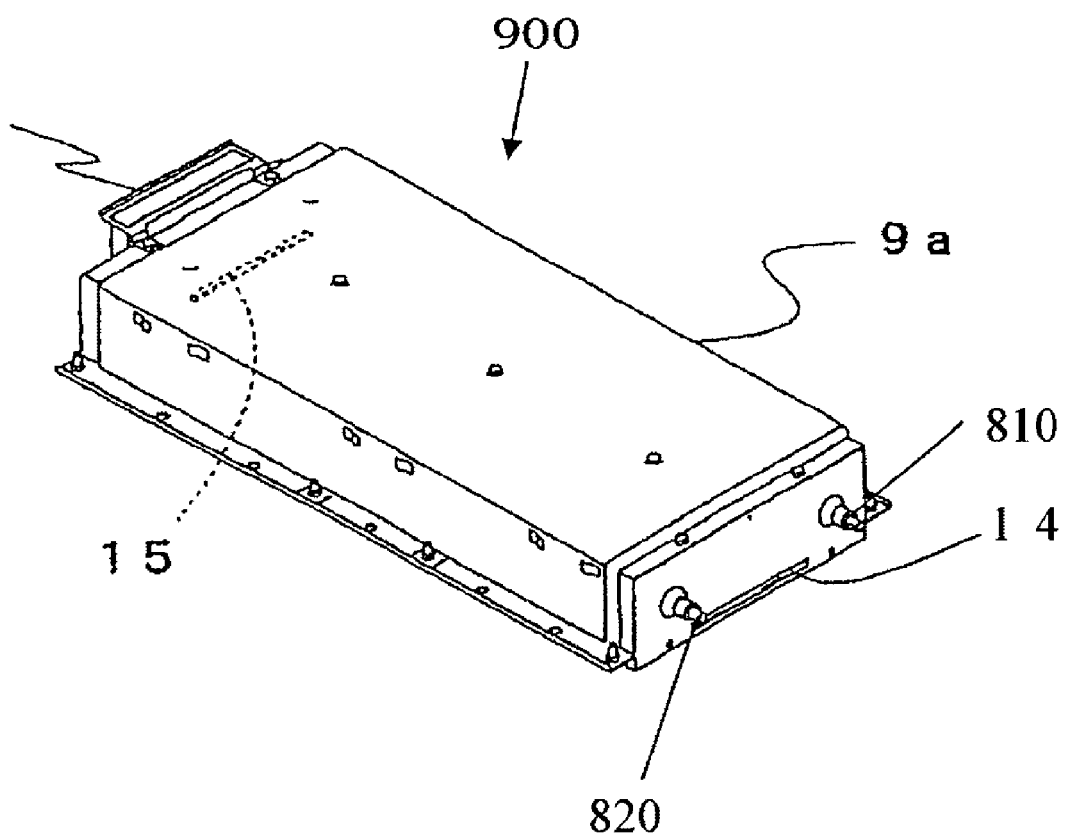
FIG. 18 is an external perspective view of a battery module 900.
Figure 19:
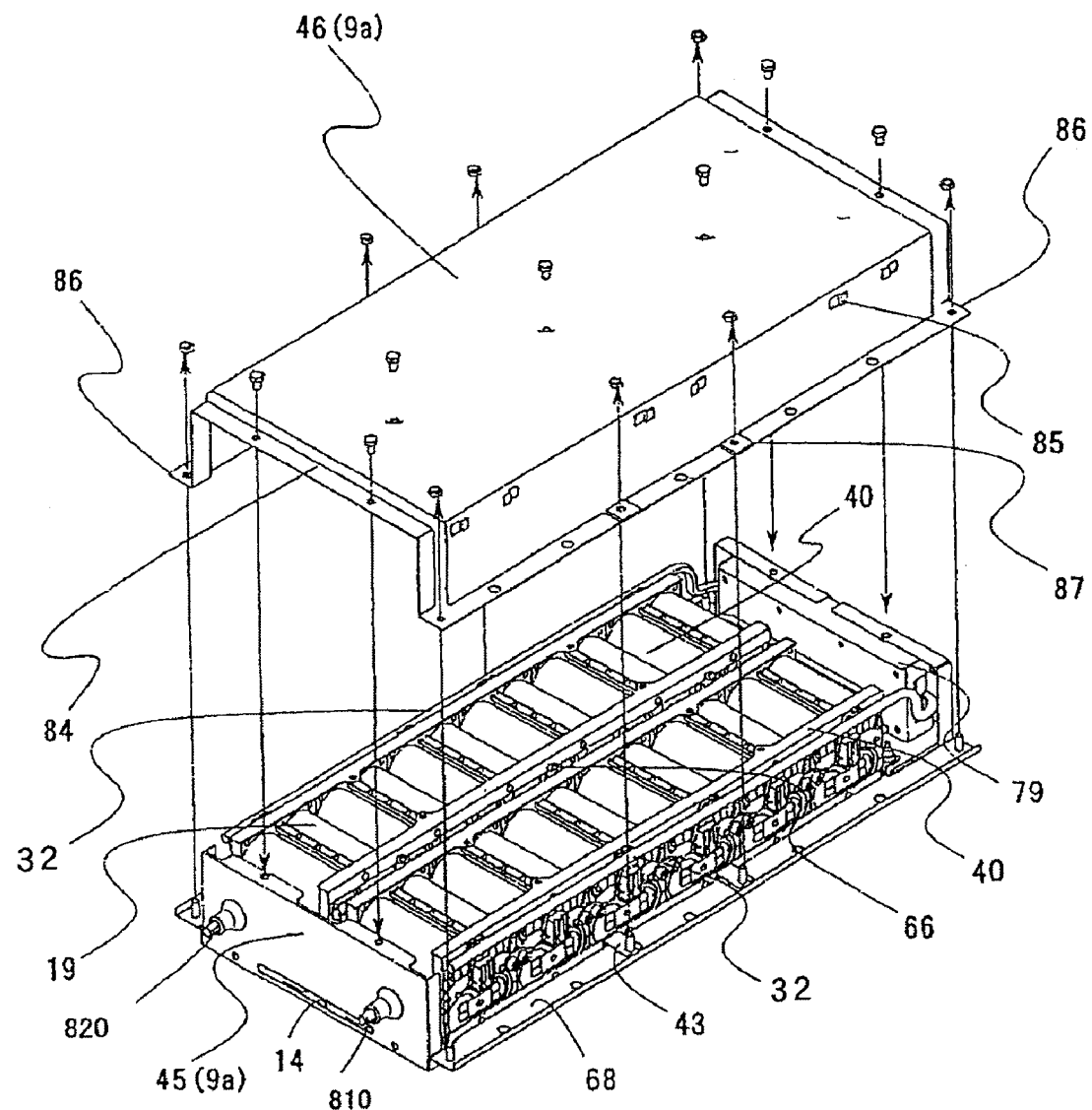
FIG. 19 is an exploded perspective view of the battery module 900.

FIGS. 18 and 19 present a specific structural example that may be adopted in the battery module 900 constituted with the battery unit 9 and the cell controller 80. The battery module 900 includes a cuboid metal battery case 9*a* constituted with an upper lid 46 and a lower lid 45. The battery module 900 also includes output terminals 810 and 820 via which DC power is supplied to a power-consuming device or received from a power-generating device such as the inverter 220. A plurality of battery assemblies 19 are housed and fixed within the battery case 9*a*. While numerous wirings are laid out within the battery case 9*a* for purposes of voltage and temperature detection, these wirings are electrically protected against external noise with the metal battery case 9*a* enclosing the battery module 900. In addition, as explained earlier, since the battery cells are protected via the battery case 9*a* and an outer container encasing the battery case, the power supply system safety is assured even in the event of a traffic accident.

The battery cells in the embodiment are lithium secondary batteries assuming a columnar shape, each made up with a positive pole active substance constituted of a lithium-manganese double oxide and a negative pole active substance constituted of amorphous carbon. The battery cells are each encased within a casing achieving a high level of thermal conductivity. While the nominal voltage and the capacity of such a battery cell constituted with a lithium secondary battery are respectively 3.6 V and 5.5 Ah, the terminal voltage at the battery cell fluctuates as the state of charge changes. The terminal voltage may become as low as 2.5 V as the SOC level at the battery cell decreases, whereas it may rise as high as 4.3 V as the SOC level at the battery cell increases.

Since the structure assumed in the battery cells in the embodiment facilitates connections of a detection harness 32, the high-rate cables 81 and 82 and the like, a high level of safety is maintained with even greater reliability.

Figure 20:
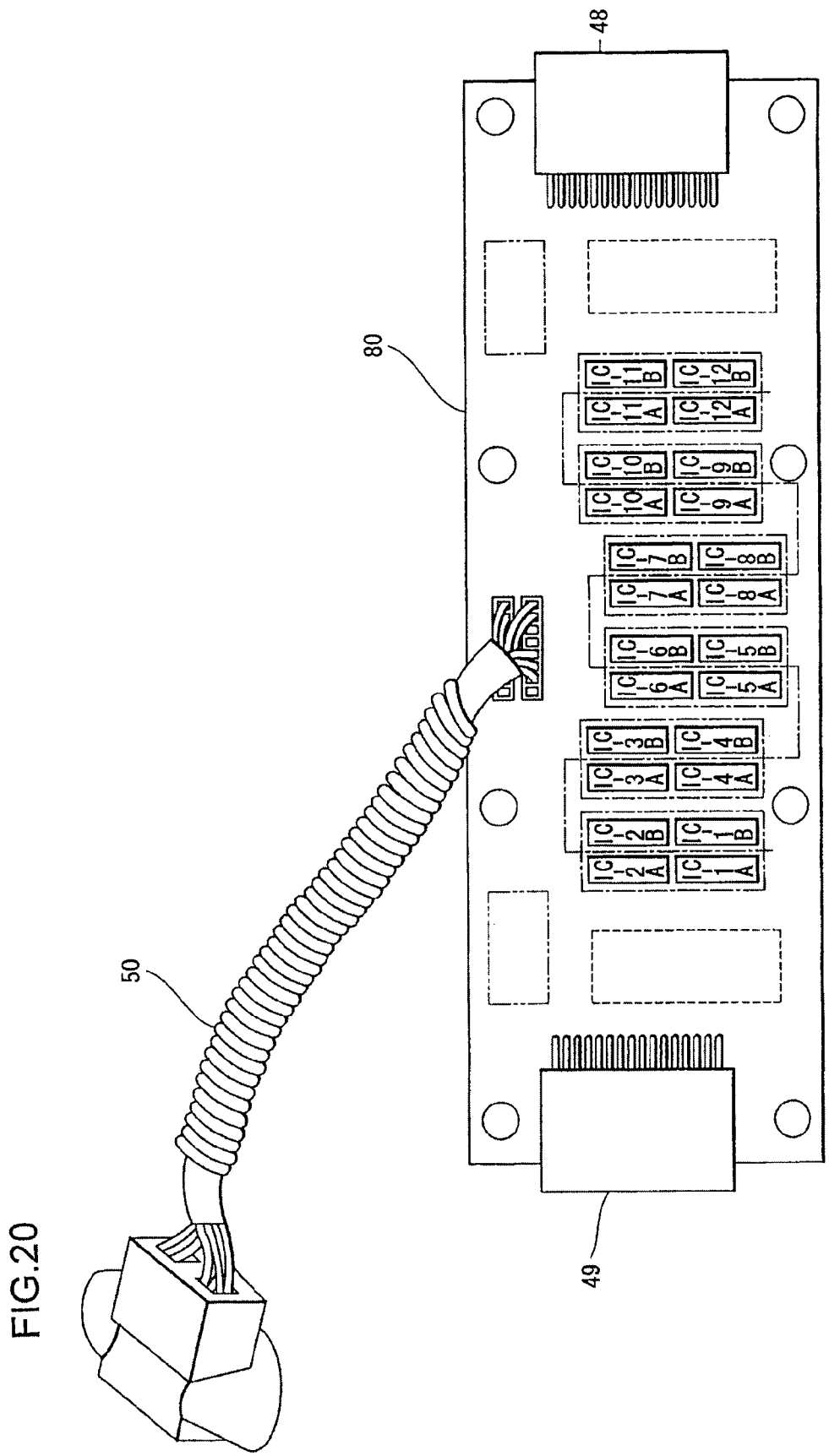
FIG. 20 is a plan view presenting an example of a cell controller built into the battery module 900.

As illustrated in FIGS. 18 and 19, two battery blocks 10 and 11 are fixed side-by-side at the lower lid 45. At one end of the lower lid, a cell controller box (C/C box) 79 with a built-in cell controller (hereafter referred to as a C/C) 80, to be described in reference to FIG. 20 is fixed via screws. As shown in FIG. 20, the C/C 80 is constituted with a single substrate assuming a laterally elongated shape with wirings printed on both sides thereof. The C/C 80 is fixed in the C/C box 79 in an upright orientation with screws threaded through round holes formed at four positions, i.e., at two positions on the upper side and two positions on the lower side. The substrate with ICs formed thereupon is disposed so as to face opposite the side surfaces of the battery cells constituting the battery assemblies. This structure allows the entire battery module 900 to be fitted within a relatively small space. In addition, the individual battery assemblies and the C/C 80 can be wired relatively easily.

Connectors 48 and 49, disposed over a distance from each other at the two ends of the substrate constituting the C/C 80 on the left side and the right side, connect with the individual battery cells constituting the battery blocks 10 and 11 via the detection harness 32. A harness connector (not shown) mounted on one side of the detection harness 32 toward the substrate is connected to the connectors 48 and 49 at the C/C 80. Namely, as shown in FIG. 19, the detection harness 32 is installed in correspondence to each of the battery blocks 10 and 11. The C/C 80 is equipped with the two connectors 48 and 49 in correspondence to the two split battery blocks 10 and 11 housed within the battery case to constitute the battery module 900. Since the two battery assembly blocks 10 and 11 are connected via the connectors, the maintenance and the wiring operation are facilitated. One of the connectors 48 and 49 is used to connect with the serially connected battery cells on the high-voltage side, whereas the other connector 48 or 49 is used to connect with the serially connected battery cells on the low-voltage side. In other words, the connection between the serially connected battery cells and the C/C 80 is achieved over a plurality of blocks based upon the potentials of the serially connected battery cells so as to connect the battery cells with the C/C 80 via a plurality of connectors each corresponding to one of split blocks divided in correspondence to specific potential levels. Through these measures, the potential differential manifesting within the connection achieved via the connectors can be minimized. By adopting this structure, outstanding advantages with regard to voltage tolerance, prevention of current leakage and dielectric breakdown are achieved. In addition, when connecting or disconnecting the various connectors, all the connectors cannot be connected or disconnected at once, giving rise to a situation in which only some of the connectors are in the connected state during a connecting or disconnecting process. By adopting the structure described above, the difference among the voltages at the individual connectors can be reduced so as to minimize the adverse electrical effect that may be attributable to the state of partial connection occurring during the connecting or disconnecting process.

In addition, a plurality of ICs are formed at the substrate constituting the C/C 80, in correspondence to the serially connected battery cells housed in the battery module 900. The number of battery cells to be handled via a single IC is determined based upon the processing capability of the IC. In the embodiment, a single IC is utilized in correspondence to four battery cells. However, a single IC may be used in correspondence to five or six battery cells instead. Alternatively, a single system may include a block where ICs are each used in correspondence to four battery cells and a block where ICs are each used in correspondence to six battery cells. The total number of serially connected battery cells does not need to be a multiple of the optimal number of battery cells that can be handled via a single IC. While the number of serially connected battery cells is a multiple of four in the embodiment, the quantity of serially connected battery cells may not always be a multiple of four and thus, the numbers of battery cells handled via the individual ICs may vary within the same system without problem.

Based upon the number of battery cells to be handled via each IC, the serially connected battery cells are divided into a plurality of groups, a specific IC is designated to each group and the IC thus designated to each of the plurality of groups measures the terminal voltages at the battery cells constituting the corresponding group. As described above, the numbers of battery cells constituting the individual groups may vary.

In addition, a communication harness 50, to be used to communicate with the battery controller 20, is led out from the substrate constituting the C/C 80. The communication harness 50 includes a connector disposed at the front end thereof. This connector is connected to a connector (not shown) at the battery controller 20. It is to be noted that while chip elements such as resistors, capacitors, photocouplers, transistors and diodes are mounted at the substrate constituting the C/C 80, FIG. 20 does not include an illustration of these elements, for purposes of simplification. The connectors 48 and 49 are disposed in correspondence to the two battery assembly blocks at the substrate constituting the C/C 80, and the communication harness 50 provided as a member independent of the connectors, is also disposed at the substrate so as to enable communication with the battery controller 20. Since the connectors 48 and 49 and the communication harness 50 are disposed independently of each other, maintenance and wiring work is facilitated. In addition, as explained earlier one of the connectors 48 and 49 is used to connect the serially connected high-voltage side battery cells with the substrate constituting the C/C 80 and the other connector 48 or 49 is used to connect the serially connected low-voltage side battery cells with the substrate constituting the C/C 80. As a result, the voltage difference manifesting over the ranges managed via the individual connectors can be reduced. While the state of partial connection, in which only a partial connection exists momentarily when the connectors are being connected or disconnected, the adverse effect of such partial connection can be reduced by reducing the voltage difference manifesting over the ranges managed via the individual connectors.

The battery assembly blocks 10 and 11 fixed side-by-side at the lower lid 49 are connected in series via the block connector bus bar (not shown). At the front surface of the lower lid base, the output terminals 810 and 820 via which power from the positive pole high-rate cable 81 and the negative pole high-rate cable 82 is supplied to an external recipient or power originating from the outside is received is disposed.

(Diagnosis for Individual Battery Cell)

The measurement of the voltages at the individual battery cells and the over-charge/over-discharge diagnosis operation, executed as the internal processing at each of the integrated circuits 3A, . . . , 3M, . . . and 3N in FIG. 1, are now described.

At the stages STGCV1~STGCV6 indicated in row 260Y1 in the operation table 260 presented in FIG. 4, the terminal voltages at the individual battery cells are taken in and diagnosis is executed. As explained earlier, during the measurement phase of the stage STGCV1, the input circuit 116 in FIG. 5 selects VCC(V1) and VC2(V2). Through this operation, the terminal voltage at the battery cell BC1 in FIG. 2 is selected and the selected terminal voltage is input to the analog/digital converter 122A in the voltage detection circuit 122 via the differential amplifier 262 having a potential shift function. The measurement value thus input is converted to a digital value at the analog/digital converter 122A and the averaging circuit 264 calculates the average value by using a predetermined number of measurement values indicating most recent measurement results, including the current measurement results. The average value thus calculated is held at a register CELL1 in the current value storage circuit 274.

Based upon the measurement value held at the register CELL1 in the current value storage circuit 274, diagnosis for the battery cell BC1 is executed to determine whether or not the battery cell BC1 is in an over-charged state or an over-discharged state during the measurement phase of the stage STGCV1 in FIG. 4. Before starting this diagnosis, the reference values to be used in the diagnosis are transmitted from the battery controller 20 to each integrated circuit where the over-charge diagnosis reference OC is held at a register in the reference value storage circuit 278 and the over-discharge diagnosis reference OD is also held at a register in the reference value storage circuit 278. In addition, even when the reference values cannot be transmitted from the battery controller 20 in response to a communication command 292 or when erroneous values become held in the reference value storage circuit 278 due to noise or the like, an over-charge reference value OCFFO that cannot be overwritten with a communication command 292, is held in advance so as to enable detection of an abnormal state attributable to an over-charge.

(Overcharge Diagnosis)

Following the terminal voltage measurement at the stage STGCV1, the terminal voltage value having been obtained through the measurement is compared with the over-charge decision-making value OC by the digital comparator circuit 270. Namely, the measurement value held at the register CELL1, among the plurality of measurement values held at the registers CELL1~CELL6, the VDD values held at the VDD register and the reference power value (PSBG) in the current value storage circuit 274, is selected with a selection signal generated via the decoder 257 and the decoder 259 based upon the outputs from the first stage counter 256 and the second stage counter 258 shown in FIG. 4. The selected measurement value is then input to the digital comparator circuit 270. Likewise, the over-charge diagnosis reference value OC among the plurality of reference values held in the reference value storage circuit 278 is selected with a selection signal generated via the decoder 257 and the decoder 259 and the digital comparator circuit 270 compares the measurement value corresponding to the battery cell BC1 held at the register CELL1 with the over-charge diagnosis reference value OC. If the measurement value obtained at the battery cell BC1 is greater than the over-charge diagnosis reference value OC, the digital comparator circuit 270 outputs comparison results indicating an abnormality. A digital multiplexer 282 selects a storage location at which the output from the digital comparator circuit 270 is to be stored by using a selection signal generated via the decoder 257 and the decoder 259. If the diagnosis results for the battery cell BC1 indicate an abnormality, the diagnosis results indicating the abnormality are held in a register MF flag and a register OC flag in the flag storage circuit 284. Namely, the MF flag and the OC flag are set. The abnormality flag is output from the terminal FFO of the integrated circuit and is transmitted to the battery controller 20.

Next, in order to assure better reliability, the digital comparator circuit 270 compares the measurement value corresponding to the battery cell BC1 with the over-charge diagnosis reference value OCFFO. If the measurement value obtained in correspondence to the battery cell BC1 is greater than the over-charge diagnosis reference value OCFFO, it is judged that an over-charge abnormality has occurred and the abnormality diagnosis results are held at the register MF flag and a register OC flag in the flag storage circuit 284. The abnormality flag set at the flag storage circuit 284 is then transmitted to the battery controller 20, as in the situation described earlier. The over-charge diagnosis reference value OCFFO is a reference value that cannot be overwritten by the battery controller 20. Thus, since the over-charge diagnosis reference value OCFFO remains unchanged even in the event of an abnormality occurring in the program or the operation of the battery controller 20, a highly reliable judgment is assured. While the over-charge diagnosis reference value OC, which can be adjusted by the battery controller 20, enables fine tuning of the decision-making process, the over-charge diagnosis reference value OCFFO is highly reliable data that are sustained unaltered regardless of the conditions of the battery controller 20 or the transmission path, as described above. Highly reliable diagnosis is assured through the use of the two different types of data.

(Over-Discharge Diagnosis)

During the measurement phase at the stage STGCV1, an over-discharge diagnosis is next executed for the battery cell BC1. The digital comparator circuit 270 compares the measurement value indicating the terminal voltage at the battery cell BC1, which is stored at the register CELL1 in the current value storage circuit 274, with the reference value OD held in the reference value storage circuit 278. If the measurement value obtained at the battery cell BC1 is less than the reference value OD in the reference value storage circuit 278, the digital comparator circuit 270 judges that an abnormality has occurred and outputs an abnormality signal. The digital multiplexer 282 selects the MF flag and the OD flag in the flag storage circuit 284 by using a selection signal generated based upon the outputs from the decoders 257 and 259 and the abnormality signal thus output from the digital comparator circuit 270 is set at the register MF flag and the register OD flag.

If the MF flag is set through any of the diagnosis steps described above, the flag is output from the one-bit output terminal FFO via an OR circuit 288 and is transmitted to the battery controller 20.

The functions of the selection circuit 286 can be altered with a communication command 292 issued from the battery controller 20 and thus, the specific details of the flag to be output through the terminal FFO can be selectively adjusted. For instance, an over-charge abnormality alone may be specified as the condition for setting the MF flag in the flag storage circuit 284. In such a case, an over-discharge abnormality diagnosis output from the digital comparator circuit 270 is not set in the register MF flag and instead, the OD flag alone is set. The OD flag may then be output or not depending upon the specific condition setting selected via the selection circuit 286. Since the condition setting can be modified from the battery controller 20, a higher level of versatility in the control is afforded.

Following the stage STGCV1 in row 260Y1 in the operation table 260 in FIG. 4, the operation enters the stage STGCV2. The input circuit 116 shown in FIG. 6 selects VC2(V2) and VC3(V3), thereby selecting the terminal voltage at the battery cell BC2 in FIG. 2. Through an operation similar to that having been executed at the stage STGCV1 as described earlier, the terminal voltage measured at the battery cell BC2 is digitized via the analog/digital converter 122A, the averaging circuit 264 calculates the average of the predetermined number of measurement values indicating the most recent measurement results including the current measurement results and the average value thus calculated is held at the register CELL2 in the current value storage circuit 274. As are the positions at which other measurement values are to be held, the position at which the measurement results are to be held is selected based upon the outputs from the decoder 257 and the decoder 259 shown in FIG. 4.

Then, as in the operation executed at the stage STGCV1, the measurement value corresponding to the battery cell BC2 is selected from the current value storage circuit 274 and the over-charge diagnosis reference value OC at the reference value storage circuit 278 is selected based upon the outputs from the decoders 257 and 259 shown in FIG. 4. The diagnosis is then executed as the digital comparator circuit 270 compares the measurement value with the over-charge diagnosis reference value. The details of the diagnosis and the specific operational procedure of the diagnosis are identical to those corresponding to the stage STGCV1.

Subsequently, the measurement and the diagnosis are executed at the succeeding stages STGCV3~STGCV6 in sequence via the circuit shown in FIG. 5, in much the same way as at the stages STGCV1 and STGCV2.

(SOC Adjustment and Terminal Voltage Measurement)

As explained earlier, the state of charge SOC of each of the battery cells constituting the battery unit 9 is adjusted through control whereby the power held in any battery cell with a significant charge is discharged via a discharge resistor by controlling the balancing switches 129A~129F. The open/close control executed on the balancing switches 129A~129F may adversely affect the terminal voltage detection at the various battery cells. Namely, as the balancing switches 129 in the circuit shown in FIG. 2 closes, a discharge current will flow via the corresponding resistors R1~R4, lowering the accuracy with which the terminal voltages at the battery cells BC1~BC4 are measured.

The open/close control for the balancing switches 129A~129F must be executed based upon the states of all the battery cells in the battery unit 9. Accordingly, it is desirable to execute the open/close control through processing executed at the battery controller 20 shown in FIG. 1. In other words, it is desirable to engage the individual integrated circuits 3A~3N in the control of the balancing switches 129A~129F in response to a command issued by the battery controller 20. At the same time, it is desirable that the integrated circuits 3A~3N each individually measure the terminal voltages at the battery cells in the corresponding group and that they each promptly transmit the terminal voltage measurement values having been obtained through the measurement and held therein in response to a measurement value transmission instruction issued from the battery controller 20. This means that the control for the balancing switches 129A~129F and the control on the battery cell terminal voltage measurement, executed via different circuits, must be coordinated so as to ensure that the two types of control are executed in an integrated manner.

In reference to FIGS. 21 through 25, specific structures that may be adopted to execute the two types of control in an optimal manner are explained. Since it is desirable to effectively eliminate the adverse effect of noise in actual products with capacitors C1~C6 installed in addition to the discharge resistors R1~R4 shown in FIGS. 1 and 2, the structures shown in FIGS. 21, 22, 26 and 27 each include noise removal capacitors added to the circuit structure shown in FIG. 1 or FIG. 2. It is to be noted that while four battery cells constitute each battery cell group in the structures illustrated in FIGS. 1 and 2, the structures illustrated in FIGS. 21, 22, 26 and 27 include six battery cells constituting a battery cell group. It is also to be noted that the resistors and the capacitors are installed in the cell controller indicated by the dotted line 80, together with the integrated circuit also indicated by the dotted line and that they are connected with the respective battery cells BC1~BC6 in the battery block via the communication harness 50 shown in FIG. 20.

Figure 21:
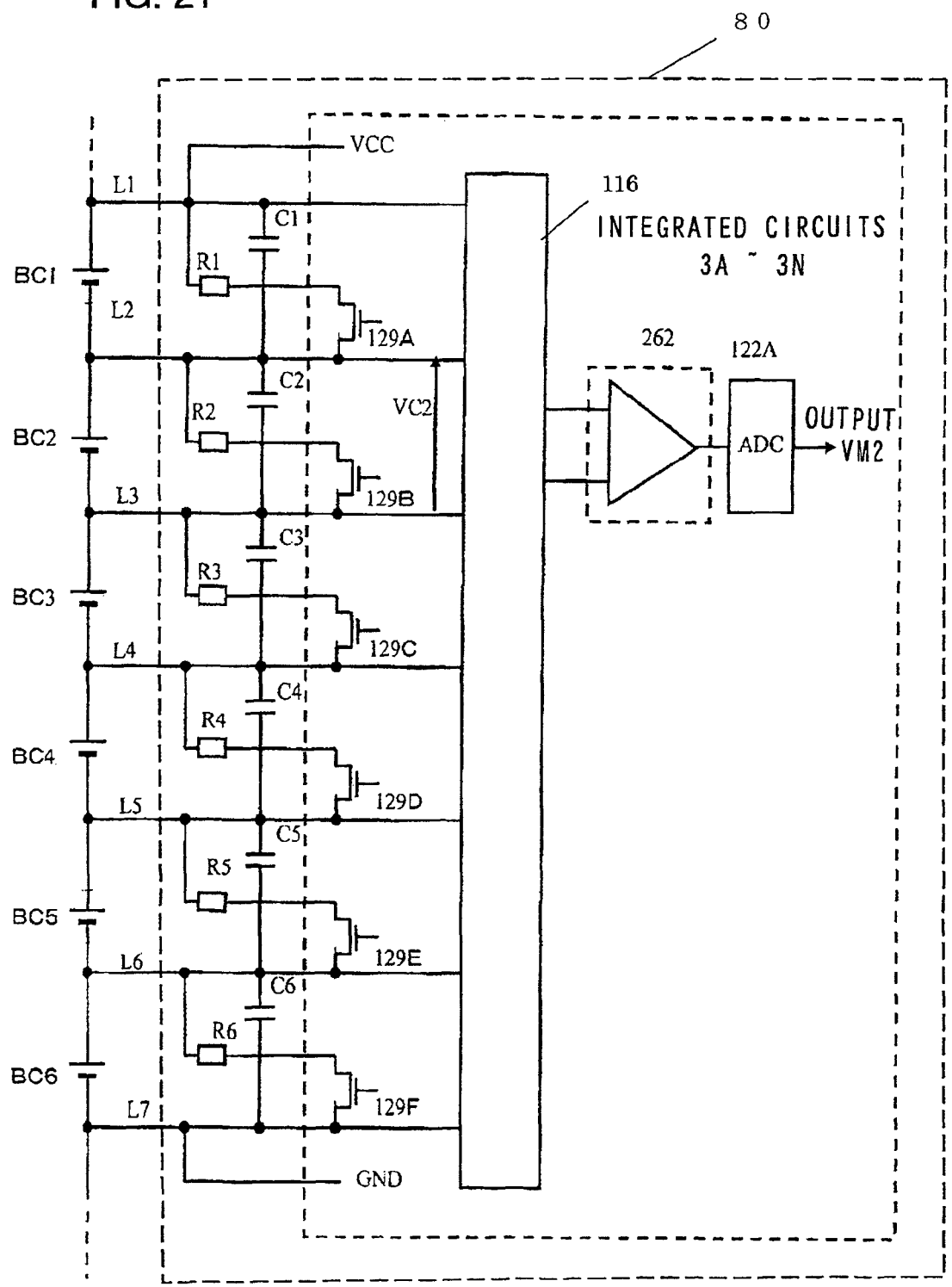
FIG. 21 presents an example of a structure that may be adopted to enable both balancing switch control and individual battery cell terminal voltage measurement.
Figure 22:
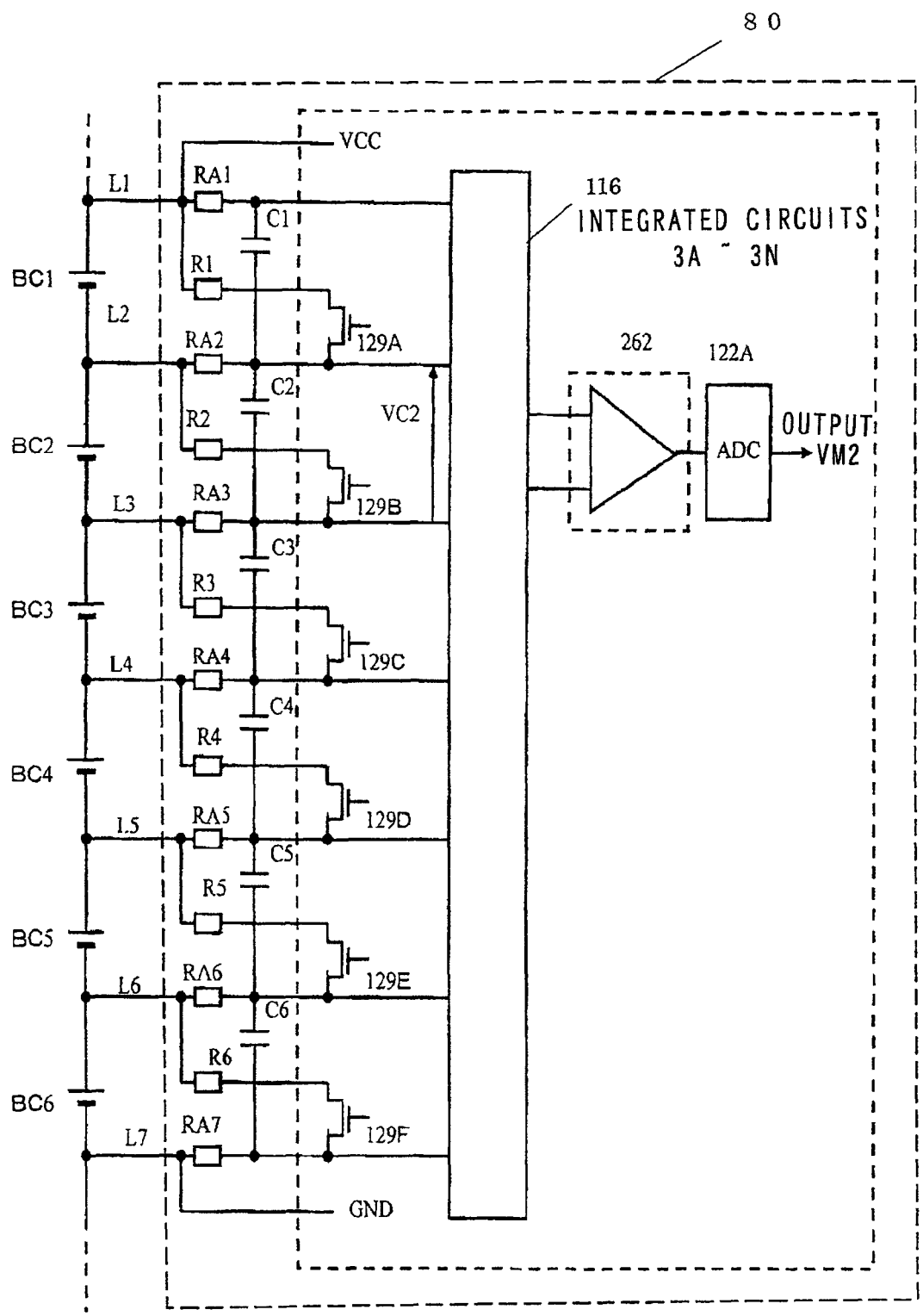
FIG. 22 presents another example of a structure that may be adopted to enable both balancing switch control and individual battery cell terminal voltage measurement.
Figure 23:
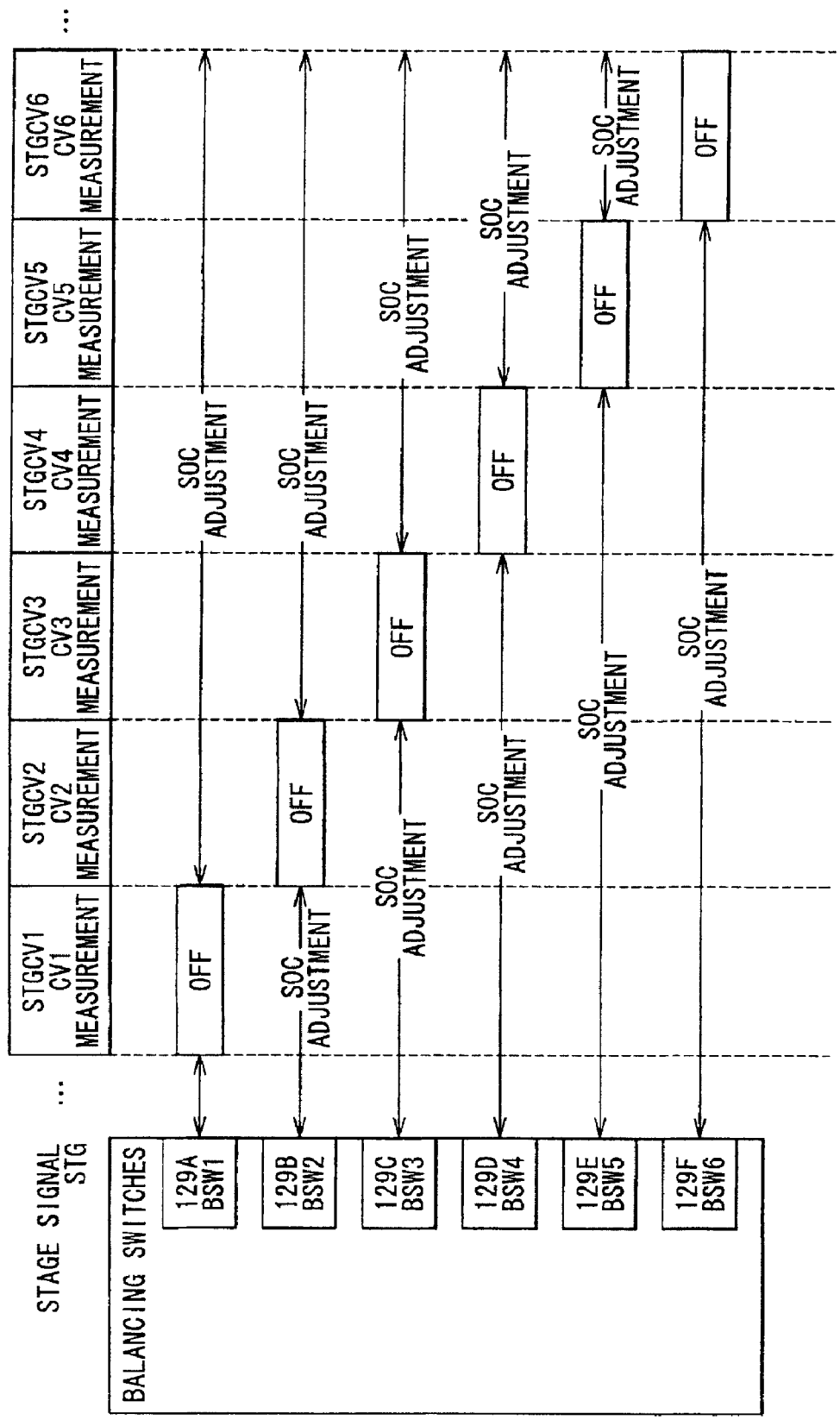
FIG. 23 is an operation diagram illustrating the relationship between the measurement control and the discharge control executed for SOC (state of charge) adjustment, observed in the circuit shown in FIG. 21.
Figure 24:
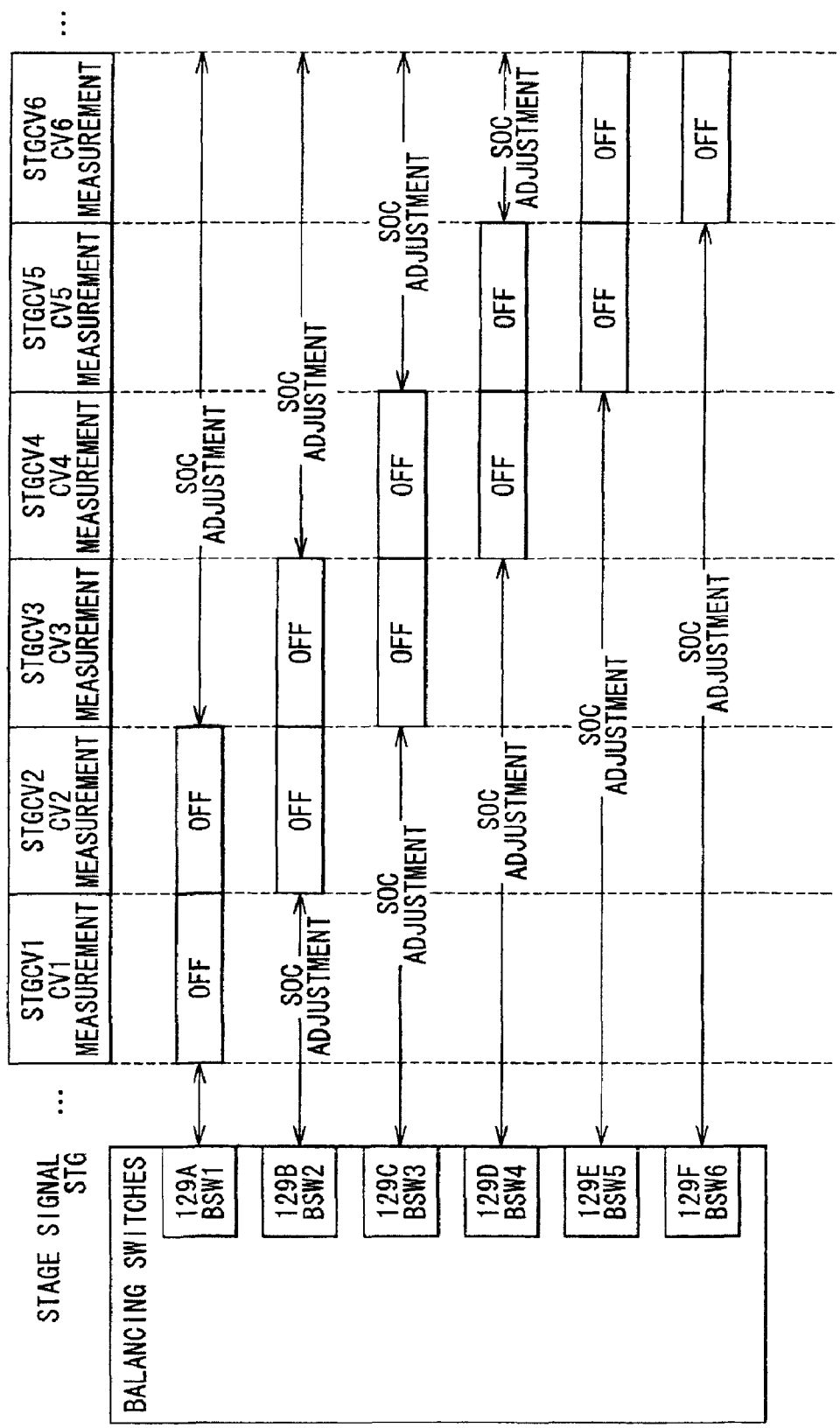
FIG. 24 is an operation diagram illustrating the relationship between the measurement control and the discharge control executed for SOC adjustment, observed in the circuit shown in FIG. 22.
Figure 25:
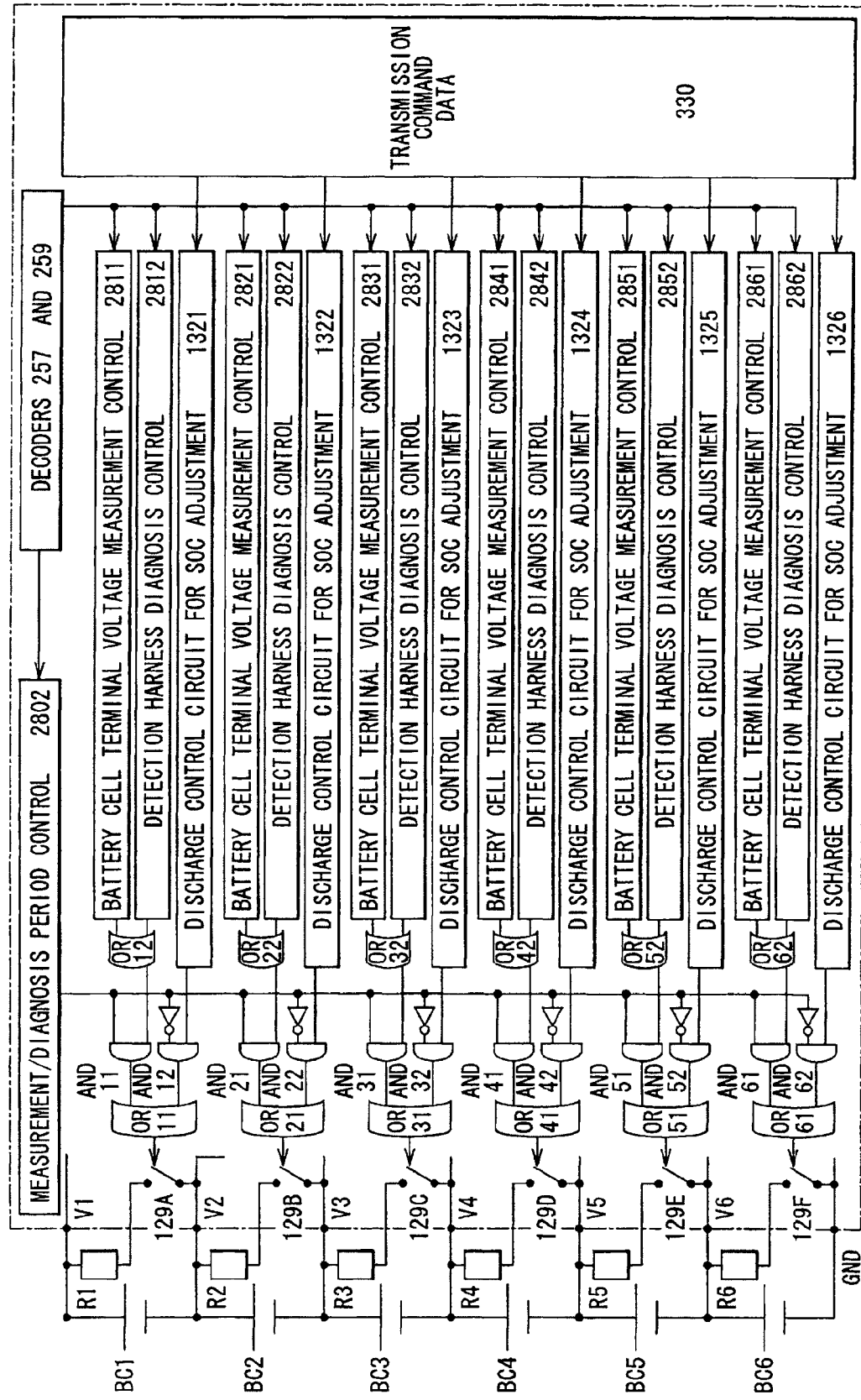
FIG. 25 presents an example of a circuit that may be used to execute the control shown in FIG. 23 or FIG. 24.

FIG. 22 shows a circuit designed to further reduce the adverse effect of noise by utilizing the discharge resistors R1~R6 shown in FIG. 21. FIGS. 23 and 24 each illustrate the measurement control operation and the discharge control operation executed to adjust the states of charge (SOCs). FIG. 23 illustrates the operation executed at the circuit shown in FIG. 21, whereas FIG. 24 illustrates the operation executed at the circuit shown in FIG. 22. In addition, FIG. 25 shows a circuit that may be used to enable the control shown in FIG. 23 or FIG. 24.

In the circuit shown in FIG. 21, the terminal voltage at the battery cell BC1 is measured at the stage STGCV1 and then the terminal voltage at the battery cell BC2 is measured at the succeeding stage STGCV2. Subsequently, the terminal voltages at the battery cells BC3~BC6 are measured in sequence. By repeatedly measuring the terminal voltages in this manner, the levels of the terminal voltages at the battery cells can be monitored at all times.

For instance, assuming that the balancing switch 129B is in the closed state in order to adjust the SOC, a discharge current is flowing via the balancing switch 129B and the resistor R2 and, as the discharge current affects the internal resistance and wiring resistance at the battery cell BC2, the voltage VC2 input to the input circuit 116 assumes a value lower than that of the terminal voltage measured when the balancing switch 129B is in the open state. In other words, the lower terminal voltage value input to the input circuit 116 when the balancing switch 129B is in the closed state is bound to reduce the measurement accuracy.

In order to maintain the measurement accuracy at an acceptable level, the terminal voltage at the battery cell BC1 is measured with the balancing switch 129A set in the open state by temporarily stopping the control for the SOC of the battery cell BC1 at the stage STGCV1, during which the terminal voltage at the battery cell BC1 is measured, as shown in FIG. 23. At the stage STGCV2 during which the terminal voltage at the next battery cell BC2 is measured, the terminal voltage at the battery cell BC2 is measured with the balancing switch 129B set in the open state by temporarily stopping the SOC control for the battery cell BC2. Subsequently, the terminal voltages at the succeeding battery cells are measured in sequence with the corresponding balancing switches 129C~129F (BSW3~BSW6 in FIG. 23) set in the open state.

The control for the SOC adjustment may be stopped during the measurement phases at the stages STGCV1~STGCV6. Alternatively, the control for the SOC adjustment may be stopped only briefly while the terminal voltage is actually being measured during each of the stages STGCV1~STGCV6.

Next, the circuit shown in FIG. 22 is described. Significant noise is present in the power lines through which power is supplied from the serially connected battery cells BC1~BC6 to the inverter. In order to reduce the adverse effect of this noise, the circuit shown in FIG. 22 includes resistors RA1~RA7 inserted between the battery cell terminals and the input end of the input circuit 116. The resistors RA1~RA7, together with the capacitors C1~C7 remove noise, thereby protecting the integrated circuit from the noise.

As the balancing switch 129A in the circuit shown in FIG. 22 is closed in order to adjust the SOC, the discharge current for the battery cell BC1 flows through the resistor R1, the balancing switch 129A and the resistor RA2. The discharge current flowing through the resistor RA2 while the balancing switch 129A is in the closed state is bound to affect the measurement of the terminal voltage at the battery cell BC2 as well as the measurement of the terminal voltage at the battery cell BC1. For this reason, the terminal voltage at the battery cell BC2 must be measured by opening both the balancing switch 129A and the balancing switch 129B. Likewise, the terminal voltage at the battery cell BC3 must be measured by opening both the balancing switch 129B and the balancing switch 129C and the terminal voltages at all the succeeding battery cells have to be measured by opening two balancing switches.

FIG. 24 shows how the balancing switches 129 in the circuit shown in FIG. 22 may be forcibly set in the open state for battery cell terminal voltage measurement. At the stage STGCV2 during which the terminal voltage at the battery cell BC2 in FIG. 22 is measured, the SOC adjustment control via the balancing switches 129A and 129B is stopped, and the balancing switches 129A and 129B are sustained in the open state. At this time, the SOC adjustment control via the balancing switches 129A and 129B may be stopped over the entire period of the stage STGCV2 or the SOC adjustment control via the balancing switches 129A and 129B may be only briefly stopped while the voltage is actually being measured during the stage STGCV2. This principle is similar to that having been explained in reference to FIG. 23.

FIG. 24 also shows that at the stage STGCV3 during which the terminal voltage at the battery cell BC3 in FIG. 22 is measured, the SOC adjustment control via the balancing switches 129B and 129C is stopped, and the balancing switches 129B and 129C are sustained in the open state while the measurement of the terminal voltage is underway. At this time, the SOC adjustment control via the balancing switches 129B and 129C may be stopped over the entire period of the stage STGCV3 or the SOC adjustment control via the balancing switches 129B and 129C may be only briefly stopped while the voltage is actually being measured during the stage STGCV3, as described above.

At the stages STGCV4 and STGCV5, the balancing switches 129C and 129D and the balancing switches 129D and 129E are respectively sustained in the open state while measuring the terminal voltages at the battery cells BC4 and BC5. At the stage STGCV6, the terminal voltage at the battery cell BC6 is measured. While the terminal voltage at the battery cell BC6 is being measured, the balancing switch 129F is sustained in the open state.

It is to be noted that the balancing switches 129A~129F are each controlled for purposes of the SOC adjustment during the period of time indicated by ↔ in FIGS. 23 and 24. In addition, during the period of time marked as "OFF", the control of the corresponding balancing switch among the balancing switches 129A~129F, executed for purposes of SOC adjustment is halted with the balancing switch forcibly set in the open state. By forcibly opening the corresponding balancing switches 129 so as to give priority to the battery cell terminal voltage measurement over the SOC adjustment control executed via the battery control 20 as described above, the battery cell terminal voltages can be measured with better accuracy.

Next, in reference to the circuit diagram presented in FIG. 25, the operation executed to open the balancing switches 129 is described. First, the control value to be used in the SOC adjustment is calculated in step 815 in FIG. 14 and the calculation results indicating the control value are transmitted to the individual integrated circuits 3A, . . . , 3M, . . . and 3N as a communication command 292. The communication circuit 127 shown in FIG. 2 or FIG. 7 of each of the integrated circuits 3A, . . . , 3M, . . . and 3N receives the transmitted control value and the balancing switches 129A~129F are controlled based upon the control value thus received.

Data 330 in FIG. 25 correspond to the data 330 in the reception register 322 shown in FIG. 7 and the contents of the data 330 are input to discharge control circuits 1321~1326. The control signal input to the discharge control circuits indicates either "1" or "0". The control signal indicating "1" is an instruction for control under which the corresponding battery cell is discharged by closing the balancing switch 129, whereas the control signal indicating "0" is an instruction for control under which the balancing switch 129 remains open and thus the battery cell is not discharged. Such a control signal is held at each of the discharge control circuit 1321~1326 and the balancing switches 129A~129F are individually controlled based upon the data held at the respective discharge control circuits.

The data held at the discharge control circuits 1321~1326 are provided to AND gates 12~62 and are used to drive the balancing switches 129A~129F via OR gates 11~61. If control for a specific balancing switch among the balancing switches 129A~129F is to be given priority over the SOC adjustment control, the signal indicating the data held at the corresponding discharge control circuit among the discharge control circuits 1321~1326 is cut off at the corresponding AND gate among the AND gates 12~62. During this cutoff period, which is to be described in reference to FIGS. 29 and 30, the terminal voltage at the corresponding battery cell is measured based upon the outputs from the decoder 257 and the decoder 259 and a control-off signal is transmitted from a circuit 2802 to the specific AND gate among the AND gates 12~62 based upon the outputs from the decoders 257 and 259.

While the SOC adjustment control for a given battery cell is halted with a specific AND gate among the AND gates 12~62 set in the open state, the corresponding AND gate among AND gates 11~61 is closed and the corresponding balancing switch among the balancing switches 129A~129F is driven based upon the output from the corresponding OR gate among OR gates 12~62. In other words, while a given AND gate among the AND gates 12~62 is in the open state and the corresponding AND gate among the AND gates 11~61 is in the closed state, a control signal to be used to control the balancing switch among the balancing switches 129A~129F can be output from the corresponding measurement control circuit among measurement control circuits 2811~2861 so as to assure optimal measurement. In addition, when executing abnormality diagnosis for the detection harness 32, which is to be detailed later, the diagnosis control circuits 2812~2862 output a control signal to control the respectively balancing switches 129A~129F.

As described above, the integrated circuits 3A, . . . , 3M, . . . and 3N each include a dedicated circuit via which a specific balancing switch among the balancing switches 129A~129F is controlled while the SOC adjustment control is halted to give priority to the measurement operation. As a result, accurate measurement and diagnosis are enabled.

(Diagnosis for the ADC, the Differential Amplifier 262 and the Reference Voltage)

At the stage STGPSBG in row 260Y1 in the operation table 260 presented in FIG. 4, a diagnosis for the internal reference voltage, the analog circuit and the analog/digital converter 122A is executed. A source voltage to be used to engage the analog circuit and the digital circuit shown in FIG. 5 in operation is generated at a power source circuit 121 (see FIG. 2) within the integrated circuit. If the source voltage is generated based upon an absolute reference power level, a precise source voltage can be obtained with relative ease. However, if the absolute reference voltage changes, the source voltage, too, may change.

At the stage STGPSBG, the diagnosis for the reference power, the analog circuit and the analog/digital converter 122A are executed with a high level of efficiency. The operation executed at the stage STG "reference power" is described below in more specific terms.

The input circuit 116 included in the circuit structure shown in FIG. 5 select the reference power and the GND. The voltage representing the difference between the potentials at the GND and the reference power thus selected is input to the differential amplifier 262, where the scale is adjusted in correspondence to the potential shift. The voltage value is then input to the analog/digital converter 122A. At the analog/digital converter 122A, the input signal is converted to a digital value and the digital signal is held as data PSBG at a PSBG register in the current value storage circuit 274 based upon the outputs from the decoders 257 and 259.

As long as the relevant circuit operates in the normal state, the voltage at the reference power assumes a known value. Accordingly, a lower limit value (PSBGmin) for the reference power assuming a slightly lower value than the known voltage value of the reference power and an upper limit value (PSBGmax) for the reference power, assuming a slightly larger value than the known voltage value of the reference power, are respectively held in a lower limit value save area and an upper limit value save area designated in advance at a register in the reference value storage circuit 278. Under normal circumstances, the voltage at the reference power assumes a value between the lower limit value and the upper limit value for the reference power. Even when the voltage at the reference power is within the normal range, the output from the analog/digital converter 122A will indicate a value outside the normal range unless the analog circuit operates in the normal states, e.g., unless the differential amplifier 262 operates in the normal state. In addition, an abnormality occurring at the analog/digital converter 122A will also result in the output from the analog/digital converter 122A indicating a value outside the normal range.

Accordingly, a diagnosis is executed by engaging the digital comparator circuit 270 in comparison operation in order to determine if the "reference power" value held in the current value storage circuit 274 is between the reference power lower limit value and the reference power upper limit value held in the reference value storage circuit 278.

Based upon the outputs from the decoders 257 and 259, the digital multiplexer 272 selects the measurement value "reference power" and transmits the selected measurement value to the digital comparator circuit 270. In addition, based upon the outputs from the decoders 257 and 259, the digital multiplexer 272 selects the reference power lower limit value and transmits the selected value to the digital comparator circuit 270. The digital comparator circuit 270 judges that an abnormality has occurred if the measurement value "reference power" is smaller than the reference power lower limit value and, accordingly, an abnormality flag is set at the abnormality flag holding register selected by the digital multiplexer 282 based upon the outputs from the decoders 257 and 259, i.e., at the register MF flag in the flag storage circuit 284 in the embodiment. If, on the other hand, the measurement value "reference power" is greater than the reference power lower limit value, the current state is judged to be normal and, accordingly, no abnormality flag is set in the flag storage circuit 284.

In addition, during the stage STGPSBG the digital multiplexer 272 selects the measurement value "reference power" based upon the outputs from the decoders 257 and 259 and transmits the selected measurement value to the digital comparator circuit 270. In addition, based upon the outputs from the decoders 257 and 259, the digital multiplexer 272 selects the reference power upper limit value and transmits the selected value to the digital comparator circuit 270. The digital comparator circuit 270 judges that an abnormality has occurred if the measurement value "reference power" is larger than the reference power upper limit value and, accordingly, an abnormality flag is set at the abnormality flag holding register selected by the digital multiplexer 282 based upon the outputs from the decoders 257 and 259, i.e., at the register MF flag in the flag storage circuit 284 in the embodiment. If, on the other hand, the measurement value "reference power" is smaller than the reference power upper limit value, the current state is judged to be normal and, accordingly, no abnormality flag is set in the flag storage circuit 284. During the stage STGPSBG, the diagnosis is executed as described above to determine whether or not the differential amplifier 262, which is an analogue amplifier, and the analog/digital converter 122A are operating in the normal state, so as to assure a high level of reliability.

(Diagnosis for the Digital Comparator Circuit)

At the stage STGCal in the operation table 260 in FIG. 4, a diagnosis for the digital comparator circuit is executed. The diagnosis operation is described below. Based upon the outputs from the decoders 257 and 259, the digital multiplexer 272 selects an addition calculation value 280. The addition calculation value 280 is a value obtained by adding a predetermined value to a reference value, e.g., the reference value OC, held in the reference value storage circuit 278. The digital multiplexer 276 selects one of the reference values held in the reference value storage circuit 270 such as the reference value OC and inputs the selected reference value to the digital comparator circuit 270 where it is used as a comparison reference. In addition, the addition calculation value 280 obtained by adding a predetermined value, e.g., "1", to the selected reference value OC is input to the digital comparator circuit 270 via the digital multiplexer 272. If the digital comparator circuit 270 judges that the addition calculation value 280 is greater than the reference value OC, the digital comparator circuit 270 can be assumed to be operating in the normal state.

Next, the digital multiplexer 272 selects a subtraction calculation value 281 based upon the outputs from the decoders 257 and 259. The subtraction calculation value 281 is a value obtained by subtracting a predetermined value such as "1" from a reference value, e.g., the reference value OC, held in the reference value storage circuit 278. The digital multiplexer 276 selects one of the reference values held in the reference value storage circuit 270 such as the reference value OC and inputs the selected reference value to the digital comparator circuit 270 where it is used as a comparison reference. In addition, the subtraction calculation value 281 obtained by subtracting a predetermined value, e.g., "1", from the selected reference value OC is input to the digital comparator circuit 270 via the digital multiplexer 272. If the digital comparator circuit 270 judges that the subtraction calculation value 281 is smaller than the reference value OC, the digital comparator circuit 270 can be assumed to be operating in the normal state.

As described above, the reference value OC held in the reference value storage circuit 278 is compared with the sum obtained by adding a predetermined value to the reference value OC and with the difference obtained by subtracting a predetermined value from the reference value OC, so as to determine whether or not the comparator is operating in the normal state.

The addition calculation value 280 and the subtraction calculation value 281 are used in order to create conditions under which known relationships to the comparison reference exist and obtain verifiable comparison results. For this reason, instead of the values obtained by adding/subtracting a predetermined value to/from the comparison reference, values obtained by shifting the data toward the higher-order side and the lower-order side may be utilized. The values obtained through such data shift are equivalent to values obtained by multiplying the comparison reference by a predetermined value 4 and subtracting a predetermined value 4 from the comparison reference and thus, known relationships to the comparison reference can also be created with these values.

In reference to FIGS. 26 and 27, the diagnosis executed to determine whether or not an abnormality has occurred at the detection harness 32 connecting the positive poles and the negative poles of the battery cells BC to the cell controller 80 is described. FIG. 26 illustrates a circuit in which a disconnection has occurred in a harness segment L2 constituting the detection harness 32 in FIG. 1 or FIG. 2. FIG. 27 shows a circuit in which a disconnection has occurred in the harness segment L2 constituting the detection harness 32 included in the circuit shown in FIG. 22. Such a disconnection may occur due to poor contact at a connection area where a given battery cell in FIG. 19 and the detection harness 32 are connected with each other or a poor connection at the connector 48 or 49, where the cell controller 80 is connected with individual harness segments, as shown in FIG. 20. Although not common, a disconnection may also occur at the detection harness 32 itself.

It is essential that any potential abnormality at each battery cell be sensed in order to preempt the abnormality. If an abnormality actually occurs in the electrical connection between the battery cell and the corresponding integrated circuit, the potential abnormality that may occur at the battery cell described above can no longer be sensed. Now, in reference to FIG. 28, a method that may be adopted to detect an abnormality occurring in the electrical connection between the battery cell and the integrated circuit, as shown in FIG. 26 or 27, is described. It is to be noted that the basic operation executed in the circuit shown in FIG. 26 or 27 has already been described. In addition, while an explanation is given below by assuming that a disconnection has occurred in the harness segment L2 in the detection harness 32, an abnormality can be detected in a similar manner regardless of which harness segment among the harness segments L1~L7 becomes disconnected.

Figure 28:
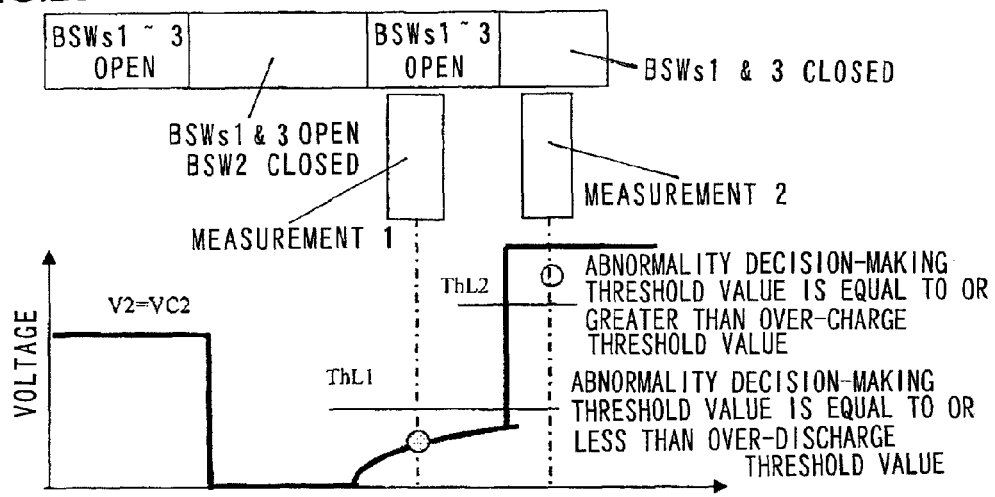
FIG. 28 illustrates a method that may be adopted to detect an abnormality in the electrical connection between the battery cells and the individual integrated circuits in the structure shown in FIG. 26 or FIG. 27.

If the harness segment L2 in the detection harness 32 becomes disconnected while the balancing switches 129A~129C are in the open state, the voltage VC2 input to the input circuit 116 may indicate a normal value close to the terminal voltage V2 at the battery cell due to the various electrostatic capacitances including that at the capacitor C2, as shown in FIG. 28. Thus, the abnormality cannot be sensed simply based upon the voltage VC2.

Accordingly, the balancing switch 129B through which the discharge current flows via the diagnosis target harness segment L2 in the detection harness 32 is closed. As the balancing switch 129B is set in the closed state, the electrical charge having accumulated in the electrostatic capacitance including the capacitor C2 present between the circuits corresponding to the harness segments L2 and L3 in the detection harness 32 is released, causing a sudden decrease in the voltage VC2 input to the input circuit 116. If no disconnection has occurred, the electrical current is supplied from the battery cell BC2 and thus, the voltage VC2 input to the input circuit 116 hardly changes.

The terminal voltage at the battery cell BC2 is measured (measurement 1) at the terminal voltage measurement stage for the battery cell BC2 having been described in reference to FIGS. 23 and 24. As explained earlier, the balancing switch 129B remains in the open state during this measurement phase. Since the electrical charge flowing into the electrostatic capacitance including the capacitor C2 present between the circuits of the harness segments L2 and L3 in the detection harness 32 is then accumulated at the electrostatic capacitance, the voltage VC2 input to the input circuit 116 slightly increases. However, the voltage VC2 measured through the measurement 1 is much lower than the normal voltage. The voltage VC2 thus measured is held at the register CELL2 in the current value storage circuit 274 shown in FIG. 5.

In the diagnosis for the battery cell BC2 executed in succession following the measurement, diagnosis results indicating an abnormality are obtained via the digital comparator 270 based upon the measurement value readout from the current value storage circuit 274, which indicates an abnormal value equal to or less than the over-discharge threshold value OD in the reference value storage circuit 278. The abnormality diagnosis results are set at the register MF flag in the flag storage circuit 284. The voltage VC2 assumes a value less than the over-discharge threshold value OD in the event of a disconnection. Accordingly, a disconnection threshold value, even smaller than the over-discharge threshold value OD, is set and the digital comparator 270 is engaged in comparison of the measurement value held at the register CELL2 in the current value storage circuit 274 with the disconnection threshold value. As a result, the decision with regard to whether or not a disconnection has occurred can be made with ease. By using the value held at the register OCFFO in the reference value storage circuit 278 in FIG. 5 as the disconnection threshold value, the sensing operation for disconnection can be executed at all times.

As shown in FIG. 28, as the balancing switch 129B is set in the open state and then the balancing switches 129A and 129C are set in the closed state, the voltages from the serially connected battery cells BC1 and BC2 are both applied to the capacitor C2, significantly raising the terminal voltage at the capacitor C2. Accordingly, immediately after the measurement 1, the balancing switches 129A and 129C are both closed and the terminal voltage at the battery cell BC2 is measured again (measurement 2). The voltage VC2 measured at this time is bound to indicate a very high value, far exceeding the over-charge threshold value, thereby enabling disconnection detection with ease.

As described above, the measurement results obtained through the measurement 2 are held at the register CELL2 in the current value storage circuit 274 shown in FIG. 5. The measurement value held at the register CELL2 in the current value storage circuit 274 may be compared at the digital comparator 270 with the disconnection detection threshold value in order to detect a disconnection, or a disconnection diagnosis may instead be executed through software processing executed at the battery controller 20.

Figure 29:
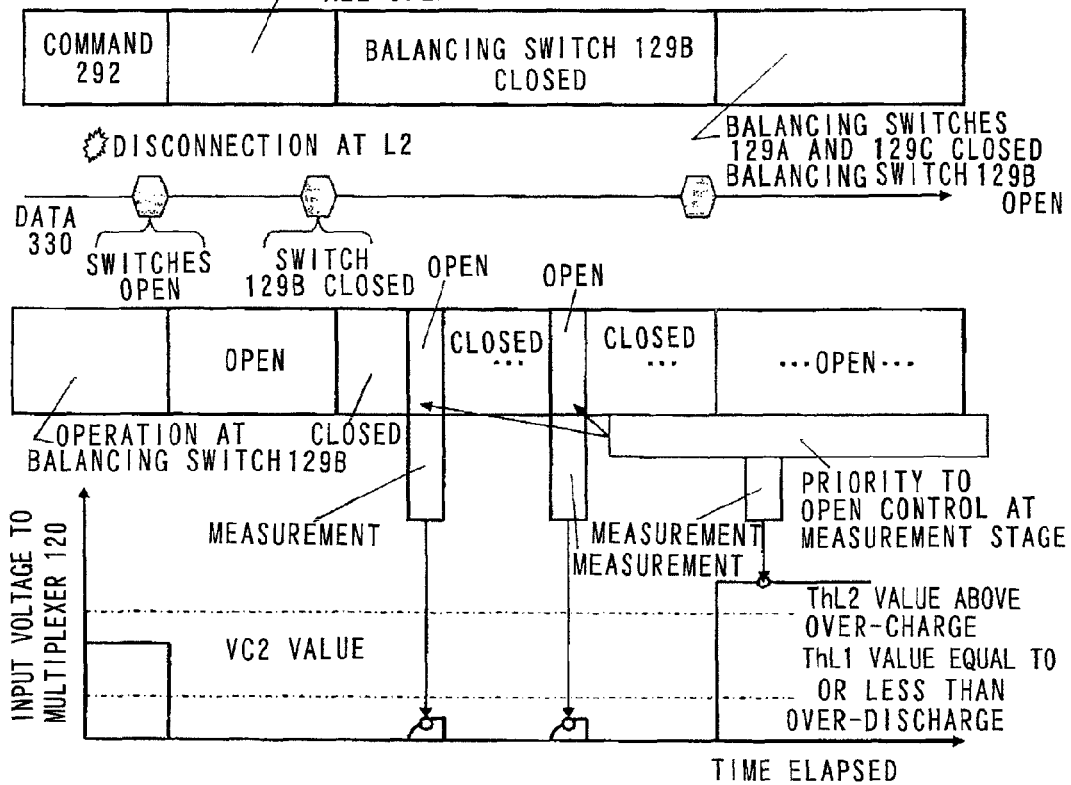
FIG. 29 shows a signal OFF period set via the discharge control circuit to control the balancing switch in priority to the control for adjustment of the state of charge.

FIG. 29 illustrates a method for executing the diagnosis in response to a communication command 292 issued from the battery controller 20. The method is described by assuming that a disconnection has occurred at the harness segment L2 in the detection harness 32. A disconnection diagnosis communication command 292 is transmitted with predetermined timing. The communication command 292 indicates a specific diagnosis target integrated circuit and also contains an instruction "open all balancing switches 129". Namely, the data 330 in the communication command 292 indicate "0", i.e., "open". In response to the instruction, the instruction target integrated circuit opens the balancing switches 129.

Next, a close instructions is transmitted to the balancing switch 129B, thereby closing the balancing switch 129B in order to discharge the battery cell connected with the diagnosis target detection harness 32 with predetermined timing. If the harness segment L2 is disconnected, the input signal VC2 provided to the multiplexer 120 will indicate a value close to 0. Subsequently, before an instruction is output from the battery controller 20, the balancing switch 129B enters the open state and the terminal voltage at the battery cell BC2 is measured during the measurement stage, in which the voltage at the battery cell BC2 is measured based upon a stage signal generated in the integrated circuit. If the harness segment L2 is disconnected, the input signal VC2 provided to the multiplexer 120 will indicate a very low voltage, which is then held at the register CELL2 in the current value storage circuit 274 shown in FIG. 5.

Since the integrated circuit independently measures the battery cell terminal voltages over short intervals, the balancing switch 129B reenters the open state quickly and the terminal voltage at the battery cell BC2 is measured. If the harness segment L2 is disconnected, the measurement results will indicate a very low value which is then held at the register CELL2 in the current value storage circuit 274.

In response to a diagnosis result intake instruction issued from the battery controller 20, the integrated circuit transmits the measurement results held at the register CELL2 in the current value storage circuit 274. The battery controller 20, having received the measurement results indicating a value lower than the over-discharge level is able to detect the disconnection. Namely, the measurement results transmitted from the integrated circuit are compared with a threshold value ThL1 in FIG. 29 and if the measurement results indicate a value lower than the threshold value ThL1, the battery controller judges that a disconnection has occurred and proceeds to execute preliminary operation before actually cutting off the connection between the DC power source constituted with lithium batteries and the inverter. As soon as the preliminary processing is completed, it opens the relays RLP and RLN.

In order to assure even more reliability, the battery controller 20 transmits an instruction for closing the balancing switches 129A and 129C and opening the balancing switch 129B. In the event of a disconnection, the input voltage VC2 provided to the input circuit 116 increases greatly if the balancing switches 129 disposed on the two sides of the diagnosis target battery cell. Thus, a voltage value greater than the over-charge threshold value will be measured. The measurement results are then held at the register CELL2 in the current value storage circuit 274.

In response to a diagnosis result intake instruction issued from the battery controller 20, the integrated circuit transmits the measurement value to the battery controller 20. The battery controller 20 receives the measurement results, compares the received measurement results with a disconnection detection threshold value ThL2, which is greater than the overcharge threshold value and if the measurement results indicate a value greater than the threshold value ThL2, the battery controller 20 judges that a disconnection has occurred. While accurate disconnection detection is enabled simply by comparing the results obtained through the measurement 1 or the measurement 2 with the threshold value ThL1 or through comparison of the average of the measurement values obtained through the measurement 1 and the measurement 2 with the threshold value ThL1, the accuracy of the disconnection detection is further enhanced by also comparing the measurement results with the threshold value ThL2. In addition, highly efficient disconnection detection is enabled by using the measurement values obtained through regular battery cell terminal voltage measurement operation. Furthermore, since the diagnosis whether or not a disconnection has occurred is executed by using the existing balancing switches 129 used to control the SOCs, without having to install additional special circuits, the simplicity of the circuit structure is maintained.

Figure 30:
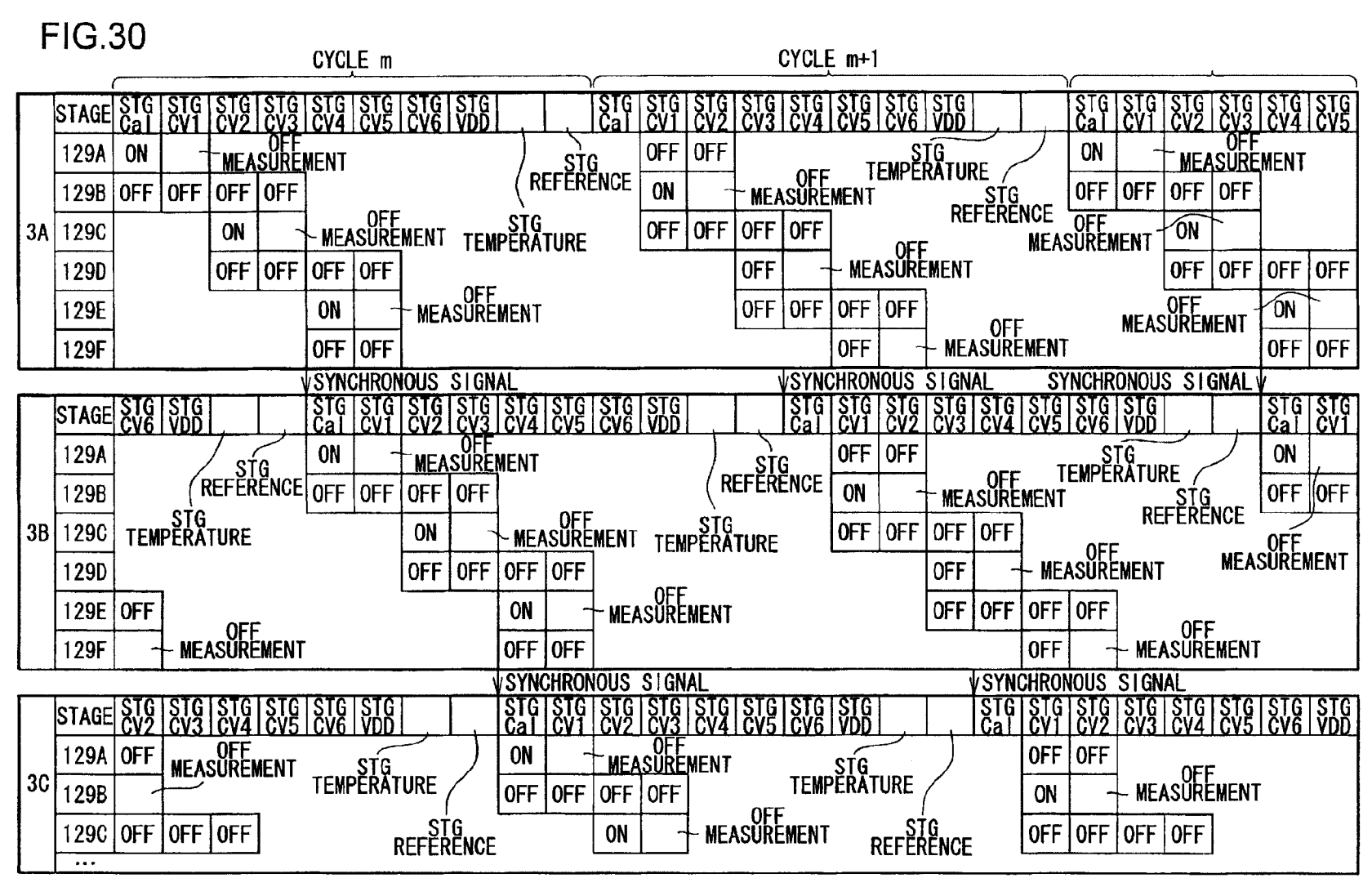
Figure 31:
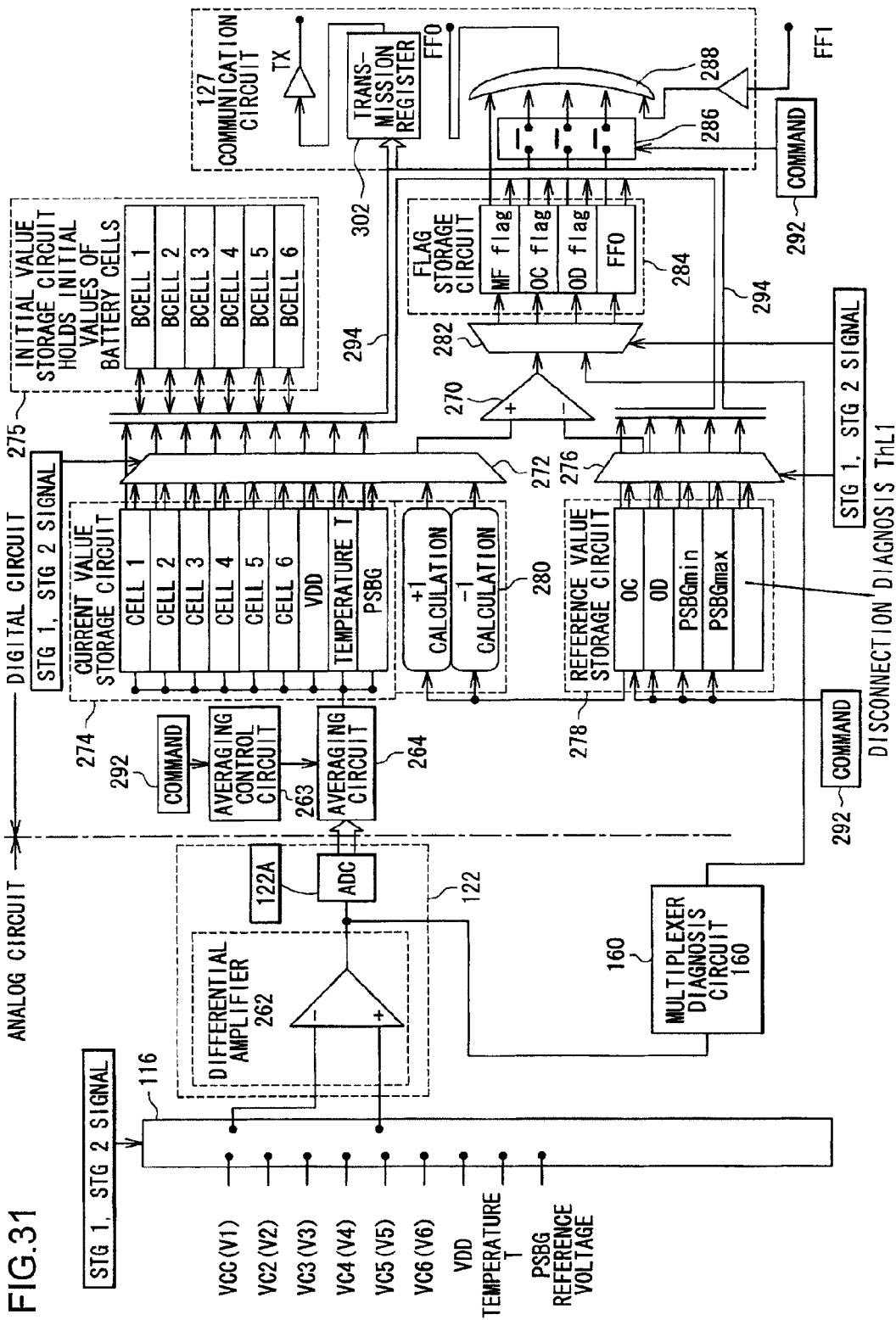
FIG. 31 is a diagram of the diagnosis target circuit and the circuit engaged in the diagnosis achieved in another embodiment.
Figure 32:
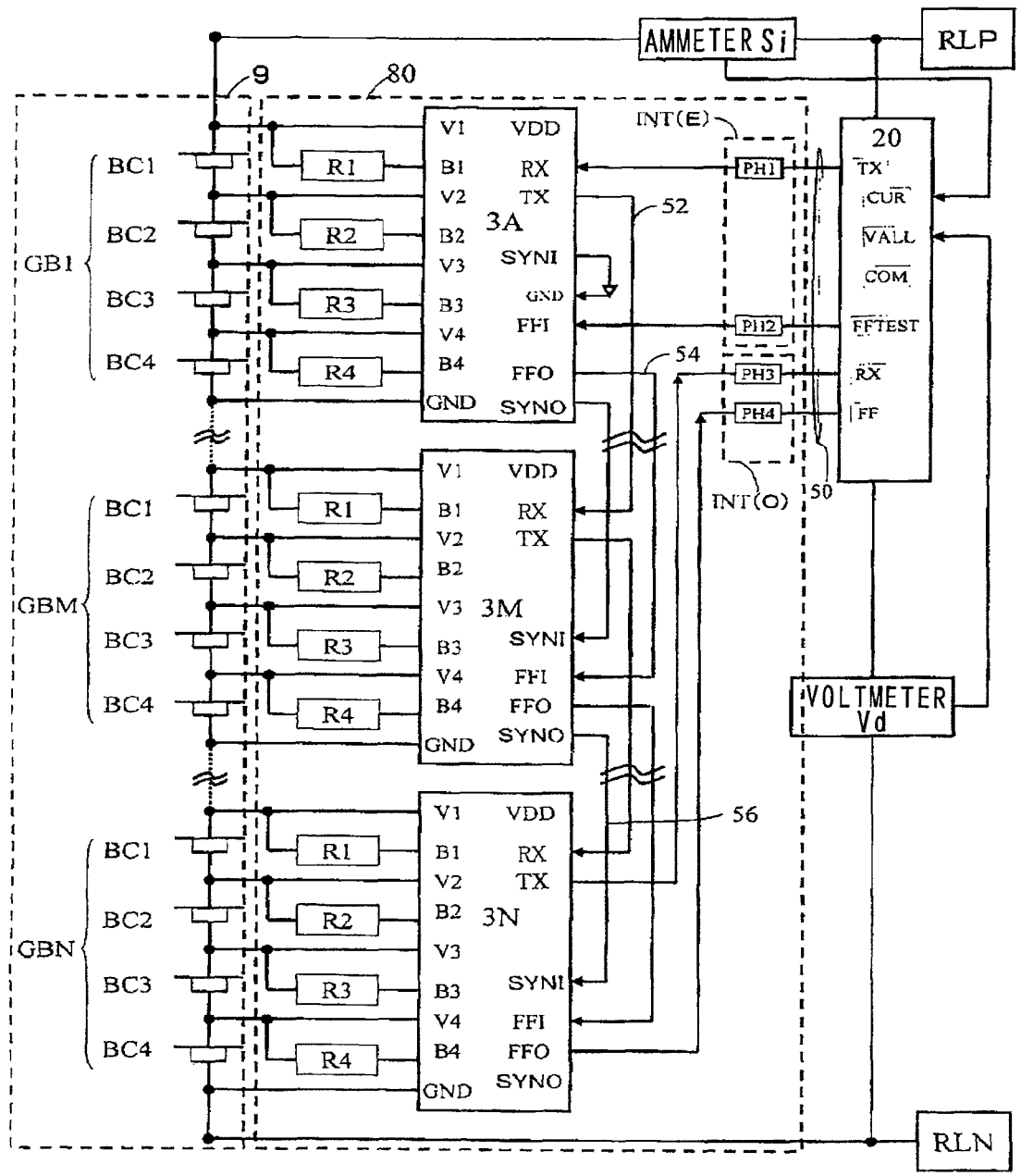
FIG. 32 is a diagram showing the structures adopted in the battery unit and the cell controller achieved in another embodiment.

Next, in reference to FIGS. 30~32, a method that may be adopted to enable each integrated circuit to automatically execute a disconnection diagnosis is described. The disconnection diagnosis can be automatically executed by measuring battery cell terminal voltage based upon the stage signal, as shown in FIG. 4. FIG. 30 indicates a specific measurement/diagnosis schedule, whereas FIG. 32 shows a specific circuit structure.

In the upper row in FIG. 30, the measurement and the disconnection diagnosis executed in the integrated circuit 3A in cycle m and cycle m+1 in response to stage signals are indicated. The measurement and the disconnection diagnosis executed in the integrated circuit 3B succeeding the integrated circuit 3A are indicated in the middle row, whereas the measurement and the disconnection diagnosis executed in the integrated circuit 3C succeeding the integrated circuit 3B are indicated in the lower row. The integrated circuits 3B and 3C individually start the stage processing shown in FIG. 4, in response to a synchronous signal provided from the integrated circuit 3A and a synchronous signal provided from the integrated circuit 3B respectively. It is to be noted that during a period marked "ON" in FIG. 30, control for sustaining the corresponding balancing switch 129 in the closed state is underway. During a period marked "OFF", control under for sustaining the balancing switch 129 in the open state is underway. "measurement" indicates a period during which control for the battery cell terminal voltage measurement and the disconnection diagnosis is underway. During any period of time that is not marked as "ON", "OFF" or "measurement", the SOC adjustment control is underway.

At the stage STGCal, the balancing switch 129A is set in the closed state in the integrated circuit 3A. If the detection harness 32 is disconnected, the voltage input to the input circuit 116 will assume a very small value, with the balancing switch 129A set in the closed state, as has been explained in reference to FIG. 28. As a result, the analog/digital converter 122A in FIG. 31 detects the terminal voltage at the battery cell BC1, measured at the stage STGCV1, indicating an excessively small value. Consequently, the measurement results held at the register CELL1 in the current value storage circuit 274 will indicate an extremely small value. It is to be noted that control is executed to sustain the balancing switch 129B, too, in the open state, in order to improve the measurement accuracy in the stage STGCV1.

In the disconnection diagnosis executed following the measurement, the digital comparator 270 compares the measurement value held at the register CELL1 in the current value storage circuit 274 with the disconnection diagnosis threshold value ThL1 held in the reference value storage circuit 278. If the measurement value held at the register CELL1 is less than the disconnection diagnosis threshold value ThL1, it is judged that an abnormality attributable to a disconnection has occurred and accordingly, the diagnosis flag in the flag storage circuit 284 is set to "1". As has already been explained in reference to FIG. 5, the diagnosis flag setting selected at this time is immediately reported to the battery controller 20. It is to be noted that the basic operation executed in the circuit shown in FIG. 31 is similar to that having been described in reference to FIG. 5 and the like.

Unless an abnormality such as a disconnection exists, the terminal voltage at the battery cell BC1 measured at the stage STGCV1 indicates a normal value and, accordingly, no abnormality is detected through the diagnosis executed via the digital comparator 270. In cycle m in FIG. 30, the terminal voltage measurement and the diagnosis are executed only for the odd-numbered battery cells. Following the terminal voltage measurement and the diagnosis for the battery cell BC1, the terminal voltage measurement and the disconnection diagnosis are executed for the battery cell BC3. At the stage STGCV2, the balancing switch 129C corresponding to the battery cell BC3 is first closed and then the balancing switch 129C is set back into the open state at the stage STGCV3 to measure the terminal voltage at the battery cell BC3. The digital comparator 270 shown in FIG. 31 executes the disconnection diagnosis as has been explained earlier. In order to improve the accuracy with which the terminal voltage at the battery cell BC3 is detected and the disconnection diagnosis for the battery cell BC3 is executed at the stage STGCV3, the balancing switches 129B and 129D disposed on the two sides of the balancing switch 129C are sustained in the open state as has been explained in reference to FIG. 30.

Likewise, the balancing switches 129D and 129F are sustained in the open state at the stage STGCV5, in order to measure the terminal voltage at the battery cell BC3 and execute the disconnection diagnosis for the battery cell BC3. The measurement and the diagnosis are executed for the odd-numbered battery cells BC1, BC3 and BC5 as described above. The measurement and the diagnosis for the even-numbered battery cells BC2, BC4 and BC6 are executed in a similar manner in the next cycle m+1. In short, in the operation executed as indicated in the schedule presented in FIG. 30, the measurement and the diagnosis for the odd-numbered battery cells and the even-numbered battery cells are executed in different stage cycles.

When executing the measurement and the diagnosis for the battery cell BC1 at the stage STGCV1 in the integrated circuit 3B, the balancing switch 129F in the preceding integrated circuit 3A must be sustained in the open state. Accordingly, a synchronous signal is transmitted from the integrated circuit 3A to the integrated circuit 3B which then generates a stage signal in synchronization with the synchronous signal from the integrated circuit 3A. In the embodiment, the integrated circuit 3B, having received the synchronous signal from the integrated circuit 3A, starts generating the first stage signal STGCal.

One of the two adjacent integrated circuits transmits a synchronous signal to the other integrated circuit over a predetermined cycle and the other integrated circuit, having received the synchronous signal, starts generating a specific stage signal. As a result, while the measurement for the battery cell in the preceding integrated circuit, i.e., the measurement for the battery cell BC6 corresponding to the integrated circuit 3A, is underway, the balancing switch 129A corresponding to the battery cell BC1 in the succeeding integrated circuit 3B is sustained in the open state. In addition, while the measurement for the battery cell BC1 in the succeeding integrated circuit 3B is underway, the balancing switch 129F corresponding to the battery cell BC6 in the preceding integrated circuit 3A is sustained in the open state.

FIG. 30 indicates that an operation similar to that described above is executed in the integrated circuits 3B and 3C and a synchronous signal is transmitted from the integrated circuit 3B to the integrated circuit 3C as the integrated circuit 3B executes the operation at a specific stage. This structure assures that accurate measurement and accurate diagnosis are executed by sustaining the balancing switches 129, corresponding to the battery cells on the two sides of the measurement target battery cell, connected in series with the measurement target battery cell, in the open state.

While the circuit shown in FIG. 32 is similar to the circuit shown in FIG. 1, it further includes a transmission path 56 through which a synchronous signal is transmitted. Otherwise, the circuit structure adopted therein and the operation executed therein are similar to those described in reference to FIG. 1. As shown in FIG. 32, asynchronous signal is transmitted from a synchronous signal output end SYNO of the integrated circuit 3A to a synchronous signal input end SYNI of the integrated circuit 3B. Likewise, a synchronous signal is transmitted from a synchronous signal output end SYNO of the integrated circuit 3M−1 to a synchronous signal input end SYNI of the integrated circuit 3M and so forth. Finally a synchronous signal is transmitted from the synchronous signal output end SYNO of the integrated circuit 3N−1 to a synchronous signal input end SYNI of the integrated circuit 3N.

While the synchronous signal is transmitted from an integrated circuit assuming a higher potential to the next integrated circuit assuming a lower potential in the circuits shown in FIGS. 30 and 32, this is simply an example and the synchronous signal may instead be transmitted from an integrated circuit with a lower potential to the next integrated circuit with a higher potential, as long as stage signals are generated in synchronization with each other within the integrated circuits disposed next to each other.

The disconnection diagnosis can be executed with ease via the balancing switches 129 as described above.

As described above, according to the present embodiments, the diagnosis for an abnormality in the integrated circuits, namely, the multiplexer 120, the differential amplifier 262, the analog/digital converter 122A, the digital comparator circuit 270, etc., and the diagnosis for a disconnection are executed. This assures better reliability in the integrated circuits in the cell controller 80, thereby improving the reliability in the battery system.

In the battery system disclosed in the patent literature 1, the state of battery cells is properly sustained based upon a result of diagnosis of over-charge/over-discharge of the battery cells. However, a lower reliability in a terminal voltage measured at over-charge/over-discharge diagnosis, i.e., an abnormality in the terminal voltage measurement system, may result in a lower reliability in the diagnosis of over-charge/over-discharge itself, causing an error in the judgment. In the battery systems achieved in the present embodiments, on the other hand, the integrated circuits execute self-diagnoses for the selection operation by the multiplexer 120, which selects the terminal voltage, thereby enabling diagnoses for the measurement operation itself. Accordingly, the diagnoses for over-charge/over-discharge are assured based upon measurement values normally obtained.

In the battery systems achieved in the present embodiments, an operation diagnosis for the multiplexer 120 or the like is executed synchronously with the measurement of the terminal voltage. Accordingly, an erroneous operation by the multiplexer 120 while measuring is ascertained, thereby improving the reliability in the battery system.

In the battery systems achieved in the present embodiments, a diagnosis result indicating an abnormality is transmitted from the integrated circuits to the battery controller 20 via the transmission path 54. This enables the optimal action for correcting the abnormality in the integrated circuits. In particular, a signal indicating abnormality/normality is constantly transmitted to the battery controller 20 via the transmission path 54, through which the abnormality signal is transmitted, provided in the battery system independently of the transmission path 52, through which a measurement value is transmitted. Thus, the battery controller 20 constantly monitors the state of the integrated circuits, thereby quickly taking the optimal action for correcting the abnormality in the integrated circuits.

The embodiments described above may be adopted by themselves or in combination. The advantages of the individual embodiments may be realized independently of one another or synergistically through combination thereof. In addition, the present invention may be embodied in any way other than those described in reference to the embodiments, as long as the features characterizing the present invention remain intact.

What is claimed is:

1. A battery system, comprising:
a battery unit that is constituted with a plurality of cell groups, which are electrically connected in series, each include a plurality of battery cells, which are electrically connected in series;
integrated circuits that are each provided in correspondence to one of the cell groups of the battery unit and each input terminal voltages at the battery cells in the corresponding cell group to measure each of the terminal voltages at the battery cells, wherein:
the integrated circuits each comprise:
a selection circuit that selects terminal voltages of a battery cell that is a measurement target from among the terminal voltages at the individual battery cells in the corresponding cell group;
a differential amplifier that amplifies a difference of the selected terminal voltages to be outputted;
an analog/digital converter that converts an output of the differential amplifier to a digital value;
a pull-up circuit that is provided for diagnosing the selection circuit and pulls up a potential at an output terminal of the selection circuit to a high potential;
a pull-down circuit that is provided for diagnosing the selection circuit and pulls down a potential at an output terminal of the selection circuit to a low potential.

2. A battery system according to claim 1, wherein:
the integrated circuits each further comprise a diagnosis circuit that diagnoses whether or not the selection circuit has an abnormality based upon an output of the selection circuit that is pulled up by the pull-up circuit and is input via the differential amplifier and the analog/digital converter or an output of the selection circuit that is pulled down by the pull-down circuit and is input via the differential amplifier and the analog/digital converter.

3. A battery system according to claim 1, wherein:
the pull-up circuit and the pull-down circuit operate in correspondence to a measurement period when the terminal voltages at the battery cells in the corresponding cell group are measured with the selection circuit, the differential amplifier and the analog/digital converter.

4. A battery system according to claim 1, wherein:
the pull-up circuit and the pull-down circuit are provided for each of two output terminals of the selection circuit.

5. A battery system according to claim 1, wherein:
the pull-up circuit and the pull-down circuit operate in correspondence to a measurement period when the terminal voltages at one of the battery cells in the corresponding cell group are measured with the selection circuit, the differential amplifier and the analog/digital converter; and
the pull-up circuit and the pull-down circuit are provided for each of two output terminals of the selection circuit.

6. A battery system according to claim 1, wherein:
the integrated circuits each further comprise a diagnosis circuit that diagnoses whether or not the selection circuit has an abnormality based upon an output of the selection circuit that is pulled up by the pull-up circuit and is input via the differential amplifier and the analog/digital converter or an output of the selection circuit that is pulled down by the pull-down circuit and is input via the differential amplifier and the analog/digital converter; and
the pull-up circuit and the pull-down circuit operate in correspondence to a measurement period when the terminal voltages at one of the battery cells in the corresponding cell group are measured with the selection circuit, the differential amplifier and the analog/digital converter.

7. A battery system according to claim 1, wherein:
the integrated circuits each further comprise a diagnosis circuit that diagnoses whether or not the selection circuit has an abnormality based upon an output of the selection circuit that is pulled up by the pull-up circuit and is input via the differential amplifier and the analog/digital converter or an output of the selection circuit that is pulled down by the pull-down circuit and is input via the differential amplifier and the analog/digital converter;
the pull-up circuit and the pull-down circuit operate in correspondence to a measurement period when the terminal voltages at one of the battery cells in the corresponding cell group are measured with the selection circuit, the differential amplifier and the analog/digital converter; and
the pull-up circuit and the pull-down circuit are provided for each of two output terminals of the selection circuit.

8. An integrated circuit that is provided in correspondence to a cell group including a plurality of battery cells which are electrically connected in series, comprising:
a selection circuit that selects terminal voltages of a battery cell that is a measurement target from among the terminal voltages at the individual battery cells in the cell group;
a differential amplifier that amplifies a difference of the selected terminal voltages to be outputted;
an analog/digital converter that converts an output of the differential amplifier to a digital value;
a pull-up circuit that is provided for diagnosing the selection circuit and pulls up a potential at an output terminal of the selection circuit to a high potential;
a pull-down circuit that is provided for diagnosing the selection circuit and pulls down a potential at an output terminal of the selection circuit to a low potential.

9. An integrated circuit according to claim 8, further comprising:
a diagnosis circuit that diagnoses whether or not the selection circuit has an abnormality based upon an output of the selection circuit that is pulled up by the pull-up circuit and is input via the differential amplifier and the analog/digital converter or an output of the selection circuit that is pulled down by the pull-down circuit and is input via the differential amplifier and the analog/digital converter.

10. An integrated circuit according to claim 8, wherein:
the pull-up circuit and the pull-down circuit operate in correspondence to a measurement period when the terminal voltages at the battery cells in the corresponding cell group are measured with the selection circuit, the differential amplifier and the analog/digital converter.

11. An integrated circuit according to claim 8, wherein:
the pull-up circuit and the pull-down circuit are provided for each of two output terminals of the selection circuit.

12. An integrated circuit according to claim 8, wherein:
the pull-up circuit and the pull-down circuit operate in correspondence to a measurement period when the terminal voltages at one of the battery cells in the corresponding cell group are measured with the selection circuit, the differential amplifier and the analog/digital converter; and
the pull-up circuit and the pull-down circuit are provided for each of two output terminals of the selection circuit.

13. An integrated circuit according to claim 8, further comprising:
a diagnosis circuit that diagnoses whether or not the selection circuit has an abnormality based upon an output of the selection circuit that is pulled up by the pull-up circuit and is input via the differential amplifier and the analog/digital converter or an output of the selection circuit that is pulled down by the pull-down circuit and is input via the differential amplifier and the analog/digital converter, wherein:
the pull-up circuit and the pull-down circuit operate in correspondence to a measurement period when the terminal voltages at one of the battery cells in the corresponding cell group are measured with the selection circuit, the differential amplifier and the analog/digital converter.

14. An integrated circuit according to claim 8, further comprising:
a diagnosis circuit that diagnoses whether or not the selection circuit has an abnormality based upon an output of the selection circuit that is pulled up by the pull-up circuit and is input via the differential amplifier and the analog/digital converter or an output of the selection circuit that is pulled down by the pull-down circuit and is input via the differential amplifier and the analog/digital converter, wherein:
the pull-up circuit and the pull-down circuit operate in correspondence to a measurement period when the terminal voltages at one of the battery cells in the corresponding cell group are measured with the selection circuit, the differential amplifier and the analog/digital converter; and
the pull-up circuit and the pull-down circuit are provided for each of two output terminals of the selection circuit.

* * * * *